US012699813B1

(12) United States Patent
Murphy et al.

(10) Patent No.: US 12,699,813 B1
(45) Date of Patent: Aug. 4, 2026

(54) SYSTEMS AND METHODS FOR DELIVERY OF INSTRUCTIONAL CONTENT SPATIALLY RELEVANT TO DESIGN PLANS

(71) Applicant: Togal.AI Inc., Miami, FL (US)

(72) Inventors: Patrick E Murphy, Miami, FL (US); Johnny Maghzal, Miami, FL (US); Thomas Patrick Murphy, Miami, FL (US)

(73) Assignee: Togal.AI Inc., Miami, FL (US)

( * ) Notice: Subject to any disclaimer, the term of this patent is extended or adjusted under 35 U.S.C. 154(b) by 0 days.

(21) Appl. No.: 19/287,942

(22) Filed: Aug. 1, 2025

Related U.S. Application Data

(60) Provisional application No. 63/799,630, filed on May 4, 2025.

(51) Int. Cl.
 *G06F 30/13* (2020.01)
(52) U.S. Cl.
 CPC ..................................... *G06F 30/13* (2020.01)
(58) Field of Classification Search
 CPC ................................ G06F 30/13; G06Q 10/00
 See application file for complete search history.

(56) References Cited

U.S. PATENT DOCUMENTS 9,342,928 B2 * 5/2016 Rasane ................. G06T 19/006

11,774,922 B2 * 10/2023 Locke ................. H04L 12/2827
 700/47
2014/0089209 A1 * 3/2014 Akcamete .............. G06Q 10/20
 705/305
2020/0060007 A1 * 2/2020 Harrison ................ G06N 20/00
 (Continued)

OTHER PUBLICATIONS

Costa A, Miranda J, Dias D, Dinis N, Romero L, Faria PM. Smart Maintenance Solutions: AR-and VR-Enhanced Digital Twin Powered by FIWARE. Sensors (Basel, Switzerland). Jan. 30, 2025;25(3):845. (Year: 2025).*

(Continued)

*Primary Examiner* — Eunhee Kim
(74) *Attorney, Agent, or Firm* — Tracnik Law, LLC; Joseph P Kincart

(57) ABSTRACT

Methods, systems, and apparatus for dynamically associating, customizing, and delivering instructional content for design elements within a building design plan are disclosed. A design plan comprising graphical depictions of physical building components is received into a controller operating an artificial intelligence (AI) engine. The controller identifies design elements, searches a database for corresponding instructional content, and, when instructional content is unavailable, initiates AI-based content generation. An interactive user interface is generated, displaying instructional content indicators associated with the design elements. Users access the instructional content through prompts such as selection, proximity detection, or service task assignment. Instructional content includes installation procedures, repair guides, maintenance workflows, AI-generated tutorials, and safety guidelines. Content is delivered via mobile devices, tablets, or head-mounted augmented reality systems, and may dynamically update based on real-time service work tracking, fault detection, or remote expert interaction to assist operational workflows.

30 Claims, 35 Drawing Sheets

(56)  References Cited

U.S. PATENT DOCUMENTS

| | | | |
|---|---|---|---|
| 2020/0103877 A1* | 4/2020 | Truong | G05B 19/41865 |
| 2022/0004672 A1* | 1/2022 | Santarone | G06T 19/006 |
| 2025/0139314 A1* | 5/2025 | Harvey | G06F 30/13 |

OTHER PUBLICATIONS

E. Valveny and E. Marti, "Hand-drawn symbol recognition in graphic documents using deformable template matching and a Bayesian framework," Proceedings 15th International Conference on Pattern Recognition. ICPR-2000, Barcelona, Spain, 2000, pp. 239-242 vol. 2, doi: 10.1109/ICPR.2000.906057. (Year: 2000).*

* cited by examiner

230

300

| AREA TYPE | PRIVATE OFFICE | GENERAL OFFICE SPACE | PUBLIC CONF. ROOM | PRIVATE CONF. ROOM | PRIVATE WATER CLOSET | PUBLIC WATER CLOSET |
|---|---|---|---|---|---|---|
| PRIVATE OFFICE | 50/50 | 50/40 | 40/50 | 50/50 | 50/50 | 40/60 |
| GENERAL OFFICE SPACE | | | | | | |
| PUBLIC CONF. ROOM | | | | | | |
| PRIVATE CONF. ROOM | | | | | | |
| PRIVATE WATER CLOSET | | | | | | |
| PUBLIC WATER CLOSET | | | | | | |

FIG. 3D

- AI Scans Real-Time Camera Feed of Components
- Detects Problems: wear, rust, loosened screws, water leakages etc.
- Based on Detection, AI triggers specific Instructional Content to resolve the Problems (e.g., Gasket Replacement Guide)

Figures 10A, 10B:
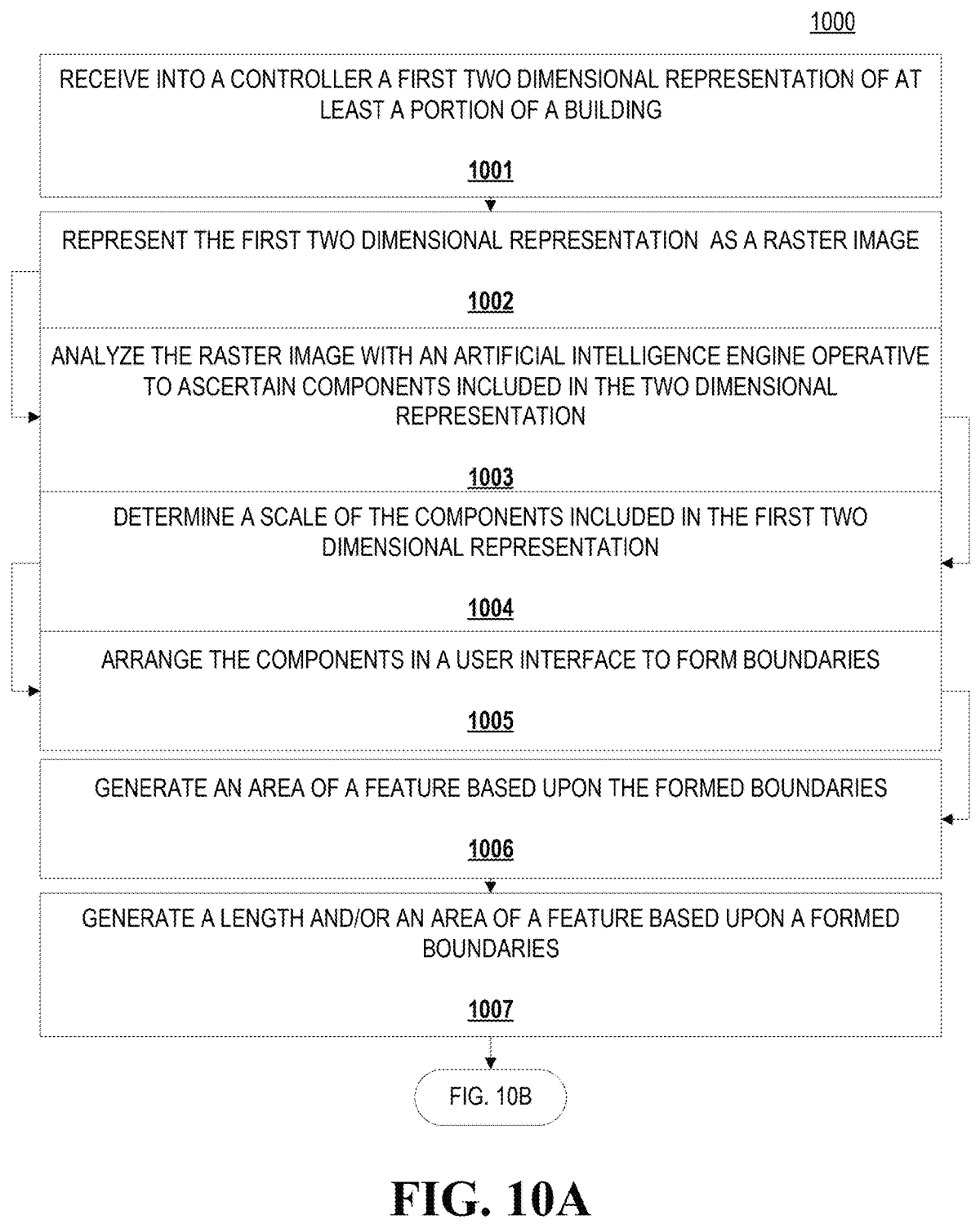

1000

RECEIVE INTO A CONTROLLER A FIRST TWO DIMENSIONAL REPRESENTATION OF AT LEAST A PORTION OF A BUILDING

1001

REPRESENT THE FIRST TWO DIMENSIONAL REPRESENTATION AS A RASTER IMAGE

1002

ANALYZE THE RASTER IMAGE WITH AN ARTIFICIAL INTELLIGENCE ENGINE OPERATIVE TO ASCERTAIN COMPONENTS INCLUDED IN THE TWO DIMENSIONAL REPRESENTATION

1003

DETERMINE A SCALE OF THE COMPONENTS INCLUDED IN THE FIRST TWO DIMENSIONAL REPRESENTATION

1004

ARRANGE THE COMPONENTS IN A USER INTERFACE TO FORM BOUNDARIES

1005

GENERATE AN AREA OF A FEATURE BASED UPON THE FORMED BOUNDARIES

1006

GENERATE A LENGTH AND/OR AN AREA OF A FEATURE BASED UPON A FORMED BOUNDARIES

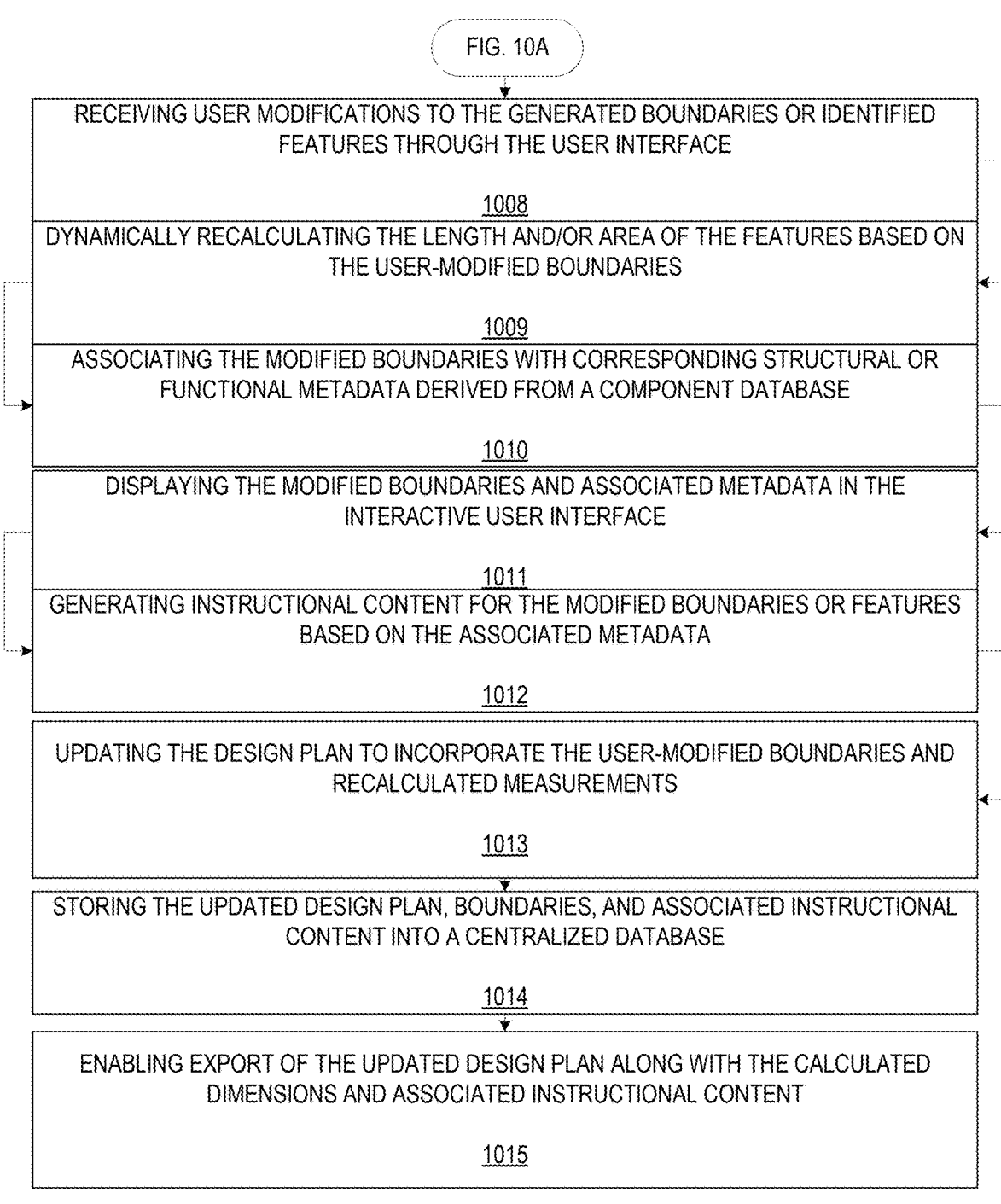

FIG. 10A

RECEIVING USER MODIFICATIONS TO THE GENERATED BOUNDARIES OR IDENTIFIED FEATURES THROUGH THE USER INTERFACE

1008

DYNAMICALLY RECALCULATING THE LENGTH AND/OR AREA OF THE FEATURES BASED ON THE USER-MODIFIED BOUNDARIES

1009

ASSOCIATING THE MODIFIED BOUNDARIES WITH CORRESPONDING STRUCTURAL OR FUNCTIONAL METADATA DERIVED FROM A COMPONENT DATABASE

1010

DISPLAYING THE MODIFIED BOUNDARIES AND ASSOCIATED METADATA IN THE INTERACTIVE USER INTERFACE

1011

GENERATING INSTRUCTIONAL CONTENT FOR THE MODIFIED BOUNDARIES OR FEATURES BASED ON THE ASSOCIATED METADATA

1012

UPDATING THE DESIGN PLAN TO INCORPORATE THE USER-MODIFIED BOUNDARIES AND RECALCULATED MEASUREMENTS

1013

STORING THE UPDATED DESIGN PLAN, BOUNDARIES, AND ASSOCIATED INSTRUCTIONAL CONTENT INTO A CENTRALIZED DATABASE

1014

ENABLING EXPORT OF THE UPDATED DESIGN PLAN ALONG WITH THE CALCULATED DIMENSIONS AND ASSOCIATED INSTRUCTIONAL CONTENT

Figures 15A, 15B:
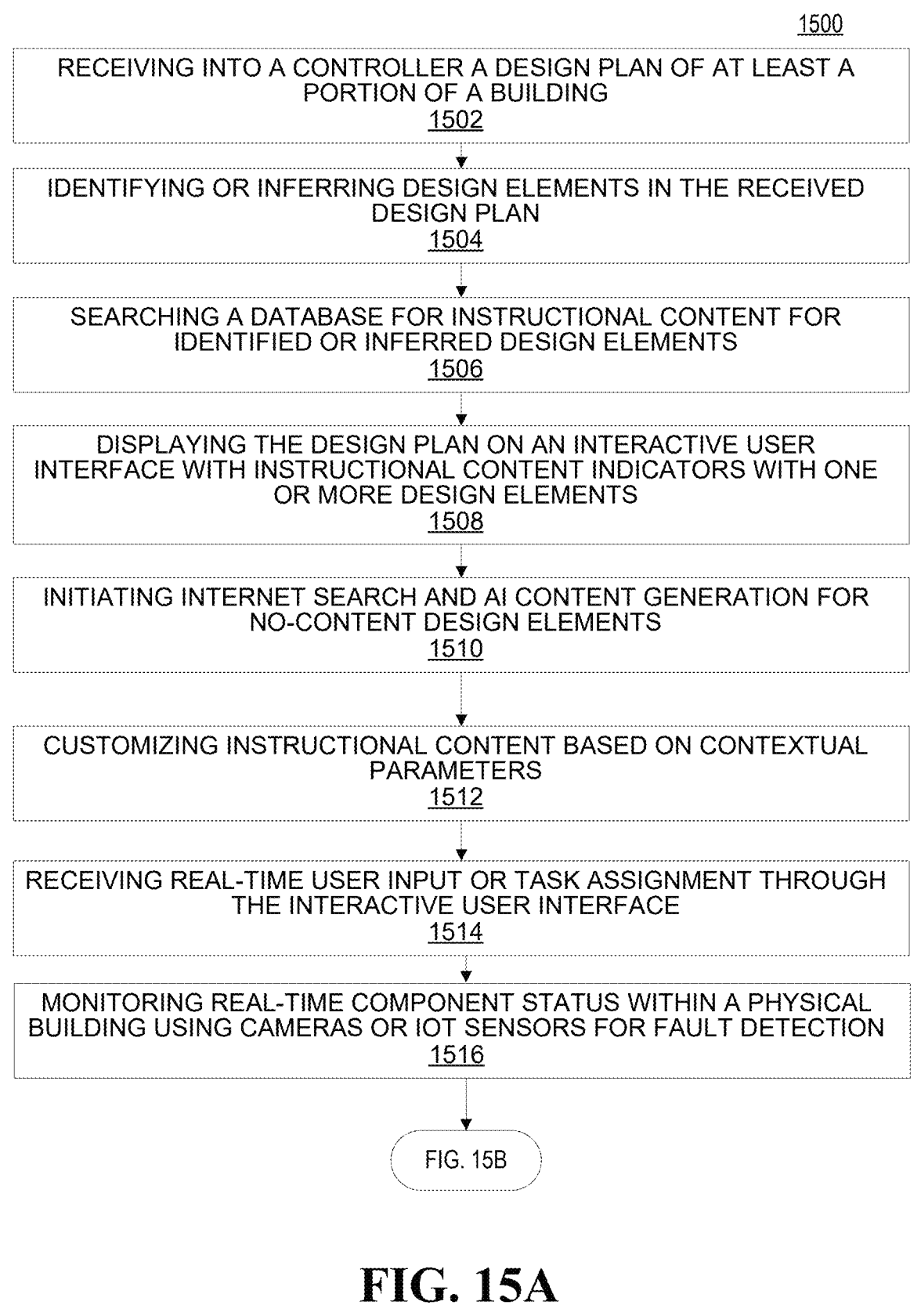

RECEIVING INTO A CONTROLLER A DESIGN PLAN OF AT LEAST A
PORTION OF A BUILDING
1502

IDENTIFYING OR INFERRING DESIGN ELEMENTS IN THE RECEIVED
DESIGN PLAN
1504

SEARCHING A DATABASE FOR INSTRUCTIONAL CONTENT FOR
IDENTIFIED OR INFERRED DESIGN ELEMENTS
1506

DISPLAYING THE DESIGN PLAN ON AN INTERACTIVE USER
INTERFACE WITH INSTRUCTIONAL CONTENT INDICATORS WITH ONE
OR MORE DESIGN ELEMENTS
1508

INITIATING INTERNET SEARCH AND AI CONTENT GENERATION FOR
NO-CONTENT DESIGN ELEMENTS
1510

CUSTOMIZING INSTRUCTIONAL CONTENT BASED ON CONTEXTUAL
PARAMETERS
1512

RECEIVING REAL-TIME USER INPUT OR TASK ASSIGNMENT THROUGH
THE INTERACTIVE USER INTERFACE
1514

MONITORING REAL-TIME COMPONENT STATUS WITHIN A PHYSICAL
BUILDING USING CAMERAS OR IOT SENSORS FOR FAULT DETECTION
1516

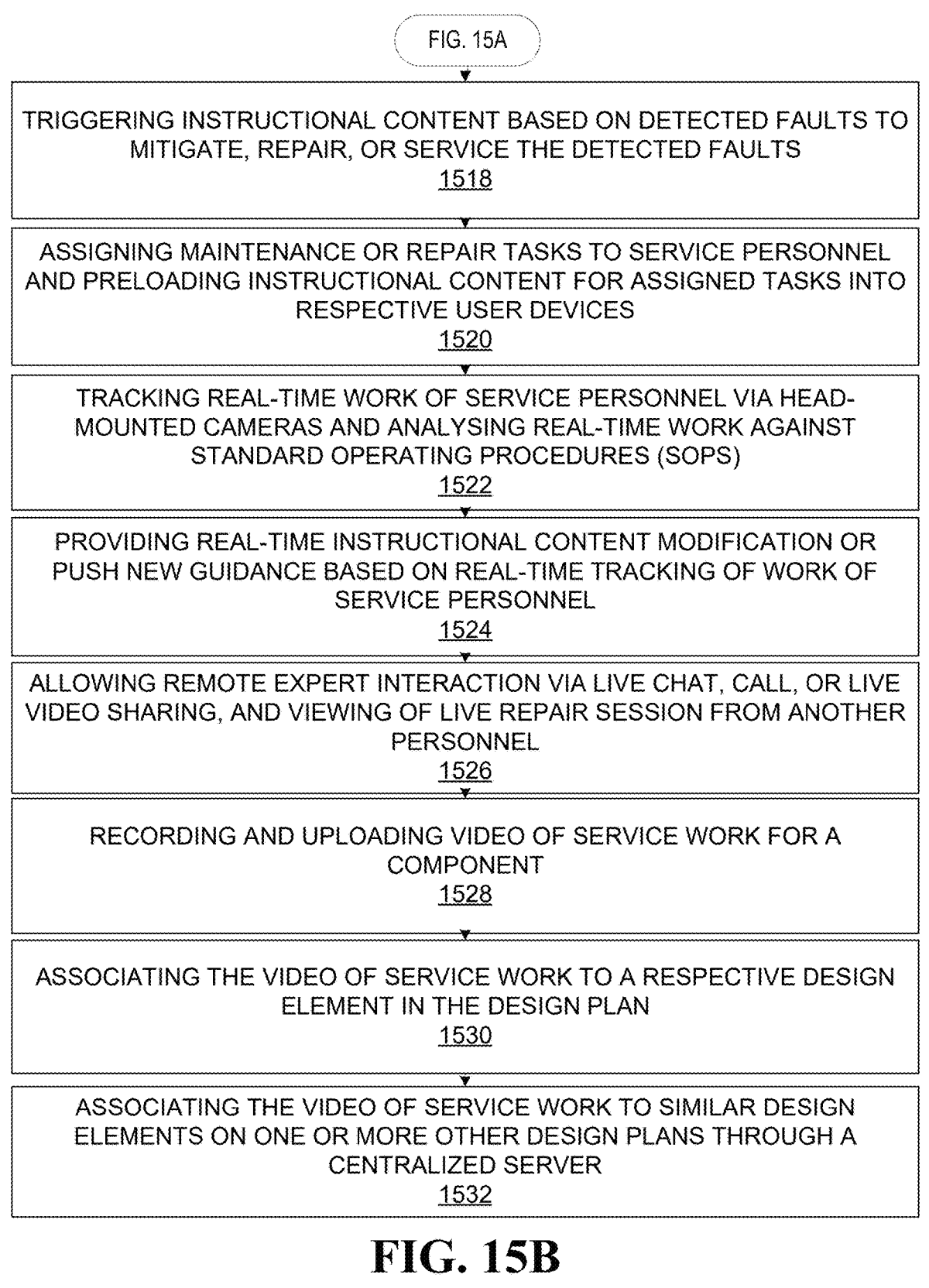

TRIGGERING INSTRUCTIONAL CONTENT BASED ON DETECTED FAULTS TO MITIGATE, REPAIR, OR SERVICE THE DETECTED FAULTS
1518

ASSIGNING MAINTENANCE OR REPAIR TASKS TO SERVICE PERSONNEL AND PRELOADING INSTRUCTIONAL CONTENT FOR ASSIGNED TASKS INTO RESPECTIVE USER DEVICES
1520

TRACKING REAL-TIME WORK OF SERVICE PERSONNEL VIA HEAD-MOUNTED CAMERAS AND ANALYSING REAL-TIME WORK AGAINST STANDARD OPERATING PROCEDURES (SOPS)
1522

PROVIDING REAL-TIME INSTRUCTIONAL CONTENT MODIFICATION OR PUSH NEW GUIDANCE BASED ON REAL-TIME TRACKING OF WORK OF SERVICE PERSONNEL
1524

ALLOWING REMOTE EXPERT INTERACTION VIA LIVE CHAT, CALL, OR LIVE VIDEO SHARING, AND VIEWING OF LIVE REPAIR SESSION FROM ANOTHER PERSONNEL
1526

RECORDING AND UPLOADING VIDEO OF SERVICE WORK FOR A COMPONENT
1528

ASSOCIATING THE VIDEO OF SERVICE WORK TO A RESPECTIVE DESIGN ELEMENT IN THE DESIGN PLAN
1530

ASSOCIATING THE VIDEO OF SERVICE WORK TO SIMILAR DESIGN ELEMENTS ON ONE OR MORE OTHER DESIGN PLANS THROUGH A CENTRALIZED SERVER
1532

FIG. 15B

SYSTEMS AND METHODS FOR DELIVERY OF INSTRUCTIONAL CONTENT SPATIALLY RELEVANT TO DESIGN PLANS

CROSS REFERENCE TO RELATED APPLICATIONS

This application claims the benefit of U.S. Provisional Patent Application Ser. No. 63/799,630, filed May 4, 2025, and entitled SYSTEMS AND METHODS FOR DELIVERY OF INSTRUCTIONAL CONTENT SPATIALLY REL-EVANT TO DESIGN PLANS, the entire contents of which are incorporated herein by reference.

FIELD OF THE INVENTION

The present invention relates generally to systems, meth-ods, and apparatuses for facilitating maintenance, repair, installation, and servicing of building components. More specifically, the present invention pertains to dynamically associating, customizing, and delivering instructional con-tent, such as repair guides, maintenance workflows, instal-lation procedures, and safety information, to design ele-ments represented within a digital design plan of a building through the use of artificial intelligence engines, interactive user interfaces, and user devices including mobile devices and augmented reality systems.

BACKGROUND OF THE INVENTION

Design plans play an integral role in the construction industry, serving as the foundation for planning, coordina-tion, and execution of a building project. These plans provide architects, engineers, and construction professionals with a detailed blueprint outlining the structure, electrical systems, plumbing, mechanical components, and various other elements required to complete a building. By offering a structured representation of the intended design, these plans enable different stakeholders to align their work, facilitating the construction process to proceed efficiently while adhering to safety regulations and industry standards. Throughout the construction phase, design plans guide con-tractors and subcontractors in executing their respective tasks in an orderly and accurate manner, reducing the likelihood of errors or inconsistencies in installation.

Once construction is completed, an up-to-date design plan, often referred to as an as-built plan, is handed over to the client or building owner. The as-built plan incorporates any modifications made during construction, so that the final design accurately reflects the actual layout and installed components. This documentation becomes invaluable for future building management, as it provides a reference for locating essential systems, identifying areas for potential upgrades, and planning renovations. Facility managers, maintenance personnel, and building owners rely on as-built plans to have a comprehensive understanding of the struc-ture and its integrated systems, allowing for more efficient building operation and maintenance.

During construction, design plans serve as an important tool for guiding contractors and technicians in installing various components of the building. However, even with access to these plans, contractors may encounter challenges in installing specific components, particularly when dealing with new or unfamiliar systems. Modern buildings incorpo-rate advanced electrical systems, energy-efficient HVAC units, and complex plumbing configurations, each requiring specialized knowledge for proper installation. In cases where a contractor is unfamiliar with a specific component, installation errors may arise, leading to inefficiencies, rework, or potential safety hazards. For example, a contrac-tor installing a high-efficiency HVAC unit with integrated smart controls may struggle to properly configure the system without adequate reference materials, delaying project time-lines and increasing costs.

Similar challenges arise during the repair and mainte-nance phase of a building's lifecycle. Over time, compo-nents within a building require servicing, replacement, or upgrades to maintain operational efficiency. When a main-tenance technician is dispatched to address an issue, they typically rely on the building's design plan to locate the affected component. However, even with access to the correct location, the technician may face difficulties in understanding how to properly repair or replace the com-ponent, particularly if they lack prior experience with that specific model or system. For example, if an electrician is tasked with replacing a faulty breaker panel in an older building, they may not be familiar with the wiring configu-rations used during the original installation, increasing the risk of errors or prolonged service times.

The increasing complexity of modern buildings has fur-ther exacerbated these challenges. Contemporary building systems integrate advanced technologies such as IoT-en-abled sensors, automated climate control, and energy-effi-cient appliances, each requiring specialized knowledge for installation and maintenance. As buildings become more sophisticated, the skillset required to service them has expanded beyond traditional trade knowledge. This shift has created a growing divide between the advancements in building technology and the expertise available among con-tractors, maintenance personnel, and service technicians.

Compounding these challenges is an ongoing labor short-age in the U.S. construction and maintenance industries. Reports indicate that many skilled workers are approaching retirement age, while fewer individuals are entering the workforce with the necessary training to handle modern building systems. This shortage of experienced personnel has placed additional strain on contractors and maintenance teams, increasing reliance on undertrained workers who may lack the technical expertise required for complex installa-tions and repairs. As a result, building owners and facility managers often face delays, inefficiencies, and increased costs associated with incorrect installations or incomplete maintenance.

Currently, when a contractor or technician encounters difficulties in installing, repairing, or maintaining a building component, they often resort to searching for additional guidance. In many cases, they rely on printed manuals provided by the manufacturer, which may not always be readily available on-site. Manufacturer-provided documen-tation, while useful, is often dense with technical informa-tion, making it difficult to quickly locate relevant instruc-tions. Additionally, printed manuals may become outdated (and misplaced), particularly in cases where a product line has undergone design changes or improvements, rendering older documentation obsolete.

Another common approach involves searching for infor-mation online through manufacturer websites, professional forums, or video platforms. While online resources can provide valuable insights, they are not always reliable or standardized. Instructional videos uploaded by third-party users may lack accuracy or fail to align with industry best practices, leading to inconsistencies in repair methods. Addi-tionally, accessing online resources in the field may not always be feasible, particularly in areas with limited internet connectivity, such as underground facilities, industrial sites, or remote locations.

Some technicians rely on manufacturer customer support services for assistance. This approach, while useful in certain situations, is often time-consuming, as technicians may need to wait for responses or navigate through automated systems before reaching a qualified representative. Furthermore, manufacturer support is typically limited to specific product lines and may not provide comprehensive trouble-shooting guidance for complex, multi-system integrations.

For those working within established maintenance teams, on-the-job training and mentorship from more experienced colleagues serve as a primary method for gaining practical knowledge. However, this approach is limited by the availability of skilled mentors and does not provide a scalable solution for addressing the growing need for specialized expertise. In cases where a technician is working independently or lacks access to direct mentorship, their ability to perform repairs effectively may be hindered, leading to prolonged service times or incorrect repairs.

The limitations of existing methods for obtaining installation and maintenance guidance present significant challenges across the construction and building management industries. Inefficiencies in accessing accurate information can lead to improper installations, unnecessary rework, increased costs, and system failures. Additionally, the reliance on informal learning methods and inconsistent online resources creates variability in service quality, making it difficult to ensure that repairs and maintenance are performed according to industry standards.

SUMMARY OF THE DISCLOSURE

Accordingly, the present invention provides a system, apparatus, and method for automatically associating instructional content with components identified in a design plan of a building, to assist in installation, maintenance, repair, and operation of such components. The system is configured to receive a design plan corresponding to at least a portion of a building, wherein the design plan includes visual, spatial, or schematic representations of a plurality of building components, systems, or fixtures. Upon receiving the design plan, a controller operating one or more artificial intelligence (AI) engines is configured to identify a set of one or more components within the design plan. The identification may be based on visual symbols, schematic notations, embedded metadata, labels, or other contextual attributes available in the design plan.

Following identification, the controller is configured to retrieve, associate, and display one or more instructional materials that are relevant to the identified components. Such instructional materials may include, but are not limited to, textual manuals, image-based installation diagrams, step-by-step procedural guides, audio instructions, and instructional videos that demonstrate repair, replacement, servicing, or configuration procedures. In some embodiments, the controller is configured to retrieve the instructional materials from a centralized repository, which may be stored locally or on a network-accessible cloud database.

In certain embodiments, the repository may be dynamically updated and collaborative in nature, wherein additional instructional materials may be added by verified service professionals, technicians, or contractors based on field experience. When new materials are uploaded or recorded, the repository may propagate associations across all relevant design plans that contain the same or similar components, thereby enabling shared access to newly contributed materials. In such embodiments, tagging, versioning, or authentication protocols may be used to ensure that the content is reliably indexed and remains accurate with respect to component specifications and service requirements.

The system may further be configured to determine, via the AI engine, whether a suitable instructional manual or video is available in the repository for each identified component. If no such material is available, the system may flag the missing content and either issue a prompt for user-generated upload or automatically search public resources, such as manufacturer databases or internet-based video platforms, to locate and associate comparable instructional content. In some examples, multiple instructional materials may be associated with a single component, and the AI engine may rank or recommend content based on relevance, user feedback, popularity, component type, or context of use.

In additional embodiments, the controller may generate a user interface that visually integrates the instructional content with the design plan. The interface may allow a user, such as a technician or contractor, to select or click on a component displayed within the design plan and instantly access one or more associated instructional guides or videos. The user interface may also include features for viewing, filtering, bookmarking, or annotating the instructional materials to facilitate case of use during field service activities.

In some configurations, the system may enable real-time updates to the repository and component associations during construction or renovation phases, such that as components are added, changed, or replaced, the corresponding instructional content remains current. Integration with as-built models or digital twins may also be supported to maintain alignment between the actual state of the building and the instructional content.

In further embodiments, the controller may integrate with QR codes, NFC tags, or other machine-readable identifiers physically affixed to components in the building. When scanned, such identifiers may directly access the instructional materials previously associated with that component through the design plan system, thereby enabling instant access in the physical environment without requiring manual lookup.

The system may optionally support integration with augmented reality (AR) devices or wearable displays, wherein the instructional material is overlaid in real-time onto the physical location of the component, enhancing field operability and visual guidance. Audio prompts, hands-free navigation, and step-by-step overlay instructions may be utilized for more complex repair scenarios.

Additionally, the controller may be configured to monitor component usage, maintenance history, or sensor data (if available), and proactively recommend relevant instructional content when a service need is predicted. The system may analyze component lifecycle data, usage trends, or error reports to suggest repair guides or maintenance procedures before a failure occurs, thereby supporting predictive servicing.

In some embodiments, the present invention relates to systems, methods, and apparatuses for associating, customizing, and delivering instructional content linked to design elements within a design plan of a building, and dynamically assisting service personnel in maintenance, repair, and installation tasks through real-time monitoring, AI-generated content customization, remote expert interactions, and digital twin integration.

In some embodiments, a controller receives a design plan of at least a portion of a building, the design plan comprising a two-dimensional (2D) design plan, a three-dimensional (3D) design plan, or a hybrid of 2D and 3D elements. The controller identifies or infers design elements present within the received design plan, including but not limited to spaces such as kitchens, bathrooms, and mechanical rooms, fixtures such as sinks, toilets, and bathtubs, appliances such as HVAC units, and structural components such as walls, beams, and control panels. The controller may identify design elements based on markings on the design plan or by referencing a database comprising known design element symbols and characteristics.

Upon identifying the design elements, the controller searches a local or cloud-based database for instructional content associated with each design element. Instructional content may comprise installation videos, product manuals, website links, specification sheets, safety guides, tools and fixtures lists, and operational guidelines. If no instructional content is found for a particular design element, the controller may initiate an internet search and use AI-based content generation models to generate suitable instructional content. For example, the controller may generate a "how to build a kitchen" guide for a new design element representing an incomplete kitchen layout.

The instructional content is then associated with corresponding design elements on the design plan. The design plan is displayed on an interactive user interface wherein design elements are tagged with instructional content indicators. A user interacting with the design plan through the user interface may access instructional content linked to design elements by clicking or tapping on the respective indicators or elements.

In some embodiments, the instructional content is dynamically customized based on contextual parameters including building type, user role, time of access, and language/location preferences. For example, instructional content for repairing an HVAC unit in a hospital setting is different from that in a residential setting due to hygiene and operational considerations. Similarly, content displayed to an apprentice may be simplified compared to the content displayed to an experienced technician. Emergency repairs accessed at nighttime may offer quick fixes, while scheduled maintenance content may offer detailed standard operating procedures.

The invention further provides mechanisms for real-time user input and task assignment through the interactive user interface. For example, a building manager may assign a task to service personnel by selecting a design element on the plan and annotating it with task instructions. Upon assignment, the controller automatically preloads the instructional content relevant to the assigned task into the user device of the service personnel.

In some embodiments, real-time monitoring of component status within the physical building is performed using cameras and IoT sensors integrated with the building management system. For example, a camera may detect water leakage in a pipeline or overheating in an HVAC unit. Based on detected faults, the controller triggers delivery of targeted instructional content to mitigate, repair, or service the fault. For example, detection of a water leak may trigger association of a gasket replacement guide or sealing instruction video to the affected pipeline design element.

The invention also supports tracking of real-time work of service personnel using head-mounted cameras, wearable devices, or mobile user devices. The controller analyzes the captured real-time feed against predefined standard operating procedures (SOPs) to determine whether the service steps are being properly followed or if the service personnel are facing difficulties. Based on the analysis, the controller dynamically modifies the instructional content or pushes real-time guidance to the service personnel. For example, if the service personnel are incorrectly reinstalling a filter in an HVAC unit, the system may immediately push an illustrated correction guide or a troubleshooting video to the user device.

The invention further provides remote expert interaction capabilities. Service personnel may initiate live chat, voice call, or a live video session with an expert in case assistance is needed during task execution. Additionally, service personnel may view live repair sessions being performed by other personnel on similar components if permitted, facilitating real-time peer learning.

Recorded service sessions are uploaded to a centralized database and associated with corresponding design elements in the design plan. The invention allows historical recordings to be accessible through design plan interfaces, aiding future service activities. Furthermore, the recorded instructional content may be associated across similar design elements in different buildings through a centralized server, enabling broad propagation of service knowledge across a building portfolio.

In some embodiments, QR codes or other scannable markers may be generated based on user input and linked to instructional content. A technician may scan the QR code positioned near a component in the field to immediately access contextually relevant instructional content, facilitating seamless access even in environments where interactive digital plans are unavailable.

The invention also supports AI-assisted assessment of work performance. As the service personnel work, the AI engine continuously monitors whether the standard repair or installation steps are being followed. If deviation is detected, the system either alerts the personnel, suggests corrections, or pushes new instructional materials. For example, if during an air conditioning repair, the service personnel skip a step critical to safety, such as verifying power shutdown, the system can immediately notify and guide the service personnel to address the missed step.

Additionally, the system records not just the presence of faults but the manner in which repairs were performed. This historical data may be used to refine future AI training models, improve standard operating procedures, predict maintenance needs, or enhance training programs for future service personnel.

The invention offers an integrated platform where real-world component conditions, detected through BMS or IoT sensors, dynamically update the digital design plan, instructional content is contextually adapted, real-time service guidance is provided, historical service data is archived and linked to design elements, and expert collaboration is made available during critical repair operations.

In some embodiments, automated systems described by the present invention may maintain a dynamic user interface similar to an up-to-date digital twin of a portion of a building. The dynamic user interface may reflect thought processes, alterations in a physical environment, or suggestions for improvements, back to the dynamic user interface based upon the static design plan. Such synchronization may facilitate (by way of non-limiting example) more accurate material lists, cost assessments, workforce allocation, and adherence to best practices, thereby optimizing the collaborative process in planning, executing, and managing architectural projects.

In general, the present invention provides for apparatus and methods related to receiving as input static representations (either physical or electronic, and either two-dimensional or three-dimensional) and generating one or more pixel patterns based upon automated processing of the static representations. The pixel patterns are analyzed using computerized processing techniques to mimic the perception, learning, problem-solving, and decision-making formerly performed by human workers (sometimes referred to herein as artificial intelligence or "AI"). The AI analysis process is repeated for multiple static representations over time, each static representation including a change to the design of a building. The AI processes denote, and track changes made in the sequence of static representations of design documents.

Based upon AI analysis of pixel patterns derived from the two-dimensional references and knowledge accumulated from increasing volumes of analyzed two-dimensional references, interactive user interfaces may be generated that allow for a user to modify dynamic static representations of features gleaned from the two-dimensional reference. The interactive user interfaces may enable users to select specific portions or segments on the design plans, wherein the AI engine employs AI processing to determine the elements or components present within the chosen segment by analyzing the pixel patterns of the two-dimensional references. AI processing of the pixel patterns, based upon the two-dimensional references, may include mathematical analysis of polygons formed by joining select vectors included in the two-dimensional reference. The analysis of pixel patterns and manipulatable vector interfaces and/or polygon-based interfaces is advantageous over human processing in that AI analysis of pixel patterns, vectors and polygons is capable of leveraging knowledge gained from previous work, whether or not a human was involved, hence the importance of integrating our AI with existing databases.

In still another aspect, in some embodiments, enhanced interactive user interfaces may include one or more of: user definable and/or editable lines; user definable and/or editable vectors; and user-definable and/or editable polygons. The interactive user interface may also be referenced to generate diagrams based on the lines, vectors and polygons defined in the interactive user interface. Still further, various embodiments include values for variables that are definable via the interactive user interface with AI processing and human input.

According to the present invention, analysis of pixel patterns and enhanced vector diagrams and/or polygon-based diagrams may include one or more of: neural network analysis, opposing (or adversarial) neural networks analysis, machine learning, deep learning, artificial intelligence techniques (including strong AI and weak AI), forward propagation, reverse propagation and other method steps that mimic capabilities normally associated with the human mind, including learning from examples and experience, recognizing patterns and/or objects, understanding and responding to patterns in positions relative to other patterns, making decisions, solving problems. The analysis also combines these and other capabilities to perform functions the skilled labor force traditionally performed.

In some specific examples, the present invention uses machine learning and/or artificial intelligence to identify architectural aspects and materials, such as walls, stairwells, floors, ceilings, doors, windows, and HVAC components, within the selected portion of the design plan. The present invention identifies such architectural aspects and other building features and provides dynamic association between design plan elements such as objects, polygons, or lines and their corresponding annotations and instructional content. Such embodiments facilitate that when a user moves a design plan element within the digital workspace as part of design plan modification, any associated annotations or instructional content are automatically moved in tandem with the element. This feature is powered by the underlying artificial intelligence (AI) engine, which intelligently recognizes the linkage between the spatial characteristics of design elements and their annotated descriptions or content markers.

Further, the system is equipped to generate automated instructional content in response to changes within the design plan, specific design plan elements, or changes in physical counterparts within the building, thereby offering a proactive approach to documenting and communicating these modifications. This functionality may particularly be valuable for tracking alterations over the course of a project's development, so that all stakeholders are promptly informed of updates. Additionally, in instances where changes occur to design elements that previously lacked annotations and instructional content, the system leverages its AI engine to intelligently create appropriate annotations and instructional content for these newly modified elements. These automated annotations and instructional content are generated based on a sophisticated analysis conducted by the AI engine, which considers the nature of the change, the context within the overall design plan, and historical data on similar modifications. This capability facilitates that every change, regardless of its prior annotation and instructional content status, is accurately documented and communicated, enhancing the collaborative and iterative nature of the design process.

In some preferred embodiments, the AI Engine is seamlessly integrated with databases housing a repository of past similar projects. These databases serve as invaluable resources, facilitating the AI engine's learning process by drawing insights from diverse user decisions made in comparable prior works. This integration empowers the AI Engine with a wealth of accumulated knowledge, enhancing its ability to offer informed and contextually relevant recommendations.

Furthermore, according to some embodiments of the present invention, the system can be integrated with advertisement platforms that deliver advertisements to users on the interactive user interfaces. The advertisement may comprise but is not limited to: components from particular brands that align with both the required quality standards and the user's budget, alternative components from diverse brands, comprehensive lists of materials complete with pricing and purchase options, and even contact information or details of contractors and architects available for hire, specializing in the realization of the actual building based on the design plan.

A two-dimensional reference, such as a design floorplan is input into an AI engine and the AI engine converts aspects of the floorplan into components that may be processed by the AI engine, such as, for example, a rasterized version of the floorplan. The floorplan is then processed with machine learning to specify portions that may be specified as discernable components. Discernable components may include, for example, rooms, residential units, hallways, stairs, dead ends, windows, or other discrete aspects of a building.

A scaling process is applied to the floorplan and size descriptors are assigned to the discernable components. In addition, distances, such as, for example, a distance to an exit from the furthest point in a residential unit are calculated.

In specific embodiments of the invention, the method involves several key processes: receiving static representations of a design plan as input into a controller housing the AI engine; generating pixel patterns through automated processing of these representations; analyzing multiple static representations over time using the AI engine; representing the design plan (or a portion of it) as a raster image; utilizing the AI engine on the controller to analyze the raster image, identifying components depicted in the design plan; determining the scale of these components; constructing a user interface featuring various components, arranging them to establish boundaries; generating features' areas or lengths based on these boundaries; enabling user selection of a segment within the design plan via the user interface; leveraging the AI engine to identify the component(s) within the chosen segment, employing AI analysis of the segment's polygons; and finally, displaying maintenance requirements related to the identified component(s) on the user interface. Furthermore, alternative embodiments may comprise computer systems, apparatus, and computer programs stored on one or more computer storage devices. Each configuration is tailored to execute the aforementioned methods and functionalities.

In specific embodiments of the invention, the process of selecting a segment may involve one or both of the following actions: marking around or on the desired segment or design element directly within the user interface or utilizing a polygon shape tool accessible on the interface, enabling users to drag and position the shape onto the desired segment. Moreover, the selection of a segment can be initiated either manually by a user or automatically by the AI engine. Additionally, when employing the polygon shape tool, users may choose from a range of polygon shapes provided by the AI engine within the user interface for selection and placement.

In specific embodiments of the invention, the AI engine analyzes the selected segment or design element based on pixel-level analysis of the selected segment or design element area within the design plan covered by the user-provided marking or the selected polygon shape. The pixel-level analysis may comprise considering the pixels of the static representation for analysis if the pixels are at and/or around a tolerable distance from the marking or boundaries of the polygon shape. The pixel-level analysis may comprise analyzing the polygon pixel patterns of the segment covered by the selected polygon shape. The pixel-level analysis may further comprise considering the pixels of the static representation for analysis if the pixels are at a predefined distance from each other creating a particular spatial relationship. The spatial relationship may be defined by a user or automatically learned by the AI engine.

In specific embodiments of the invention, the method encompasses receiving a static representation of at least a portion of a building into a controller and analyzing this representation with an AI engine to identify various components within it, which are then represented as a pattern of pixels in a raster image. This is followed by generating an interactive user interface that includes multiple vertices, utilizing dynamic lines and polygons to depict these identified components as dynamic, interactive elements. The process advances to selecting a design element within this interface for annotation or instructional content, allowing users to input annotations or instructional content directly associated with selected design element. Subsequently, the AI engine determines the precise positional coordinates (x, y, z) of the selected design element, so that these coordinates are accurately associated with the corresponding annotations or instructional content. This methodology facilitates that annotations and instructional content are not only relevant and accurately placed within the digital representation but also perfectly aligned with the physical location of the design element within the building, thereby maintaining a coherent and synchronized digital-physical mapping of the architectural space.

In one embodiment of the present invention, the system features a sophisticated mechanism for tracking and reflecting real-world modifications within a building's physical structure directly onto its digital counterpart (design plans), effectively maintaining an up-to-date digital twin. Utilizing an array of sensors, IoT devices, and cameras strategically installed throughout the physical building, the system captures any changes or alterations made to the structure. These changes may include architectural modifications, interior design updates, or structural enhancements.

Once a change is detected, the AI Engine analyzes the collected data to understand the nature and scope of the modification. This analysis includes identifying the specific design elements affected, the extent of the changes, and any potential impacts on related components within the design plan. The AI Engine then automatically updates the digital design plan to accurately mirror these physical alterations, so that the digital twin remains a true reflection of the current state of the building.

Moreover, in-depth pixel-level analysis may involve considering spatial relationships between pixels within the static representation, facilitating a predefined distance between them, thus refining the precision of the analysis process.

In some embodiments, the two-dimensional reference input may be file extensions that include but are not limited to: DWG, DXF, PDF, TIFF, PNG, JPEG, GIF, or other types of files based upon a set of engineering drawings. Some two-dimensional reference references may already be in a pixel format, such as, by way of a non-limiting example, a two-dimensional reference in a JPEG, GIF or PNG file format. The engineering drawings may be hand drawings, or they may be computer-generated drawings, such as may be created as the output of CAD files associated with software programs such as AutoDesk™, Microstation™ etc. As some architects, design firms and others who generate engineering designs for buildings may be reluctant to share raw CAD files with others, the present invention provides a solution that does not require raw CAD files.

In other examples, such as for older structures, a drawing or other 2D representation may be stored in paper format or digital version or may not exist or may never have existed. The input may also be in any raster graphics image or vector image format.

The input process may occur with a user creating, scanning into, or accessing such a file containing a raster graphics image or a vector graphics image. The user may access the file on a desktop or standalone computing device or In some embodiments, via an application running on a smart device. In some embodiments, a user may operate a scanner or a smart device with a camera to create the file containing the image on the smart device.

In some embodiments, a system utilizes pixel patterns and polygon patterns in sizing analysis of the selected segments or design elements of design plans. The system incorporates a user-adjustable and/or AI-adjustable feature for sizing variations, utilizing percentage variation in pixel positions relative to other pixel positions within a defined window of the segment selection. It may involve convolutional filters for zero-shot and one-shot approaches, leveraging generative models and template matching. Another embodiment may incorporate relative positioning of pixels, employing mathematical representations, algorithms, and vector-based approaches for analyzing distances, angles, and clustering vectors into symbols. The system aims for optimization based on speed, quality, cost-effectiveness, durability, aesthetics, financial criteria, supply chain, labor costs, subcontractor selection, scope of work, location, equipment, spatial relevance, clearance, covering area, floor, ceiling, paths, plumbing, gas/chemical lines, cables, electrical wiring, and rule-based criteria. Users can select measurements such as length, area, volume, atmospheric volume, and relative height, further refining the system's analysis. This versatile approach prioritizes user-defined preferences and customizable variables to streamline decision-making and planning.

A primary advantage of AI analysis in this scenario is its capacity to analyze complex pixel patterns, vectors, and polygons using knowledge derived from previous experiences. This knowledge is not confined to the work of a single individual but can be harnessed from a select group of experts or shared learnings from similar past projects. This means that the AI system has access to a vast pool of information and insights, enabling it to make informed and effective decisions. Furthermore, the speed at which AI analysis can derive new and improved work based on the current design plan is a remarkable asset. The capabilities of the AI Engine in generating and managing instructional content far exceed human processing abilities, positioning it as an invaluable asset for innovating and enhancing design plans. Through its advanced computational power, the AI Engine can swiftly analyze complex design elements, identifying opportunities for optimization and suggesting refinements that may not be immediately apparent to human users. This functionality extends to the automated generation of instructional content, where the AI Engine documents each suggested alteration, providing a detailed rationale and potential impact analysis for the change.

According to the present invention, analysis of pixel patterns and enhanced vector diagrams and/or polygon based diagrams may include one or more of: neural network analysis, opposing (or adversarial) neural networks analysis, machine learning, deep learning, artificial-intelligence techniques (including strong AI and weak AI), forward propagation, reverse propagation and other method steps that mimic capabilities normally associated with the human mind-including learning from examples and experience, recognizing patterns and/or objects, understanding and responding to patterns in positions relative to other patterns, making decisions, solving problems. The analysis also combines these and other capabilities to perform functions the skilled labor force traditionally performed.

BRIEF DESCRIPTION OF THE DRAWINGS

The accompanying drawings, which are incorporated into and constitute a part of this specification, illustrate several embodiments of the present invention. Together with the description, these drawings serve to illustrate some aspects of the present invention.

FIGS. 3A-3D show various views of the AI-analyzed boundaries and design elements overlaid on the original floorplan including a table illustrated to contain hierarchical dominance relationships between area types.

FIGS. 10A-10B illustrate additional method steps that may be executed in some embodiments of the present invention.

FIGS. 15A-15B illustrate exemplary method steps that may be executed in some embodiments of the present invention.

DETAILED DESCRIPTION

Figure 1:
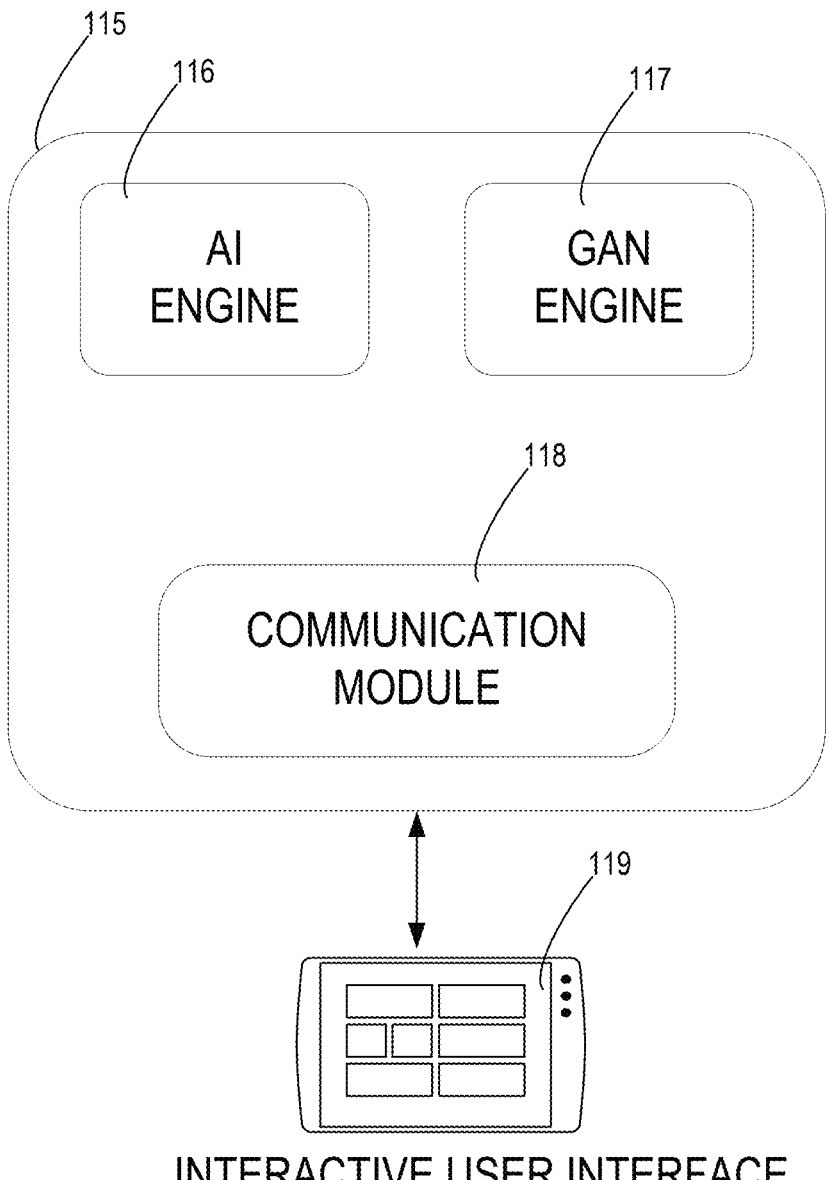
FIG. 1 is a schematic diagram that illustrates components of apparatus that may be used to implement some methods and processes of the present invention.

The present invention provides systems, methods, and apparatus for dynamically associating, customizing, and delivering instructional content for design elements within a design plan of a building. In some embodiments, a design plan of at least a portion of the building is received into a controller operating an AI engine. The design plan may comprise graphical depictions of physical building components such as walls, ceilings, HVAC systems, lighting fixtures, plumbing systems, or other equipment installed within the building structure. The design plan may be provided in a format such as a Building Information Modeling (BIM) file, a CAD file, a Revit® compatible file, or a rasterized or vectorized graphical representation of architectural layouts. The controller may be deployed either locally on a user device or remotely on a cloud server accessible through networked communication.

Upon receipt of the design plan, the controller analyzes the graphical depictions using the AI engine to identify one or more design elements represented within the design plan. The identification process may involve comparing patterns, dimensions, and configurations of the depicted structures with templates stored in a database comprising known building component representations. For example, a sink may be identified based on its size, location within a bathroom space, and the presence of plumbing connections, whereas an air conditioning unit may be recognized based on its rectangular casing, proximity to ventilation ducts, and technical notations present on the design plan. The database of design templates may be continuously updated with new symbols, graphical elements, and as-built deviations to accommodate a wide range of building layouts and installations.

After identifying the design elements, the controller searches one or both of a local instructional content repository stored on the first user device and a remote instructional content repository stored on a cloud server to retrieve instructional content corresponding to the identified design elements. The instructional content may include, without limitation, installation manuals, repair guides, troubleshooting procedures, tutorial videos, safety checklists, regulatory compliance documents, parts diagrams, warranty information, or other forms of educational and procedural documentation relevant to construction, maintenance, and repair activities associated with the design elements. In cases where the instructional content is not found in the searched databases, the controller may initiate an internet search and AI-based content generation to synthesize new instructional content based on publicly available data, technical specifications, manufacturer resources, or previously captured field service knowledge.

The controller generates an interactive user interface on a first user device configured to display the design plan along with instructional content indicators overlaid on at least some of the identified design elements. The instructional content indicators may comprise selectable icons, hyperlinks, graphical markers, or embedded media windows, each visually linked to a corresponding design element. For example, a green wrench icon may be overlaid on an air conditioning unit on the design plan to indicate availability of an installation manual, whereas a flashing red exclamation mark may be placed near a detected fault in a pipeline requiring urgent repair attention. Each instructional content indicator may carry embedded metadata comprising details such as component identification, last service date, associated repair risks, or urgency levels.

A user, such as a service personnel, contractor, or building manager, interacts with the instructional content indicators through the user interface by providing a prompt such as selecting, clicking, tapping, hovering over, or verbally commanding the selection of an indicator. Upon receiving the user prompt, the controller retrieves and provides access to the corresponding instructional content associated with the selected indicator. In some embodiments, the user may instead select a design element directly (even without selecting an explicit indicator) to trigger the loading of relevant instructional content.

In addition to manual selection, the system may also allow contextual triggering of instructional content access based on real-time user location or service task assignment. For example, when service personnel approach the physical location of a heating unit represented in the design plan, the proximity detection may automatically preload and present the associated repair guide onto the user device without requiring manual selection. Similarly, if a manager assigns a repair task for a broken pipe to a service personnel, the system may preload relevant tutorial videos and safety checklists related to that pipe onto the second user device assigned to the personnel.

The first user device on which the interactive user interface operates may include, but is not limited to, a tablet, a smartphone, a laptop, an augmented reality (AR) headset, a virtual reality (VR) headset, or a head-mounted wearable device. In some embodiments, when the user device is an AR headset, the instructional content may be displayed as augmented overlays directly superimposed onto the physical world view, allowing the service personnel to receive step-by-step repair instructions visually aligned with the physical equipment under repair. For example, an AR headset may highlight the exact bolts that need to be loosened to open a panel of an HVAC system, overlaid seamlessly onto the technician's real-world vision.

In some embodiments, when a service task is assigned to a service personnel, the controller may preload relevant instructional content into a second user device associated with the service personnel prior to task execution. This preloading reduces delays during service work and allows for offline access in environments where network connectivity may be intermittent. The second user device may be configured to download not only primary procedural content but also supplementary videos, parts diagrams, troubleshooting FAQs, and safety compliance requirements associated with the assigned service task.

During service work, the controller may track real-time progress of the service personnel by interfacing with a head-mounted camera or wearable device worn by the personnel. The head-mounted camera may capture live video or images of the personnel's work environment and actions, transmitting the captured media to the controller for real-time analysis. The AI engine operating on the controller may evaluate the captured data to determine whether the service personnel is following the prescribed standard operating procedures (SOPs) and may detect deviations such as incorrect tool usage, skipped safety steps, or procedural errors.

Based on the real-time tracking, if the AI engine determines that the service personnel is not following the SOPs correctly or encounters an unexpected issue during service work, the controller may dynamically modify the instructional content being provided. For example, if the service personnel are seen installing a gasket in the wrong orientation, the system may push an immediate corrective visual overlay to the AR headset showing the proper installation method, accompanied by a warning audio cue.

In some embodiments, the system may further facilitate remote expert interaction during real-time service work. Upon detection of a deviation or upon request by the service personnel, the interactive user interface may allow live chat, voice call, or live video sharing with a remote expert. The remote expert may view the live feed from the head-mounted camera and provide direct verbal or visual guidance, annotate visual elements in the technician's AR display, or send modified procedural instructions in real-time to assist the technician in completing the service task accurately.

Throughout the real-time service work, the head-mounted camera or wearable device may record the service session. The controller may upload the recorded video to a centralized cloud server where it is stored and associated with the respective design element of the design plan. For example, a video recording of replacing a solenoid valve in a boiler system may be attached to the boiler's graphical representation in the design plan for future reference, allowing future technicians to learn from previous service sessions.

Once uploaded, the recorded service videos may be analyzed and automatically associated with similar design elements found in other design plans maintained through the centralized cloud server. For example, if ten different buildings utilize the same model of HVAC unit, the recorded repair video for one unit may be associated across all instances, thereby propagating experiential knowledge throughout the entire managed building portfolio.

In addition to associating pre-existing service videos, the system may continuously monitor real-time status of components within the building using cameras or Internet of Things (IoT) sensors such as temperature sensors, pressure gauges, vibration detectors, or moisture sensors. In response to detecting faults such as pipeline leakages, excessive vibration in mechanical systems, overheating of electrical panels, or water ingress, the controller may automatically trigger delivery of relevant instructional content to assist in immediate mitigation, repair, or preventive maintenance actions.

The instructional content accessible through the system may include a wide array of formats suited to different service scenarios, including step-by-step visual instructions, interactive checklists, multi-language text guides, AR overlays, three-dimensional assembly animations, voice-guided tutorials, and regulatory compliance verification forms. In some cases, dynamic instructional content generated by the AI engine based on real-time conditions may supplement static manuals, offering context-specific adaptive guidance.

The instructional content indicators displayed on the design plan may be visually distinguished based on several parameters. For example, indicators may appear in green if the component is operational and instructional content is available; yellow if the component requires maintenance soon; red if a fault is detected and urgent service is needed; and grey if instructional content is unavailable but generation is pending. Each indicator may present, upon selection or hover, detailed metadata including last serviced date, model specifications, warranty expiration, maintenance history, or known operational issues.

The interactive user interface may allow filtering of visible instructional content indicators based on user-selected parameters such as component category, service urgency, fault type, service assignment status, or geographical location within the building. Such filtering may assist service managers in prioritizing maintenance operations and optimizing workforce allocation.

In certain embodiments, voice commands captured by microphones integrated within user devices, such as "show next step," "highlight faulty valve," or "display wiring diagram," may serve as valid user prompts for accessing or navigating the instructional content associated with a selected design element.

Throughout all service and maintenance operations, the controller may update the design plan dynamically based on field feedback. For example, if service personnel discovers that a fixture is installed at a different location than originally specified in the plan, the controller may update the digital twin of the building to reflect the accurate as-built status, thereby keeping the operational records current and reliable.

In some embodiments, the present invention provides systems, methods and apparatus for an interactive platform that significantly enhances collaborative processes associated with a dynamic user interface based upon a static design plan reference. Within this interactive platform, users can seamlessly select a spatial designation, (such as, for example, a spatial designation associated with a design element) for annotation or adding instructional content within an interactive user interface based upon a static design plan document descriptive of at least a portion of a building or construction site.

The present invention provides interaction enabling a dialogue between users, and/or an AI Engine, about design elements and instructional content. In another aspect, it also contributes to a feedback system where the AI engine can observe and learn from user interactions. As users comment on or react to instructional content, the AI engine may analyze responses, utilizing them for machine learning to refine a quality and relevance of future automated instructional content suggestions. Moreover, the systems according to the present invention may also allow for an approval workflow, wherein instructional content can be approved, disapproved, or rated by authorized users or automatically by the AI engine depending upon positive or negative reactions to the instructional content.

Machine monitoring of spatially relevant annotations facilitates machine and user input capability that becomes more accurate over time and adheres to a collective knowledge and preferences of a team, thereby enhancing collaborative processes.

This embodiment is particularly innovative in how it leverages connectivity with third-party vendor platforms. Through seamless integration, the platform facilitates immediate access to a wide range of quotes for required materials, enables the efficient hiring of labor tailored to the project's revised needs, and even supports the direct procurement of services and goods. Users benefit from a streamlined interface where design modifications, cost implications, and procurement actions converge in a cohesive workflow.

To generate instructional content descriptive of an element included in a design plan via artificial intelligence (AI), the following process can be implemented:

1 Input Design Plan into the AI System

A design plan, which may include graphical depictions of physical building components, is received into a controller operating an AI engine. The design plan can be in the form of a two-dimensional (2D) or three-dimensional (3D) representation of at least a portion of a building.

The design plan is pre-processed to ensure compatibility with the AI engine. For example, a 2D design plan may be converted into a raster image or vector format for analysis.

2 Identification of Design Elements

The AI engine analyzes the design plan to identify individual design elements. This is achieved by comparing graphical depictions in the design plan with stored design element templates or models in a database.

The identification process may involve:

Pattern recognition techniques to detect shapes, symbols, or features corresponding to specific design elements.

Machine learning models trained on annotated design plans to classify and label components such as walls, doors, HVAC systems, electrical outlets, or plumbing fixtures.

Retrieval of Existing Instructional Content

Once the design elements are identified, the AI engine searches an instructional content database for content corresponding to the identified elements. The database may include:

Installation manuals

Repair guides

Maintenance workflows

Safety guidelines

Regulatory compliance documents

If a match is found, the corresponding instructional content is retrieved and associated with the identified design element.

AI-Based Content Generation for Missing Elements

For design elements where no pre-existing instructional content is found in the database, the AI engine generates new content. This process involves:

Internet Search and Data Aggregation: The AI engine initiates an internet search to gather relevant information, such as technical specifications, user manuals, or instructional videos, from trusted sources.

Natural Language Processing (NLP): The AI engine uses NLP to extract, summarize, and structure the gathered information into coherent instructional content.

Content Synthesis: The AI engine synthesizes the information into a format suitable for the user, such as step-by-step instructions, annotated diagrams, or video tutorials.

Customization of Instructional Content

The AI engine customizes the generated instructional content based on contextual parameters, such as:

Building Type: Residential, commercial, or industrial.

User Role: Architect, contractor, or maintenance personnel.

Time of Access: Adjusting content for real-time or scheduled use.

Language and Location Preferences: Translating content into the user's preferred language and adapting it to local building codes or standards.

Association of Instructional Content with Design Elements

The AI engine associates the generated or retrieved instructional content with the corresponding design elements in the design plan. This association is represented visually on an interactive user interface.

Instructional content indicators, such as icons, hyperlinks, or graphical markers, are overlaid on the design plan adjacent to the respective design elements.

Delivery of Instructional Content

The instructional content is made accessible to the user through the interactive user interface. The user can interact with the instructional content indicators to view or download the content.

The content may be delivered in various formats, including: text-based instructions; annotated diagrams; video tutorials; and augmented reality (AR) overlays for real-time guidance.

Continuous Learning and Improvement

The AI engine continuously learns and improves its content generation capabilities by: Incorporating user feedback on the quality and relevance of the instructional content; updating its database with newly generated or retrieved content; and refining machine learning models based on additional training data.

By following this process, the AI system ensures that instructional content is dynamically generated, contextually relevant, and tailored to the specific design elements included in the design plan. This approach enhances the efficiency and accuracy of delivering instructional guidance for building design, construction, and maintenance tasks.

In some embodiments, an AI assisted system may preemptively address potential issues of adherence with a desired practice, a design relevant document, and/or other criteria, thereby significantly reducing the likelihood of encountering costly modifications during or after the construction phase.

Moreover, some embodiments may serve to streamline interactions with review bodies and approval processes. By providing a platform that inherently aligns with regulatory expectations, the system facilitates a smoother, more efficient pathway from project conception through to completion. The preemptive adherence to a preferred design criteria may accelerate an acceptance process, minimizing delays and fostering a more productive relationship between project stakeholders and/or other parties of interest.

Additionally, in some embodiments, a platform may catalog interactions, creating a searchable knowledge base that grows increasingly relevant over time. As questions are asked and answered, an associated AI engine may refine its ability to understand and respond to inquiries, improving the accuracy and relevance of its automated responses.

In the following sections, detailed descriptions of examples and methods will be given. The description of both preferred and alternative examples, though thorough, are exemplary only. It is understood by those skilled in the art, that various modifications and alterations may be apparent and within the scope of the present invention. Unless otherwise indicated by the language of the claims, the examples do not limit the broadness of the aspects of the underlying invention as defined by the claims.

Referring now to FIG. 1, a schematic diagram illustrates components of apparatus that may be used to implement the methods and processes of the present invention. Automated apparatus 115, which may include a controller with a processor and executable software executable upon command by a user and/or automated agent is illustrated. The automated apparatus may include one or both of: an AI Engine 116, and a GAN engine 117. The AI Engine 116, and a GAN engine 117, may be linked to an interactive user device 119 via a communication module 118. The communication module may include hardware and/or software that is operative to present output from the AI Engine 116, and a GAN engine

117 and input into the AI Engine 116, and a GAN engine 117. The user interactive device 119 may include one or more of: an interactive screen, a keyboard, a pointing device, a touchscreen, or other apparatus capable of receiving instructions or presenting output to a human user of automated agent.

According to some embodiments of the present invention, a controller is capable of receiving input in the context of projects to generate automated design plans. The context of a project, such as the site location, environmental factors, and user preferences, may be weighted to play a more or less significant role in the generation of design output by the controller. For example, a design output for a beachfront property may differ significantly from one located in a dense urban environment, based upon differences in ambient weather variables, zoning regulations, and available space. Other considerations, such as a design intended for a family with young children may prioritize certain factors, such as safety and accessibility in ways that may not be relevant to a design for a single individual or a commercial enterprise. A controller with AI and GAN engines is capable of incorporating such contextual factors into a generation process, allowing for greater customization and accuracy in output design plans.

In another aspect, in some embodiments, a controller system for automated design plan generation may output revisions and updates based on changing requirements, as those changing requirements are made know to the controller. Updates may be made on a periodic basis, upon user command, and/or in real time. In some projects, an initial design plan may undergo multiple revisions as a user's needs evolve, or new variable values are made available to the controller. For example, a user may initially request a simple, single-story layout, only to later decide that they want to add a second floor. Automated systems automated systems according to the present invention are able to accommodate changes without requiring a complete redesign. Controllers deploy sophisticated algorithms that can adjust an existing design, while maintaining the integrity of an overall layout, functionality, and aesthetic.

In addition to handling revisions, automated controllers are capable of considering various factors that influence a success of a design. Factors may include, one or more of: placement of design elements, a flow of movement within a space, and integration of mechanical systems such as plumbing, HVAC, and electrical wiring. For example, moving a room to a different part of the layout may affect the placement of plumbing fixtures, requiring adjustments to the overall design. The controller systems of the present invention account for such dependencies, making intelligent adjustments in a fraction of the time that a human would need to consider each variable in play and still preserve the functionality and efficiency of the design.

In another aspect, a controller system according to the present invention provides for automated design plan generation with balanced aesthetic preferences and practical constraints. For example, users may prioritize one or more aspects of a design plan to be generated such as, by way of non-limiting example, one or more of: a visual appeal of a design, practical considerations such as space utilization, structural integrity, energy efficiency, aesthetic appeal, or other variable important to a user in a given set of circumstances. A user may request a particular aspect, such as, for example, a large, open living space with floor-to-ceiling windows, and an AI Agent or other interface or user communication may inform the user that the request may result in increased energy costs or reduced privacy. Automated systems must be able to offer alternative design solutions that balance these competing priorities, allowing users to achieve their aesthetic goals without compromising functionality.

A controller with one or more AI Engines and GAN may accommodate unique user preferences and/or situational requirements. Traditional design methods are often limited in their ability to quickly respond to changes or provide multiple design options, particularly when working within tight time frames or budgets. Automated controllers and systems according to the present invention provide a wide range of design possibilities to the users, allowing users to experiment with different layouts, configurations, and styles without requiring extensive manual input. This flexibility is particularly valuable in industries such as real estate development, where rapid iteration and customization are often required to meet client expectations.

In addition to providing flexibility, automated design systems provide improved collaboration between stakeholders. In traditional design processes, revisions and updates often require multiple rounds of feedback and approval, with each party involved in the project providing input at different stages. Automated systems streamline such processes by allowing for real-time collaboration, where multiple users can interact with the design simultaneously, making adjustments and providing feedback in real time. This reduces the need for back-and-forth communication and accelerates the overall design process, leading to faster approvals and more efficient project management.

In some embodiments, a GAN may be used to generate instructional content and/or select an appropriate instructional content based upon a user need. Generative Adversarial Networks (GANs) offer a powerful approach to either generate new instructional content or select the most appropriate instructional content for design elements within a design plan. By leveraging the dual-network structure of GANs-comprising a generator and a discriminator—these systems can create high-quality, contextually relevant materials or refine the selection process for existing content.

Without limitation to an order of execution of steps, in some embodiments, a process for instructional content generation may include training the GAN on a dataset of existing materials, such as installation manuals, repair guides, maintenance workflows, and tutorial videos. This dataset is annotated with metadata, including the type of design element, building type, and user role, to provide context for the AI. The generator network is then tasked with creating new instructional content based on input parameters, such as the type of design element and contextual factors like building type or user preferences. For instance, the generator might produce step-by-step instructions, annotated diagrams, or even video tutorials tailored to a specific design element. Meanwhile, the discriminator network evaluates the generated content, comparing it to real examples from the training dataset to ensure it is realistic and contextually appropriate. Through iterative training, the generator improves its ability to create high-quality content, while the discriminator becomes more adept at identifying flaws. Once trained, the GAN can generate new instructional materials for design elements that lack pre-existing content, such as a unique HVAC component or a custom structural beam.

In addition to generating content, GANs can also enhance processes of selecting relevant instructional content for a given design element. Selecting appropriate instructional content may include extracting features of the design element from the design plan, such as its type, dimensions, and associated metadata. The generator network may synthesize potential matches by creating metadata tags or descriptions that could correspond to the design element. For example, it might suggest "installation guide for HVAC system" or "safety checklist for electrical panel."

The discriminator may evaluate these suggestions by comparing them to the actual metadata of instructional content stored in the database, assigning confidence scores to indicate how well each match aligns with the design element. Through iterative refinement, the generator learns to propose increasingly relevant matches, while the discriminator ensures the final selection is accurate and contextually appropriate. The result is a ranked list of the most relevant instructional content, tailored to the specific design element and its context.

The use of GANs in this manner offers several advantages. First, they can generate new content for design elements that lack pre-existing materials, ensuring comprehensive coverage. Second, by incorporating contextual parameters such as building type, user role, and location preferences, GANs ensure that the generated or selected content is highly relevant to the user's needs. The adversarial training process also guarantees that the outputs are of high quality and realistic.

Furthermore, GANs are scalable, capable of handling large datasets and generating or selecting content for a wide variety of design elements, making them ideal for complex design plans. Finally, GANs can continuously improve by retraining with new data, allowing them to adapt to evolving design standards, user preferences, and instructional content formats.

For example, consider a scenario where a design plan includes a unique structural beam not found in the instructional content database. A GAN could generate a draft installation guide for the beam, complete with diagrams and step-by-step instructions. The discriminator would evaluate the draft against existing guides for similar beams, ensuring accuracy and relevance. The final output would be a high-quality, customized installation guide tailored to the unique beam.

In summary, GANs provide a robust framework for both generating and selecting instructional content. By leveraging their ability to create realistic outputs and refine selections through adversarial training, GANs can significantly enhance the efficiency, accuracy, and relevance of instructional content delivery for design elements in a building plan.

Figure 1A:
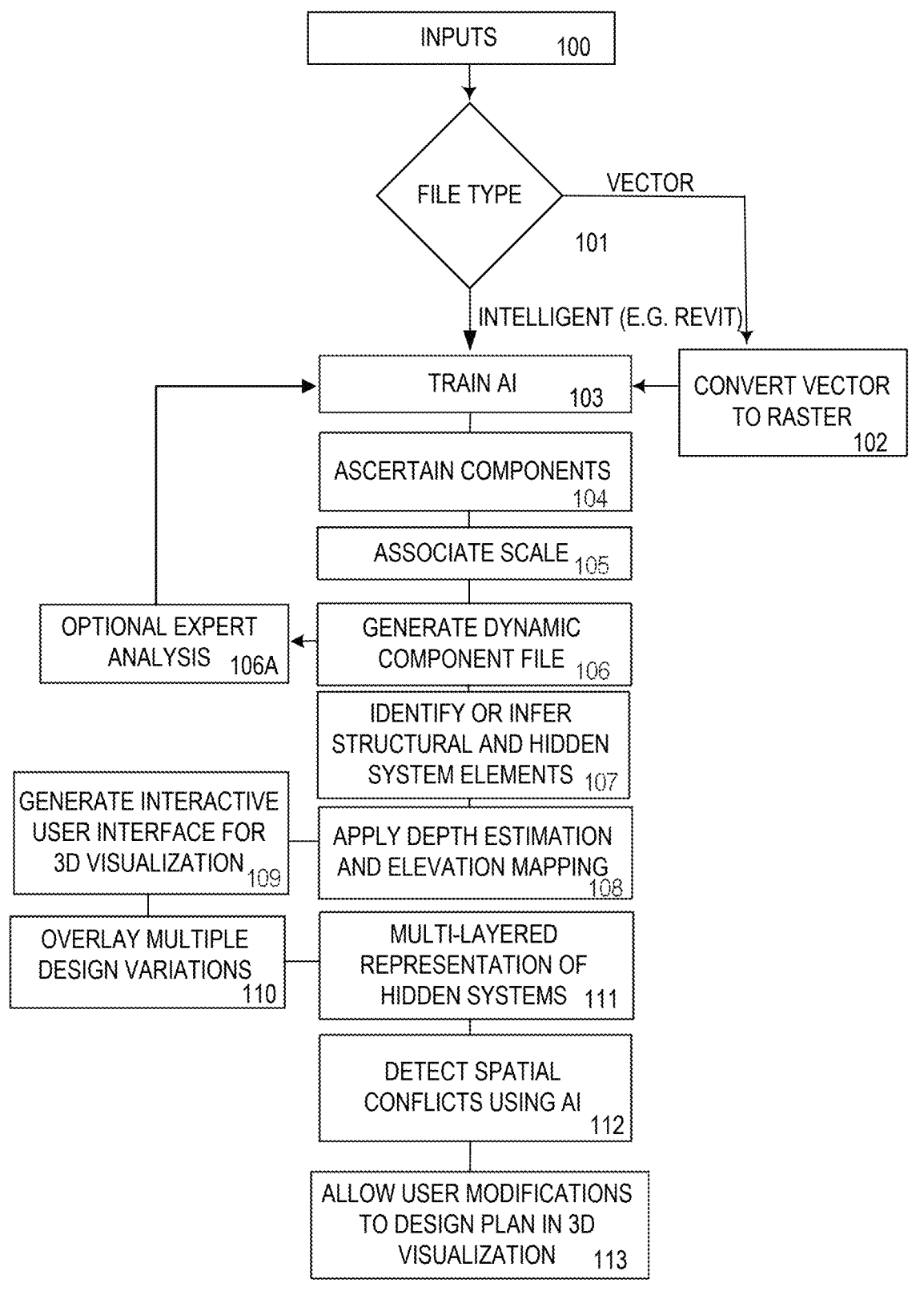
FIG. 1A illustrates method steps that may be implemented in some embodiments of the present invention.

Referring to FIG. 1A, a general flow diagram showing some preferred embodiments of the present invention as illustrated. At step 100, a design plan (which may be a design plan or dynamic architectural design file e.g., a Revit® compatible file) indicating aspects of a building; is input into a controller or other data processing system using a computing device. The design plan may include an item of a known size, such as, by way of a non-limiting example, a scale bar that allows a user to ascertain a scale of the drawing (e.g., 1"=100' etc.) or an architectural aspect of a known dimension, such as a wall or doorway of a known length (e.g., a doorway known to be three feet wide).

Input of a two-dimensional reference (i.e., design plan) into the controller may occur, for example, via known ways of rendering an image as a vector diagram, such as via a scan of paper-based initial drawings; upload of a vector image file (e.g., encapsulated postscript file (epf file); adobe illustrator file (ai file); or portable document file (pdf file). In other examples, a starting point for estimation may be drawing file in an electronic file containing a model output for an architectural floor plan. In still further examples, other types of images stored in electronic files such as those generated by cameras may be used as inputs for automated processes.

In some embodiments, the design plan may be file extensions that include but are not limited to: DWG, DXF, PDF, TIFF, PNG, JPEG, GIF, or other types of files based upon a set of engineering drawings. Some design plans may already be in a pixel format, such as, by way of a non-limiting example, a two-dimensional reference in a JPEG, GIF or PNG file format. The engineering drawings may be hand drawings, or they may be computer-generated drawings, such as may be created as the output of CAD files associated with software programs such as AutoDesk™, Microstation™ etc. In other examples, such as for older structures, a drawing or other design plan may be stored in paper format or digital version or may not exist or may never have existed. The input may also be in any raster graphics image or vector image format.

The input process may occur with a user creating, scanning into, or accessing such a file containing a raster graphics image or a vector graphics image. The user may access the file on a desktop or standalone computing device or, in some embodiments, via an application running on a smart device. In some embodiments, a user may operate a scanner or a smart device with a charged coupled device to create the file containing the image on the smart device.

In some embodiments, a degree of the processing as described herein may be performed on a controller, which may include a cloud server, a standalone computing device or a smart device. In many examples, the input file may be communicated by the smart device to a controller embodied in a remote server. In some embodiments, the remote server, which is preferably a cloud server, may have significant computing resources that may be applied to AI algorithmic calculations analyzing the image.

In some embodiments, dedicated integrated circuits tailored for deep learning AI calculations (AI Chips) may be utilized within a controller or in concert with a controller. Dedicated AI chips may be located on a controller, such as a server that supports a cloud service or a local setting directly.

In some embodiments, an AI chip tailored to a particular artificial intelligence calculation may be configured into a case that may be connected to a smart device in a wired or wireless manner and may perform a deep learning AI calculation. Such AI chips may be configurable to match a number of hidden levels to be connected, the manner of connection, and physical parameters that correspond to the weighting factors of the connection in the AI engine (sometimes referred to herein as an AI model). In other examples, software-only embodiments of the AI engine may be run on one or more of: local computers, cloud servers, or on smart device processing environments.

At step 101, a controller may determine if a design plan received into the controller includes a vector diagram. If a file type of the received design plan, such as an input architectural floor plan technical drawing, includes at least a portion that is not already in raster graphics image format (for example, that it is in vector format), then the input architectural floor plan technical drawing may be transformed to a pixel or raster graphics image format in step 102. Vector-to-image transforming software may be executed by the controller, or via a specialized processor and associated software.

In some embodiments, the controller may determine the pixel count of a resulting rasterized file. The rasterized file will be rendered suitable for the controller hosting an artificial intelligence engine ("AI engine") to process, the AI engine may function best with a particular image size or range of image size and may include steps to scale input images to a pixel count range in order to achieve a desired result. Pixel counts may also be assigned to a file to establish the scale of a drawing—for example, 100 pixels equals 10 feet. As an illustrative example, images can be resized to dimensions such as 1024×1024, 512×512, or other dimensions that may be appropriate for the AI engine to function in a better way.

In various examples, the controller may be operative to scale up small images with interleaved average values with superimposed Gaussian noise as an example, or the controller may be operative to scale down large images with pixel removal. A desired result may be detectable by one or both the controller and a user. For example, a desired result may be a most efficient analysis, a highest quality analysis, a fastest analysis, a version suitable for transmission over an available bandwidth for processing, or other metric.

At step 103, training (and/or retraining) of the AI engine is performed. Training may include, for example, manual identification of patterns in a rasterized version of an image included in a design plan that corresponds with architectural aspects, walls, fixtures, piping, duct work, wiring or other features that may be present in the two-dimensional reference. The training may also include one or more of: identification of relative positions and/or frequencies and sizes of identified patterns in a rasterized version of the image included in the design plan.

In some embodiments, and in a non-limiting sense, an AI engine used to analyze the design plan may be based on a deep learning artificial neural network framework. The AI engine image processing may extract different aspects of an image included in the design plan that is under analysis. At a high level, the processing may perform segmentation to define boundaries between important features. In engineering drawings defined boundaries may be based on the presence of architectural features, such as walls, doorways, windows, stairs, and the like.

In some embodiments, a structure of the artificial neural network may include multiple layers, such as input layers and hidden layers with designed interconnections with weighting factors. For learning optimization, the input architectural floor plan technical drawings may be used for artificial intelligence (AI) training to enhance the AI's ability to detect what is inside a boundary. A boundary is an area on a digital image that is defined by a user and tells the software what needs to be analyzed by the AI. Boundaries may also be automatically defined by a controller executing software during certain process steps, such as a user query. A boundary within the context of a design plan may signify the presence of a wall. Using deep artificial neural networks, original architectural floor plans (along with any labeled boundaries) may be used to train AI models to make predictions about what is inside a boundary. In exemplary embodiments, the AI model may be given over ~50,000 similar architectural floor plans to improve boundary-prediction capabilities.

In some embodiments, a training database may utilize a collection of design data that may include one or more of: a combination of a vector graphic two-dimensional references such as floor plans and associated raster graphic version of the two-dimensional references; raster graphic patterns associated with features; and a determination of boundaries may be automatically or manually derived. (An exemplary AI-processed two-dimensional reference that includes a design plan and/or a floorplan 210, with boundaries 211 predicted, is shown in FIG. 2B, based on the floorplan of FIG. 2A).

In still another aspect, in some embodiments, a controller may access data from various types of BIM and Computer Aided Drafting (CAD) design programs and import dimensional and shape aspects of select spaces or portions of the designs as they are related to a design plan.

At step 104, an AI engine may ascertain features included in the design plan, the AI engine may additionally ascertain that a feature is located within a particular set of boundaries or external to the set of boundaries. Features may include, by way of non-limiting example, one or more of: architectural aspects, fixtures, duct work, wiring, piping, or other items included in a two-dimensional reference submitted to be analyzed. The features and boundaries may be determined, for example, via algorithmically processing an input design plan image with a trained AI model. As a non-limiting example, the AI engine may process a raster file that is converted for output as an image file of a floorplan (as illustrated in FIG. 2B, a boundary is represented as a line, a boundary may also be represented as a polygon, which may be a patterned polygon or other user discernable representation, such as a colored line etc.). Features may also be designated on a user interface. A feature may be represented via an artifact, such as, for example, one or more of: a point, a polygon, an icon, or other shapes.

At step 105, a scale (e.g., FIG. 2B item 217) is associated with the two-dimensional reference. In preferred embodiments, the scale is based upon a portion of the two-dimensional reference dedicated for indicating a scale, such as a ruler of a specific length relative to features included in a technical drawing included in the two-dimensional reference. The software then performs a pixel count on the image and applies this scale to the bitmapped image. Alternatively, a user may input a drawing scale or dimension for a particular image, building component, a wall, a boundary, a drawing, or other two-dimensional reference. The drawing scale, may for example, be in inches: feet, centimeters: meters, or any other appropriate scale.

In some embodiments, a scale may be determined by manually measuring a room, a component, or other empirical basis for assessing a scale (including the ruler discussed above). Examples therefore include a scale included as a printed parameter on two-dimensional reference or derived via reference to one or more dimensioned features in the design plan. For example, if it is known that a particular wall is thirty feet in length, a scale may be based upon a length of the wall in a particular rendition of the two-dimensional reference (or design plan) and proportioned according to that length. The known length of the wall can be determined from the markings or text on the design plan or can be specified by a user as an input. A known length or width of any other building component can be determined or entered by the user. Based on such known length or width of one building component, the scale can be proportioned, and dimensions of other building components can be calculated.

At step 106, a controller is operative to generate an interactive user interface with dynamic components (design elements) that may be manipulated by one or both of user interaction and automated processes. Any or all of the components in a user interface may be converted to a version that allows a user to modify an attribute of the components, such as the length, size, beginning point, end point, thickness, or other attribute. In some embodiments, a boundary may be treated as a component or a wall and manipulated in a similar manner.

Other components included in the user interface may include, one or more of: AI engine predicted components, user training aspects, and AI training aspects. In some non-limiting examples of the present invention, a generative adversarial network (GAN) may include a controller with an AI engine operative to generate a user interface that includes dynamic components. In some embodiments, a generative adversarial network may be trained based on a training database for initial AI feature recognition processes.

An interactive user interface may include one or more of: lines, arcs, or other geometric shapes and/or polygons. In some embodiments, the geometric shapes and/or polygons may comprise boundaries. The components may be dynamic in that they are further definable via user and/or machine manipulation. Components in the interactive user interface may be defined by one or more vertices. In general, a vertex is a data structure that can describe certain attributes, like the position of a point in a two-dimensional or three-dimensional space. It may also include other attributes, such as normal vectors, texture coordinates, colors, or other useful attributes.

At step 106A, in some embodiments, components presented in the interactive user interface may be analyzed by a user and refinements may be made to one or more components (e.g., size, shape and/or position of the component). In some embodiments, user modifications may also be input back to the AI engine to train the AI engine. User modifications provided back to the AI Engine may be referenced to make subsequent AI processes more accurate, efficient, fast, trained and/or enable additional types of AI processes.

At step 107, the controller is operative to identify or infer design elements contained within the design plan. The design elements may be explicitly marked in the design plan through symbolic notations or labels, or inferred based on geometric patterns, positioning, relative scaling, or standard architectural representations. In various embodiments, the identification of design elements may occur through the execution of trained AI models configured to process image-based or vector-based files such as raster graphics, CAD models, or BIM-compatible datasets. The AI engine may compare observed shapes and annotations with a stored repository of known design elements that may include, without limitation, walls, doorways, electrical panels, switches, plumbing components, HVAC units, exhaust vents, control terminals, appliances such as washing machines, dishwashers, refrigerators, and fixtures such as sinks, bathtubs, or showerheads. The identification process may include image segmentation, edge detection, polygon recognition, and metadata interpretation, particularly in intelligent design file formats such as Revit® or DWG files. In cases where the design file lacks explicit labels, the inference of components may occur through rule-based classifiers trained to correlate arrangement patterns with known construction templates.

In further embodiments of step 107, the system may utilize layer data embedded within design files to distinguish between different systems within the building, such as electrical schematics, plumbing blueprints, and structural layouts. By isolating data across layers and applying component-specific classifiers, the system may accurately infer the types of components present in each segment of the design plan. Moreover, identification may be improved through comparison with pre-established templates, component libraries, or a tagged inventory of previous projects. A probability confidence score may be calculated for each inferred component, and components falling below a configurable threshold may be flagged for manual review. In other examples, inference may also involve spatial reasoning wherein distances, connections, and adjacency to other components inform the likely classification of a feature.

In some embodiments related to step 107, a user may interact with an interface during the identification stage to confirm or correct components inferred by the AI engine. Such interactive correction may feed back into the AI model as training data, progressively refining its accuracy across future iterations. In further examples, the system may operate in hybrid modes, allowing a technician or field engineer to manually tag a component and assign or correct its classification in real-time using a tablet or augmented reality headset. The design plan may be a 2D overhead architectural layout or a 3D rendered BIM environment, and identification may adapt accordingly to the dimensional context.

At step 108, once design elements have been identified or inferred, the system proceeds to search a content repository (may be on a remote server) for instructional content relevant to each of the design elements. The content repository may be local, cloud-based, or hybrid in structure, and may be organized as a searchable index or relational database that maps unique component identifiers to instructional content artifacts. Instructional content, for the purposes of this disclosure, may include but is not limited to digital manuals, manufacturer data sheets, installation guides, maintenance workflows, standard operating procedures, safety checklists, and multimedia content such as instructional videos, annotated diagrams, or voice-guided walkthroughs.

In some embodiments of step 108, the content repository may support keyword-based matching, design element symbol-based matching, object-recognition-driven tagging, and semantic search capabilities. The controller may analyze the metadata associated with each identified design element, such as component type, model number, manufacturer ID, functional group (e.g., HVAC, electrical), and usage context, and use these parameters to query the repository. Instructional content retrieved may be prioritized by specificity, with preference given to documents and media assets that match the exact model or manufacturer of the component. When an exact match is not available, the system may search for generic content applicable to the category or function of the component.

In extended embodiments of step 108, the system may optionally rank content results based on quality metrics, such as user ratings, frequency of access, last updated timestamp, or verification status by certified professionals. For example, if multiple installation videos exist for a given component, the one with the highest technician rating or the most recent manufacturer update may be tagged as the primary association. Furthermore, the system may support multi-language repositories, enabling retrieval of content in the preferred language of the user or based on geographic deployment settings.

At step 109, the system is operative to associate match indications with the design elements identified on the design plan. A match indication is a graphical or symbolic cue displayed in conjunction with a design element to convey whether corresponding instructional content has been found and linked. In some embodiments, a green icon or checkmark may be rendered near the component symbol in the user interface to indicate successful association. Conversely, a yellow or red icon may be used to denote partial matches or absence of content, respectively. These indicators may be interactive, allowing users to click, hover over, or tap them to view match status or preview the linked content.

In alternative embodiments of step 109, match indications may be encoded using iconography that reflects the type of available content. For example, a video camera icon may denote the presence of a repair video; a document icon may represent a downloadable manual; and a wrench icon may indicate a procedural guide. In augmented or mixed reality implementations, match indicators may appear as floating tags overlaid on physical components in the user's view, aligned to their coordinates as per the design plan. In textual or report-based formats, match indications may appear as hyperlinks in a maintenance log or as a column in a compliance spreadsheet.

At step 110, the controller is configured to associate instructional content with corresponding design elements for which matching content has been identified in the content repository. This association may be implemented as a direct link embedded in the design plan metadata, a URL reference stored in an indexed database, or a file pointer within a BIM environment. In some embodiments, the link may be dynamically generated and include security parameters or access credentials for protected content. Access may also be governed by user roles, such as technician, supervisor, or contractor, and permissions may dictate whether a user can view, download, or annotate the content.

Additional embodiments of step 110 may implement content association through embedded QR codes or NFC tags affixed to physical components, with each tag mapped to the same instructional content that is linked in the digital plan. Scanning such tags may redirect the user to a mobile interface or AR overlay containing the same procedural guidance. In BIM or CAD environments, the association may also involve embedding rich data objects directly within component parameters, enabling a user to right-click or tap the object and select a "View Instructions" option.

Step 110 may also involve hierarchical association, wherein multiple content items are linked to a single component, such as installation procedures, regulatory compliance documents, and maintenance schedules. The user interface may present these in a tabbed or expandable menu. Furthermore, the association process may include fallback logic: when exact matches are not found, the system may associate the most similar content available and label it accordingly. In some configurations, artificial intelligence may analyze past usage data to recommend alternative guides based on successful repairs conducted on similar components.

At step 111, the system receives updates to the content repository from different sources. These updates may originate from a centralized management server, manufacturer databases, field uploads by certified technicians, crowd-sourced contributions from industry communities, or automated crawling of known content sources such as public maintenance video libraries. Updates may include new versions of manuals, newly published instructional videos, revised technical documents, or improved procedural guides that reflect new practices or revised standards.

In some embodiments of step 111, content repository updates may occur on a scheduled basis or in real time. For example, the system may be configured to check manufacturer APIs for new model releases or safety bulletins every 24 hours. Alternatively, when a field technician records a video showing a previously undocumented repair method for a specific unit, that video may be uploaded through a secure app interface and immediately queued for validation and tagging in the repository.

In step 111, metadata associated with content updates may include timestamps, version numbers, author identity, content rating, and category labels. The system may log each update event and trigger downstream processes such as notification to relevant users, re-evaluation of match status, and re-indexing of linked associations in design plans. Additionally, AI algorithms may analyze incoming content for novelty, duplication, or contradiction with existing materials and prioritize incorporation accordingly.

At step 112, the system is configured to revise content associations for design elements based on updated content received in step 111. When new instructional content is added to the repository, the controller may reevaluate previously unmatched or partially matched design elements to determine whether a now-available item can be newly associated with those elements. This step provides dynamic adaptability to the system, allowing for an evolving linkage between content and components. In some embodiments, the system may maintain a list or queue of design elements that previously failed to yield a match in step 108, and upon detecting a repository update, the controller may re-execute the matching algorithm against this queue to identify newly available resources.

The revision process in step 112 may also include re-ranking or updating associations that were already matched. For example, if a new instructional video becomes available that provides clearer or more recently verified information about the installation of a specific HVAC unit, the controller may prioritize this content over older materials, potentially demoting outdated videos to a lower position or archiving them. In one embodiment, the system may incorporate machine learning models trained to rank content based on historical user engagement, success rate in repair outcomes, or manual technician reviews. In such cases, the newly added content may be scored against existing associations, and the strongest match may be surfaced most prominently in the user interface.

Step 112 may also support revision of associations based on user feedback collected post-access. If a technician flags an associated instructional manual as inaccurate, unclear, or incompatible with the actual on-site component, the system may deprecate the association or tag it for review. Similarly, new formats of content, such as interactive 3D simulations or mixed reality repair guides, when added to the repository, may trigger automatic reassociation or augmentation of existing design element linkages. These associations may be revised with unique tags or indicators signifying the type of content added (e.g., "new," "updated," "field-tested").

In further embodiments of step 112, revision of content associations may be performed in batch or incrementally, depending on the volume of updates. Batch revision may occur during low-usage windows, such as during system maintenance cycles or scheduled updates, whereas incremental revisions may be triggered in near real-time as soon as relevant content is identified. This allows the system to adapt to rapid changes in technology, building practices, and component availability. Additionally, a changelog or revision history may be maintained to allow administrators or supervisors to review how and when content associations were updated, and revert or audit changes if required.

At step 113, the system enables user access to instructional content linked to design elements, thereby facilitating interaction during construction, repair, or maintenance tasks. Users may engage with the design plan through an interactive user interface presented on various devices, such as desktop workstations, tablets, mobile devices, or AR-enabled smart glasses. When a user selects or clicks on a component in the design plan, the system retrieves and displays the associated instructional content identified and linked through the processes described in steps 107-112. This access may be contextual and immediate, allowing users to view or interact with relevant documentation or media without the need to leave the application environment.

In embodiments of step 113, the system may present the instructional content in a variety of forms including embedded media viewers, pop-up panels, or split-screen views showing both the design plan and the instructional content side by side. In augmented reality configurations, the instructional content may be projected directly onto the user's view of the physical component, with overlay annotations guiding the service technician through the steps of installation or repair. For example, a technician inspecting a mechanical fan component may see arrows indicating the screw points, part replacements, and torque values as live guidance in their field of view.

Instructional content provided in step 113 may include textual guides, static images, exploded diagrams, manufacturer-authored manuals, service bulletins, video tutorials, audio narrations, interactive simulations, or step-by-step wizards. In some configurations, the content may also include warnings, safety instructions, and regulatory compliance documentation, especially in scenarios involving high-voltage systems, plumbing interfaces, or HVAC components involving refrigerants. Where applicable, QR codes or NFC tags physically placed on building components may be scanned to instantly launch the same content as linked in the digital design plan, creating consistency between physical and digital workflows.

The system may also provide bookmarking and annotation capabilities, enabling users to flag frequently used content or make personal notes for future visits. Additionally, user-specific histories may be recorded to track which instructional items were accessed during service sessions, providing traceability for audit purposes or team training. In some embodiments, system access may be role-based, where different users (e.g., electrician, plumber, HVAC specialist) receive tailored access to instructional content based on their job function, permissions, or project phase.

The availability of instructional content directly from the design plan, as described in step 113, is configured to facilitate on-site decision-making and reduce the time spent searching for relevant documentation. Moreover, the integration with dynamically updated content repositories and AI-assisted matching enables the system to remain current and relevant across a wide variety of design contexts, hardware configurations, and installation scenarios. Where necessary, offline access options may be provided by allowing technicians to pre-download content packages related to a particular floor or zone within a building, supporting use in low-connectivity environments.

The system described throughout FIG. 1A and steps 107 through 113 may be implemented as a cloud-based architecture, a local application, or a hybrid configuration where processing is distributed between edge devices and centralized servers. In some examples, a controller running AI modules may synchronize content associations across a project-wide network of user devices to reflect the latest revisions, flag outdated associations, and maintain alignment with the centralized content repository.

Furthermore, the architecture may be designed for compatibility with third-party APIs, enabling integration with facility management platforms, construction documentation systems, or compliance verification engines. This allows users to pull additional context about building systems or automatically link work orders to instructional materials as part of an integrated operational workflow.

In some embodiments, the AI engine used in step 107 may continue to learn from user interactions throughout steps 108 to 113. Each user selection, content access pattern, or corrective feedback may contribute to a learning loop that refines future component identification and improves the quality of content matching for subsequent design plan analysis across different projects or clients.

Figure 1B:
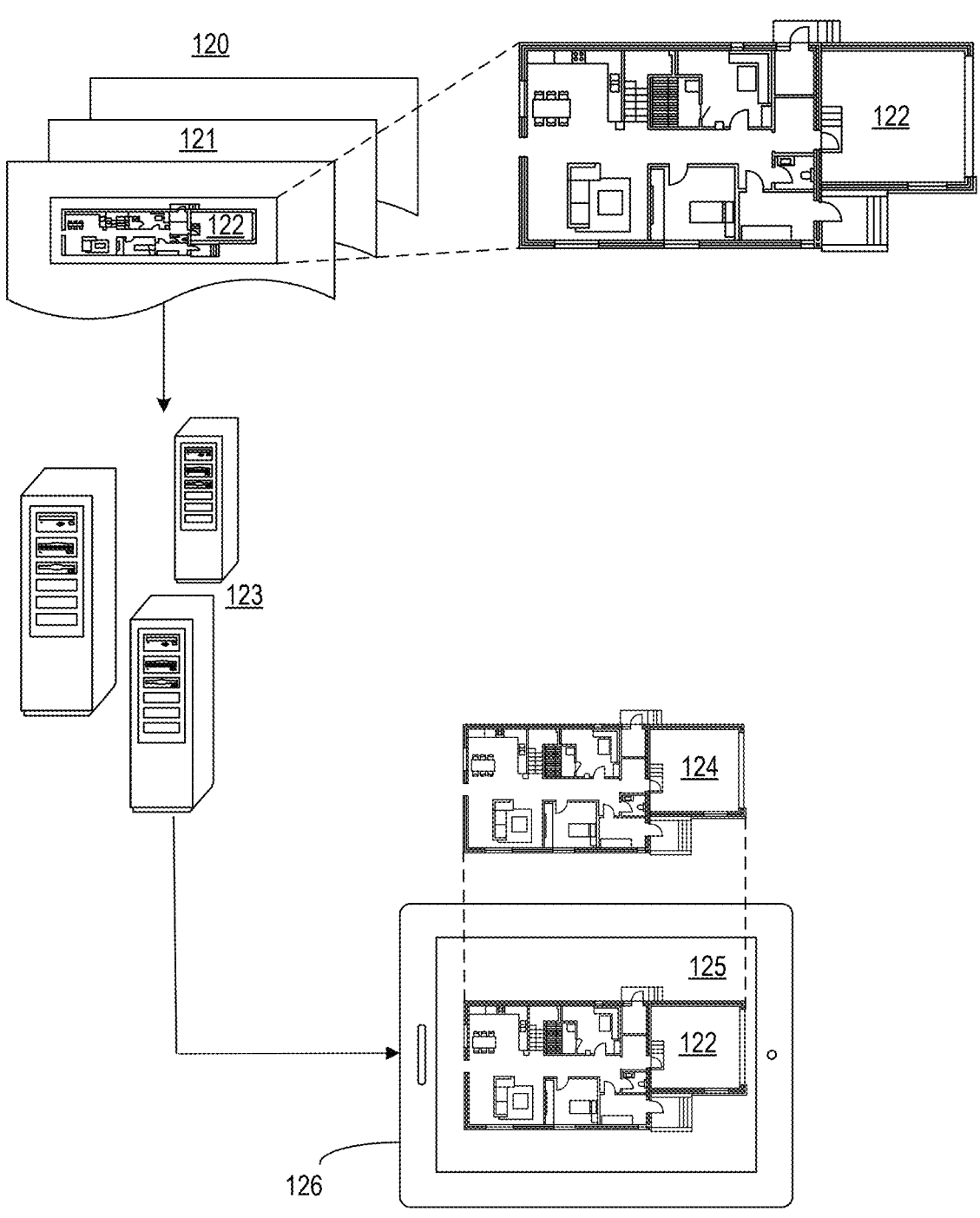
FIG. 1B illustrates a high-level diagram of components included in a system that uses AI to generate an interactive user interface.

Referring now to FIG. 1B, a high-level diagram illustrates components included in a system 120 that uses AI to generate an interactive and collaborative user interface 125 and programmable apparatus (controller) 123 operative to execute method steps useful in one or both of: adding annotations to design elements within a static representation of a design plan, and managing alterations to these design elements while automatically adjusting the associated annotations and rules in real-time. This process may involve identifying design elements that may benefit from additional information or clarification, prompting users to add relevant annotations. Furthermore, when design elements are moved or altered, the AI engine facilitates that all related annotations are dynamically updated, altered or kept intact to reflect these changes, maintaining the accuracy, association, and relevance of the annotations. Simultaneously, the system may enforce automated, predefined, or user-defined rules regarding who can make alterations to those design elements and/or associated annotations, based on user roles and permissions, thereby preserving the integrity of the design plan, and facilitating a collaborative yet controlled design environment.

According to some embodiments of the present invention, a two-dimensional reference 121, such as a design plan, floor plan, blueprint, or other document includes a pictorial representation 122 of at least a portion of a building. The pictorial representation 122 may include, for example, a portable document format (PDF) document, jpeg, PNG, other important non-dynamic file format, or a hardcopy document. The pictorial representation 122 includes an image descriptive of architectural aspects of the building, such as, by way of non-limiting example, one or more of: walls, doors, doorways, hallways, rooms, residential units, office units, bathrooms, stairs, stairwells, windows, fixtures, real estate accouterments, and the like.

The two-dimensional reference 121 may be electronically provided to a controller 123 running an AI engine and a GAN engine. The controller 123 may include, for example, one or more of: a cloud server, an onsite server, a network server, or other computing device, capable of running executable software and thereby activating the AI engine. Presentation of the two-dimensional reference may include, for example, scanning a hardcopy version of the two-dimensional document into electronic format and transmitting the electronic format to the controller 123 running the AI engine.

According to the present invention, the AI engine may use raw data, manipulated data, interpreted data, new data and data types generated from existing data. Data may include one or more of: text, image, numerical, pixel patterns, polygons, vectors, molecular, neural, digital, and analog data modalities.

Data sources may include, one or more of: a user portal; Internet accessible resources; shipping data, fuel use tracking; manufacturer data; product data sheet; geolocation device, or other receptacle or generator of data related to material used in a building or other construction project.

AI engine processing may include one more of: converting image data to pixel patterns and/or polygon patterns, manipulating pixel patterns and/or polygon patterns, analyzing pixel patterns and/or polygon patterns, optical character recognition, alphanumeric analysis, symbol recognition and the like. Proposed action strategies, protocols and opportunities may be associated with an ascertained state.

The present invention provides for the deployment of computational frameworks combining disparate aspects of technology to perform tasks that are beyond the ability of traditional design and build systems or human intelligence. These systems aggregate large volumes of disparate data that may or may not be intuitively linked to building design, carbon footprint, eco-friendliness, compliance codes, supply chain availability, anticipated ambient climate conditions, measured ambient climate conditions, building activities, or other data source, and utilize multiple modalities data manipulation, algorithms, and statistical models to generate proposed action strategies for a patient (or group of similarly situated patients). Modalities of data manipulation may include, but are not limited to:

Machine Learning (ML): A subset of AI where systems learn from data. Instead of being explicitly programmed, they adjust their operations to optimize for a certain outcome based on the input they receive.

Deep Learning: A subfield of ML using neural networks with many layers (hence "deep") to analyze various factors of data, such as, for example, convolutional neural networks (CNNs) used in image recognition. For example, convolutional neural networks may receive as input image data from scans of various types and generate pixel patterns representative of the scans. The pixel patterns may be compared to a library of other pixel patterns and/or manipulated to emulate progression of a disease state and/or a treatment protocol over time.

Natural Language Processing (NLP): Allows systems to understand, interpret, and generate human language. NLP may provide interpretations of voice data. Voice data may be made accessible, for example, via recording made during design plan review and assessment and/or during supply chain activities.

Robotics: Robots may operate using AI principles, enabling the robots to perform tasks in accurate, specific, and consistent ways. Robots may also be utilized during data collection, such as during building scans (e.g., 3D image acquisition scans), as built measurement acquisition, infrared heat image acquisition and the like.

Knowledge Representation: The methods and apparatus taught herein may receive data in a native or enhanced state and manipulate and transform the received data into a machine learning understandable form.

Reasoning: The methods and apparatus taught herein may solve deploy logical deduction via expert systems and the like to facilitate decision-making.

Perception: The methods and apparatus taught herein may use algorithms and complex relational processes that allow machines to interpret disparate data sets, including image data, sound data, and alphanumeric data.

Apparatus and methods may be arranged to form one or more of: Neural Networks; Genetic Algorithms; Expert Systems; and Reinforcement Learning.

In some embodiments, GPUs may be used to accomplish large-scale machine-learning models using parallel processing capabilities. Hardware accelerators may be utilized for deep learning tasks. In some embodiments, tensor processing units and/or neuromorphic computing mechanisms may be used to analyze data sets. Cloud platforms may be used with AI processes, such as deep learning that require significant computational resources.

Electronic and/or electromechanical apparatus may provide data to be processed using the methods and apparatus presented herein. Apparatus may include, by way of a non-limiting example, one or more of: three-dimensional (3D) image scans, heat imaging acquisition, design plan scanners, building monitoring electronic sensors, drone-based electronic scans, satellite-based data acquisition or other means of acquiring data that may be transformed into digital and/or analog data sets.

Some AI Engine generated treatment strategies may include suggested courses of action that may be weighted based upon one or more of: projected effectiveness; timing, geographic location, and a material's ability to be transported; cost; and project criticality, including timeline relative to other actions and/or tasks that must be completed, such as for example, a sequence of construction steps, inspections, and financing requirements.

The controller is operative to generate a collaborative user interface 125 on a user computing device 126. The user computing device may include a smart device, workstation, tablet, laptop or other user equipment with a processor, storage, and display.

The user interface 125 includes a reproduction of the pictorial representation 122 and an overlay 124 with one or more user-manipulatable components, such as, by way of non-limiting examples: boundaries, line segments, polygons, images, icons, points, and the like. The line segments may have calculated lengths that may be mathematically manipulated and/or summarized. Aspects such as polygons, line segments, shapes, icons, and points may be counted, added, subtracted, extrapolated, and have other functions performed on them.

In addition, renditions of the user interface 125 may be created and saved, and/or communicated to other users, or controllers, compared to subsequent interface renditions, archived and/or submitted to additional AI analysis.

In some embodiments, a first user interface 125 rendition may be modified by a user to create a second user interface 125 and submitted to AI analysis to perform tasks, including assisting users in adding better annotations to a selected design element. This assistance is based on the AI's analysis of the selected design element and a historical review of similar annotations associated with such design elements. The AI engine continuously learns from the ways users add annotations to different types of design elements, enabling it to suggest the most relevant and useful annotations for any given element. This learning process allows the AI engine to provide tailored suggestions that improve over time, reflecting the collective experience and insights of the user community on the collaborative platform of the present invention. By leveraging past annotation patterns, the AI facilitates a more intuitive and efficient annotation process, enhancing the collaborative design effort.

In the context of the present invention, design elements may also refer to the various components that contribute to the overall layout, functionality, and aesthetic appeal of a building or space. These elements include, but are not limited to, rooms, walls, doors, windows, staircases, partitions, fixtures, furniture, and finishes. Rooms may be designated for specific functions, such as living rooms, bedrooms, kitchens, or bathrooms, with their size and shape tailored to the intended use. Walls define the boundaries of spaces and may serve structural, aesthetic, or privacy functions, while partitions provide flexible divisions within open areas. Doors and windows are important for access, ventilation, natural light, and aesthetics, with their placement affecting the flow and usability of a space. Fixtures, such as sinks, toilets, lighting, and built-in cabinetry, are important for the functionality of spaces like bathrooms and kitchens. Furniture placement, including beds, desks, sofas, and dining tables, defines how a space will be used, enhancing comfort and practicality. Additionally, design elements may include aesthetic features such as color schemes, textures, flooring materials, and decorative finishes, which contribute to the visual and tactile experience within a space. These elements are also configured to comply with spatial and functional requirements, user preferences, and environmental factors such as lighting, acoustics, and air circulation, all of which are considered in the design plan generated by the system.

Figure 1C:
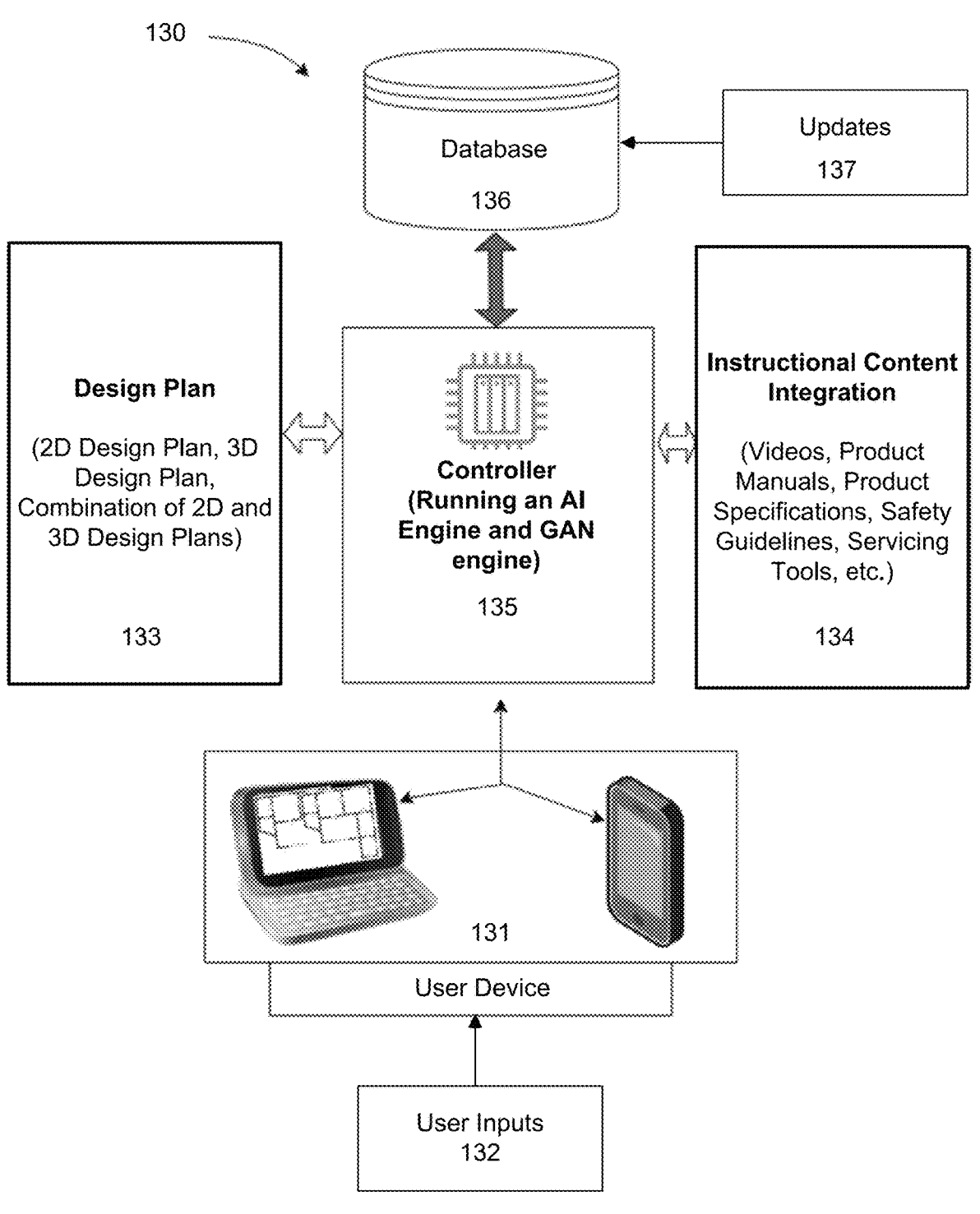
FIG. 1C illustrates an exemplary system for processing design plans and dynamically associating instructional content into the design plans, in accordance with some embodiments of the present invention.

Referring now to FIG. 1C, an exemplary system 130 is illustrated for processing design plans 133 and dynamically associating instructional content 134 into the design plans 133. As illustrated, design plans 133 may be received into user devices 131, which may include a variety of hardware configurations capable of processing, displaying, and interacting with digital content. Examples of user devices 131 may include, but are not limited to, smartphones, tablets, laptops, desktop computers, wearable computing devices such as head-mounted displays (HMDs), augmented reality (AR) headsets, virtual reality (VR) systems, ruggedized field tablets designed for construction sites, or other specialized hardware used by construction and maintenance professionals.

In some embodiments, the user device 131 may comprise a controller 135, which may operate one or both of an AI engine and a GAN engine. The AI engine may be configured to analyze design plans 133, recognize design elements, predict missing features, associate contextual instructional content 134, and generate user-interactive outputs based on a trained model derived from historical and real-time data. The AI engine may be based on one or more deep learning architectures, including convolutional neural networks (CNNs) for image pattern recognition or recurrent neural networks (RNNs) for sequential analysis of architectural schematics.

In some embodiments, the GAN engine included within the controller 135 may be configured to generate synthetic representations of design elements, infer missing construction details, or produce alternative instructional variations for different installation or maintenance procedures. The GAN engine may be trained on a dataset of previously completed construction projects and may be operable to generate highly realistic floor plan suggestions, component placement alternatives, or synthetic videos demonstrating repair methods, thereby enriching the pool of instructional content 134.

The user device 131 may also comprise a display screen, which may be operable to generate an interactive user interface through which the user interacts with the design plans 133 and the associated instructional content 134. The display may support touch input, stylus input, or virtual gesture-based interaction, particularly when integrated into AR/VR devices. In some embodiments, the display may be a transparent or semi-transparent visor in wearable AR glasses allowing users to view both the physical world and the superimposed design plan simultaneously.

Furthermore, the user device 131 may include one or more communication modules enabling connectivity to external databases, cloud servers, or other devices. Communication modules may include, but are not limited to, Wi-Fi transceivers, cellular network modules (4G, 5G), Bluetooth communication systems, near-field communication (NFC) units, and satellite communication interfaces for remote construction sites. Through such communication capabilities, the user device 131 may transmit design plan updates, receive real-time content synchronization, or enable live collaboration between users.

In some embodiments, the user device 131 may further include onboard data storage for caching design plans 133, associated instructional content 134, user preferences, and interaction history. In addition, user devices 131 may include location modules, such as GPS or indoor positioning systems, allowing the system to track user position within a construction site and deliver location-specific instructional materials.

A user, such as a contractor, subcontractor, engineer, architect, building owner, facility manager, or service personnel, may interact with the design plans 133 through user inputs 132. The user inputs 132 may encompass a wide range of input modalities including, but not limited to, touch-based selection of components on a design plan, verbal commands interpreted by a voice recognition module, gesture-based selections using AR/VR interfaces, stylus-based annotations, mouse clicks, keyboard entries, and QR/NFC-based scans that identify physical components linked to the design plan.

In some embodiments, the user inputs 132 may allow users to select specific areas within the design plan 133 for further analysis, request associated instructional content 134, submit feedback on content accuracy, suggest updates, or trigger generation of new AI recommendations through the controller 135. For example, a technician may click on a HVAC unit symbol on the design plan and request immediate access to maintenance videos stored within database 136.

Upon receiving the design plan 133, the controller 135 may process the design plan 133 to identify design elements marked on the design plan 133. Design elements may include a wide variety of architectural, mechanical, electrical, and plumbing components, including walls, doors, windows, structural beams, columns, spaces such as rooms or open areas, fixtures like sinks, toilets, light fittings, HVAC ducting, thermostats, fire suppression systems, and appliances such as stoves, refrigerators, and dishwashers.

In some embodiments, the controller 135 may identify design elements based on explicit markings, symbols, annotations, or labels embedded in the design plans 133. Architectural drawings, for example, often use standard notations or CAD/BIM symbols for identifying walls (solid lines), windows (double lines with breaks), plumbing fixtures (standardized icons), and appliances (simplified pictograms). The controller 135 may analyze these markings using computer vision models to classify and extract corresponding design elements.

In alternative embodiments, where the design plan 133 lacks sufficient labeling, the controller 135 may refer to a database 136 storing identifying characteristics, features, or symbols associated with known design elements. By comparing observed patterns or shapes in the design plan 133 with stored reference templates, the controller 135 may infer the presence of components even in legacy or partially annotated floor plans.

The database 136 may be configured to store extensive catalogs of design element identifiers, CAD symbols, BIM metadata, and machine-learning-generated profiles of building components. In addition, the database 136 may maintain links between identified components and available instructional content 134, enabling automated or user-triggered association during user interactions.

Instructional content 134 associated with design elements may include a wide spectrum of information types designed to aid in installation, maintenance, repair, or removal of components. Examples of instructional content 134 may include but are not limited to: step-by-step installation videos for kitchen cabinetry, repair videos for malfunctioning HVAC units, written product manuals for smart thermostats, electrical wiring diagrams for light fixtures, concrete mixture specifications for slab casting, troubleshooting guides for plumbing leaks, or service bulletins for appliance recalls.

In some embodiments, instructional content 134 may be categorized by content type, difficulty level, applicable model year, manufacturer-specific procedures, safety compliance checklists, tool requirements, estimated time to complete, and skill level required. This categorization may assist the controller 135 or the user device 131 in presenting filtered, context-appropriate guidance to the end user during their interaction with the design plan 133.

In further embodiments, instructional content 134 may be dynamically tailored to user profiles, such that novice users receive more detailed guidance, while expert users may be presented with condensed checklists or rapid diagnostic pathways. Adaptive instructional delivery may increase efficiency and user satisfaction across varying experience levels among construction or service personnel.

The database 136, as depicted in FIG. 1C, may also be configured to receive updates 137 on a periodic or event-driven basis. Updates 137 may include new architectural symbols, updated installation methods for evolving product lines, safety regulation amendments, manufacturer service bulletins, or newly created multimedia content such as 3D repair simulations or AR-enabled walkthroughs.

In some embodiments, updates 137 may originate from a centralized content management server managed by the building owner, construction manager, or product manufacturers. Updates 137 may also be crowd-sourced from verified users contributing field videos, annotations, or best-practice modifications, which may be curated and validated before integration into the database 136.

The dynamic updating of the database 136 allows the system 130 to remain current with evolving building standards, construction techniques, product developments, and service practices. This updating capability improves the accuracy and relevance of instructional content 134 accessible through design plans 133 across project timelines spanning design, construction, commissioning, and operational phases.

In one embodiment, the controller 135 may automatically synchronize updates 137 during system idle times, minimizing user disruption. Alternatively, updates 137 may be selectively retrieved based on detected changes in a building's operational profile, such as the installation of new equipment or retrofitting of existing structures.

Instructional content 134 examples may include video tutorials demonstrating kitchen island installations, annotated visual guides for electric car charger wiring, procedural manuals for installing solar panels on rooftops, software-based HVAC balancing walkthroughs, or even safety protocols for handling hazardous materials within mechanical rooms.

In yet another example, instructional content 134 may include maintenance schedules for fire suppression sprinklers, cleaning procedures for commercial kitchen exhaust systems, replacement protocols for worn water heater elements, or recalibration instructions for smart lighting systems integrated into commercial properties.

In further embodiments, instructional content 134 may include links to downloadable forms for regulatory compliance, certifications of successful installation (e.g., UL, Energy Star), warranty registration portals, or integrated toolkits for fault diagnosis through mobile apps linked to the user device 131.

The user device 131 may additionally include capabilities for local caching of instructional content 134 for offline access. This feature may particularly be useful at remote job sites where internet connectivity is intermittent or non-existent, allowing uninterrupted access to mission-critical guidance materials.

In some embodiments, the system 130 may support real-time remote assistance, whereby a user interacting with a design plan 133 through their user device 131 may initiate a live consultation with an expert technician, who may access the same design plan, view user context, and deliver targeted guidance.

Figure 1D:
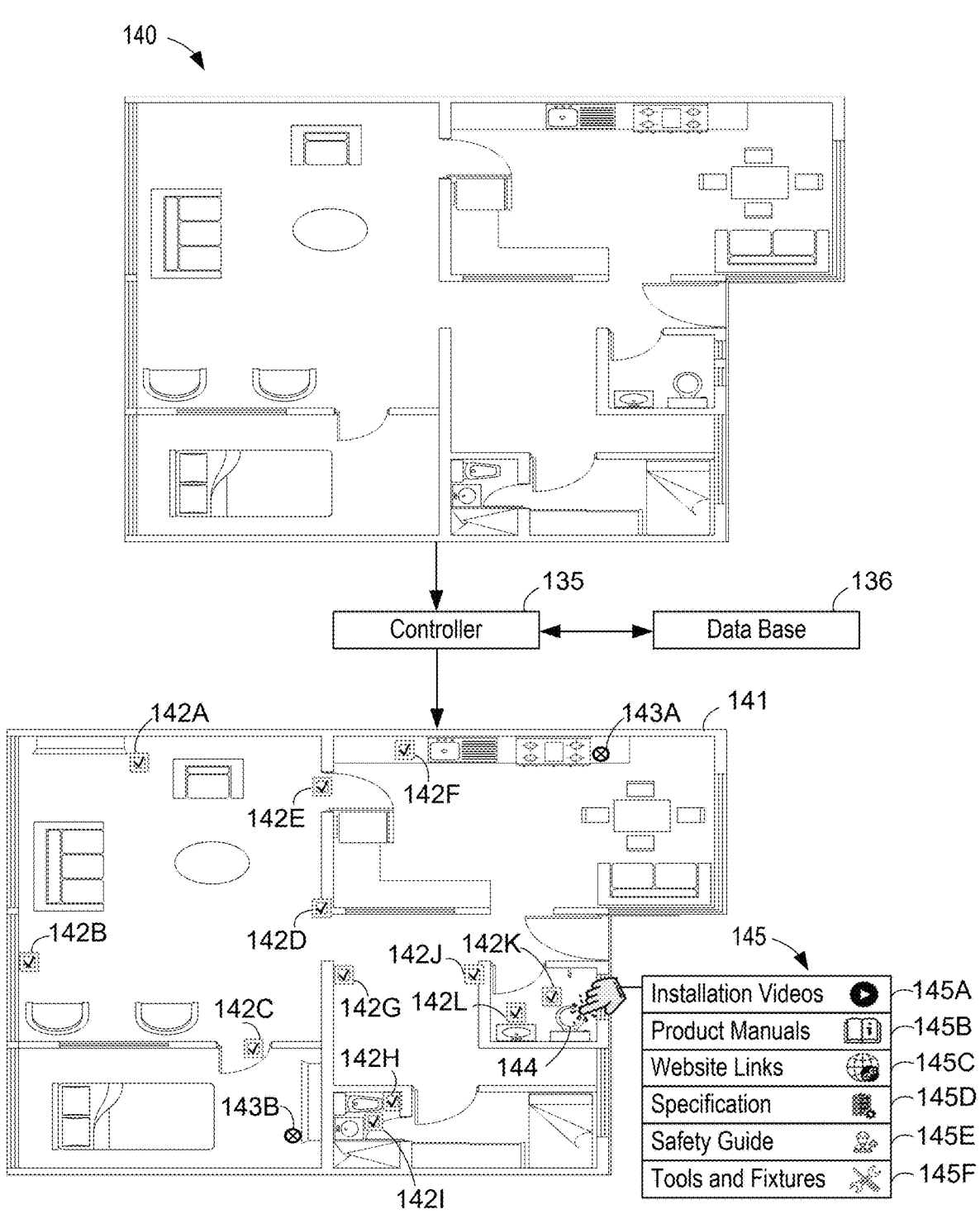
FIG. 1D illustrates an exemplary representation of a design plan displaying multiple design elements with associated instructional content and a process for accessing the associated instructional content.

Referring now to FIG. 1D, an exemplary representation of a design plan 140 is illustrated, displaying multiple design elements with associated instructional content and a process for accessing the associated instructional content. As shown, the design plan 140 may be initially received into a controller 135, which is configured to analyze and process the design plan 140 for the identification and association of design elements with corresponding instructional materials.

The design plan 140, in one embodiment, may depict various structural and functional elements of a portion of a building, including spaces and fixed installations. The design elements illustrated on the design plan 140 may include spaces such as kitchens, bathrooms, bedrooms, dining areas, living rooms, utility rooms, storage spaces, and corridors, among others. Each space may be graphically distinguished by walls, partitions, or room demarcations.

In addition to spaces, the design plan 140 may also depict furniture elements such as sofas, chairs, beds, dining tables, coffee tables, and wardrobes. These elements may be represented using standardized architectural symbols or graphical icons familiar to industry practices. The furniture elements serve not only an illustrative purpose but may also be associated with specific instructional content related to their assembly, disassembly, maintenance, or cleaning procedures.

Further, the design plan 140 may display fixtures including sinks, water closets, showers, bathtubs, ceiling lights, wall sconces, built-in cabinetry, and various plumbing and electrical fixtures. Fixtures may be critical elements for maintenance, and their association with instructional content is particularly valuable in guiding users during installation or servicing operations.

Moreover, appliances such as air conditioners, refrigerators, dishwashers, ovens, washing machines, and dryers may also be indicated on the design plan 140. These appliances, often requiring specialized installation or maintenance procedures, are natural candidates for linkage with detailed instructional content.

Upon receiving the design plan 140, the controller 135 is configured to process and identify the design elements contained therein. In one embodiment, the identification may involve analyzing graphical symbols, annotations, legends, or metadata embedded within the digital design plan 140. The controller 135 may utilize an internal AI engine to enhance pattern recognition capabilities, allowing for more accurate classification of design elements.

The identification process may also involve referring to a database 136, which stores known design element templates, graphical representations, and associated metadata. The database 136 may reside locally on a user device 131, such as a tablet or AR headset, or may be accessed remotely via cloud servers to leverage larger data pools and updated information repositories.

In some embodiments, the controller 135 may employ a two-stage recognition process, wherein initial symbol recognition is supplemented by spatial reasoning. For example, a small rectangular symbol positioned against a wall in a space labelled "bathroom" may be inferred as a sink, based on contextual correlations stored in the database 136.

After determining the design elements from the design plan 140, the controller 135 may proceed to search the same database 136, or alternatively, a separate instructional content database, to retrieve corresponding instructional content. The instructional content database may be structured with indexed associations between recognized design elements and relevant multimedia materials.

The instructional content retrieved for the identified design elements may encompass a variety of formats, including but not limited to, textual installation guides, step-by-step photographic tutorials, 3D animation sequences, interactive AR overlays, video demonstrations, troubleshooting manuals, safety checklists, and manufacturer-provided technical specifications.

In one embodiment, the instructional content may provide detailed guidance on how to install a newly delivered appliance, such as securing a wall-mounted air conditioning unit, including requirements for supporting brackets, electrical wiring, refrigerant handling, and compliance with building codes.

In another embodiment, the instructional content may offer repair instructions for a malfunctioning fixture, such as replacing a cracked sink basin, sealing joints, or resetting a thermostatic valve on a shower system. Maintenance tasks such as periodic cleaning of appliance filters or lubrication of mechanical hinges may also be covered.

Furthermore, the instructional content may not only cover individual components but may also provide guidance on creating or transforming spaces. For example, the instructional material may include step-by-step processes on how to construct a kitchen area from an open-plan room, involving the installation of cabinets, plumbing, electrical outlets, countertops, and ventilation systems.

Similarly, the content may detail how to convert a spare room into a functional office or a bedroom, including recommendations for partitioning, furnishing, lighting, and ergonomic considerations. These content sets enhance the usability of the system beyond mere component maintenance into broader spatial planning and repurposing activities.

Upon successful identification of design elements and retrieval of corresponding instructional content, the controller 135 is operative to generate an updated design plan 141. The updated design plan 141 may visually integrate instructional access points corresponding to recognized design elements.

The updated design plan 141 may incorporate one or more first indications 142A-142L, each representing the presence of associated instructional content. These first indications may be visually represented through icons, colored markers, clickable hotspots, or AR projections visible to the user through their device 131.

For example, the indication 142A may represent an installation video associated with a water closet 144. The content indication 142B may represent a product manual for a built-in oven, while 142C may correspond to a website link, hosting regulatory compliance guidelines for electrical appliance installations.

In some embodiments, first indications 142D-142L may further be classified into categories based on the type of instructional content they represent. Different visual symbols may be used to differentiate between video tutorials, technical documentation, product specifications, safety guidelines, and recommended tool lists.

In situations where corresponding instructional content is not available for certain design elements, the updated design plan 141 may include second indications 143A-143B. These second indications may signal to the user that no verified instructional content currently exists for the respective components.

In some embodiments, the absence of content signalled by second indications 143A-143B may prompt the controller 135 to attempt an AI-generated content solution. Such AI-generated instructional content may be synthesized based on analogies to similar components, inferred maintenance procedures, or synthetic generation using generative adversarial networks (GANs) trained on similar tasks.

For example, if no official installation manual is available for a specific model of a newly designed ceiling fan, the AI engine of controller 135 may generate a probable installation sequence based on known fan installation principles combined with dimensional data extracted from the design plan 140.

The process of accessing instructional content by a user may involve interacting directly with the first indications 142A-142L. In one embodiment, a user may click or tap on an icon associated with a specific appliance or fixture to open a pop-up window or side panel displaying the linked instructional material 145.

Alternatively, in AR-based embodiments, users may point their AR devices at a physical location corresponding to the design element, triggering a holographic overlay displaying video instructions, animations, or text guidance aligned spatially with the real-world component.

Referring specifically to the instructional content types 145A-145F, instructional video 145A may include a step-by-step walkthrough for installing a double-basin kitchen sink, complete with real-time video footage and augmented callouts identifying tools and fasteners required.

Product manual 145B may consist of a detailed downloadable PDF outlining specifications, operating instructions, and safety warnings for a smart refrigerator model recognized on the design plan 141.

Website link 145C may redirect users to an online product support page containing software updates, warranty information, or customer support resources for a recognized appliance or system.

Specification document 145D may include engineering drawings, load calculations, material certifications, or dimensional tolerances required for properly installing or modifying a recognized design element.

Safety guide 145E may present hazard identification, personal protective equipment (PPE) recommendations, and emergency response protocols pertinent to the handling, installation, or maintenance of a component such as a gas stove or a high-voltage electrical panel.

Tools and fixtures list 145F may include a checklist of specialized or recommended tools needed for executing a given repair, installation, or maintenance task, along with supplier links or alternative tool suggestions based on user profile settings or inventory.

In embodiments utilizing AI-generated content for second indications 143A-143B, the system may additionally flag the instructional material as "AI Suggested," allowing users to exercise discretion in following such guidance, while offering options to validate or annotate corrections during execution.

The flexibility in accessing and interacting with the instructional content integrated into the design plan 141 enables contractors, facility managers, service personnel, and homeowners alike to benefit from immediate, context-aware, and actionable guidance without departing from the design visualization environment.

By way of non-limiting examples, according to the present invention, a design plan may be received as a static image two-dimensional reference. The design plan may be described using lines and arcs, and represent architectural layouts in a simplified geometrical way. In such a representation, architectural elements, such as, by way of non-limiting examples: walls, doors, windows, and architectural details, may be shown using straight lines (for linear elements) and arcs (for curved elements). A floorplan interpreted in terms of lines and arcs and/or patterns of pixels may include one or more of:

Exterior Walls: typically represented by thick lines. The thickness of a line may indicate the wall's thickness.

Interior Walls: which may be shown as slightly thinner lines compared to exterior walls, representing partitions or dividers within a space or other interior area.

Hinged Doors: a straight line representing a door's location and an arc showing the door's swing direction and extent.

Sliding Doors: two parallel lines (representing door panels) may include an arrow or dashed line indicating a sliding direction.

Double Doors: two straight lines representing door panels with arcs indicating each door's swing direction.

Which may, for example, be represented as thin lines or breaks in walls, sometimes with a zigzag line to indicate a window's presence or with a double line, indicating a double-pane window.

Straight Stairs: a series of parallel lines showing steps. Often, an arrow may be used to indicate the upward direction.

Spiral Stairs: may be represented using concentric arcs or circles, showing the curvature of the stairwell.

Cabinets, Countertops, Islands: straight lines and arcs may represent a shape and placement of cabinets, countertops, and islands.

Sinks, bathtubs: may typically be represented using a combination of lines and arcs to depict their shapes.

Rounded Corners: instead of sharp, angular intersections between walls, arcs are used to show the curve.

Circular Rooms or Features: may be represented using full circles or arcs.

Electrical: may be shown with dotted lines or specific symbols indicating outlets, switches, and fixtures.

Plumbing: may be represented via dotted or dashed lines to represent hidden plumbing within walls or under floors.

When interpreting or representing a floorplan using lines and ares, conventions used in architectural drawings may be referenced. In some embodiments, a legend or key that describes what each line, arc, or symbol means, may facilitate clarity in understanding the design.

Figure 1E:
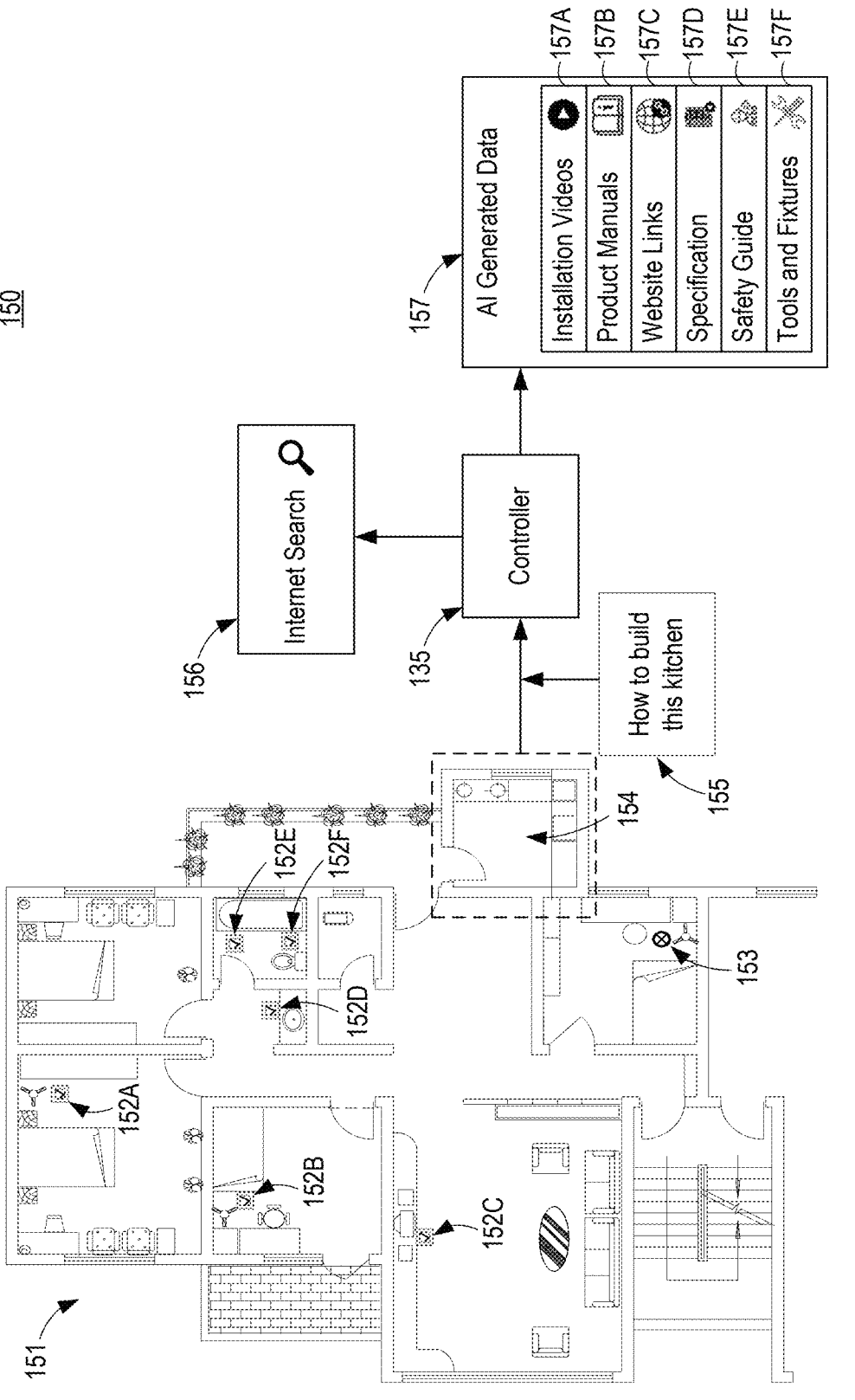
FIG. 1E illustrates an exemplary system and method for interacting with a design plan and generating AI-generated instructional content, in accordance with some embodiments of the present invention.

Referring now to FIG. 1E, an exemplary system 150 and method is illustrated for interacting with a design plan 151 and generating AI-generated instructional content 157, in accordance with some embodiments of the present invention. The design plan 151 may represent a floor plan or layout plan of at least a portion of a building and may depict various spaces, fixtures, and appliances represented through architectural symbols or annotated drawings.

The design plan 151 may include one or more first indications 152A-152F representing design elements for which associated instructional content has already been identified and linked. These first indications 152A-152F may correspond to specific components such as toilets, sinks, bathtubs, kitchen appliances, HVAC units, or lighting fixtures within the building plan, and their corresponding instructional content may be retrievable by interacting with the indications.

Additionally, the design plan 151 may include one or more second indications 153 representing design elements for which instructional content is currently unavailable. The second indications 153 may serve as markers highlighting those elements where gaps in available instructional resources exist, such as missing installation instructions, incomplete repair guides, or absent safety documentation.

The controller 135 is operative to analyze the design elements associated with second indications 153 and to search for relevant instructional content by accessing external resources, including the open internet 156. The controller 135 may initiate searches using keywords extracted from the design plan 151 metadata, recognized symbols, or inferred component types based on spatial relationships and context.

In some embodiments, the controller 135 may search the internet 156 for a variety of content types, including, but not limited to, DIY videos, written assembly guides, downloadable product manuals, technical specifications, building code guidelines, or manufacturer service bulletins. Search algorithms employed by the controller 135 may leverage natural language processing (NLP) to construct intelligent queries tailored to the component type and installation environment.

For example, if a second indication 153 corresponds to a newly modeled kitchen sink without pre-associated content, the controller 135 may search the internet 156 for "kitchen sink installation guide," "standard plumbing for kitchen sinks," or "kitchen sink fitting safety procedures," and retrieve publicly available documents or videos.

The content retrieved by the controller 135 from the open internet 156 may then undergo validation, formatting, and contextual adaptation to be associated meaningfully with the corresponding second indications 153 on the design plan 151. In some embodiments, retrieved content may be supplemented with metadata such as source credibility, last update timestamp, or user ratings to allow prioritization.

The controller 135 may also be configured to modify or transform the retrieved content into a standardized instructional format compatible with the user interface of the design plan 151. This transformation may involve extracting step-by-step instructions from lengthy text, editing video clips to focus on relevant sequences, or summarizing technical documents into simplified procedures.

In further embodiments, the controller 135 may generate entirely new instructional content 157 based on the retrieved raw data, employing AI techniques such as generative text models, video synthesis, and instructional diagram creation. This AI-generated instructional content 157 may bridge the gap between missing information and user requirements in an automated, scalable manner.

Users interacting with the system 150 may select a portion 154 of the design plan 151 where new instructional content may be needed. The selected portion 154 may encompass an individual component, an entire room, or a group of inter-connected elements requiring coordinated instructions, such as installing all fixtures in a bathroom.

Additionally, a user may provide supplemental user input or prompt 155 associated with the selected portion 154. The user input 155 may include specifications such as preferred installation methods (e.g., wall-mounted vs floor-mounted), material choices, spatial constraints, intended use cases, or performance requirements.

The controller 135, leveraging its processor and AI engine, may analyze the selected portion 154 in conjunction with the user input 155 to generate customized AI-generated instructional content 157 tailored to the specific context of the building project, user preferences, and the selected design elements.

The AI-generated instructional content 157 may encompass several content types including, but not limited to, AI-synthesized videos, dynamically generated manuals, curated website links, procedural specifications, generated safety protocols, and recommendations for tools and fixtures suited for the installation or maintenance task.

In particular, instructional videos 157A may be automatically generated to depict animated sequences of installation steps, showing the placement of a sink, the connection of water lines, sealing techniques, and operational testing procedures. These videos may be rendered based on architectural dimensions extracted from the design plan 151.

Product manuals 157B may be synthesized by compiling best practices extracted from manufacturer documents, publicly available resources, and field technician contributions. The controller 135 may restructure this information into concise, easy-to-follow manuals that focus on the identified design element.

Website links 157C may be generated by the controller 135 pointing users to verified online resources, such as government building codes, certified contractor recommendations, product-specific support pages, or video tutorials hosted on knowledge-sharing platforms.

Specifications 157D generated by the controller 135 may include detailed technical requirements for installing or maintaining the design element, such as torque specifications for fasteners, flow rates for plumbing fixtures, recommended clearances, material strength requirements, and compliance parameters.

Safety guides 157E may be dynamically assembled to address potential hazards associated with the design element. For example, in the context of installing a gas stove, safety guides may include gas leak detection methods, required ventilation standards, fire hazard mitigation practices, and personal protective equipment (PPE) recommendations.

Tools and fixtures lists 157F may be generated to identify the equipment necessary to complete the task effectively. The lists may specify hand tools, power tools, consumables (e.g., fasteners, adhesives), specialized installation aids, and optional fixtures that may improve performance or aesthetics.

In some embodiments, the AI-generated instructional content 157 may include adaptive features wherein content is personalized based on user expertise level, project urgency, local building regulations, or material availability, thereby creating a user-centric instructional experience.

The updated design plan 151 may be dynamically updated with revised first indications replacing second indications 153 as AI-generated instructional content 157 becomes available, thus maintaining a coherent and complete guidance layer across the entire design visualization.

In yet further embodiments, the AI-generated instructional content 157 may be embedded with feedback collection capabilities, allowing users to rate the clarity, relevance, and effectiveness of the AI-generated materials after executing the installation or maintenance task.

The feedback gathered may be used by the controller 135 to continuously improve its AI models, refine future instructional content generation, and adapt the system to evolving construction techniques, component technologies, and user expectations.

Additionally, the system 150 may support exporting AI-generated instructional content 157 into portable formats, enabling users to download task-specific guides onto mobile devices for offline use at construction or renovation sites.

In some examples, users may request printed versions of the AI-generated manuals for compliance documentation, training purposes, or as handover packages during project commissioning phases.

The combination of dynamic user interaction, intelligent internet search integration, AI-driven content generation, and iterative feedback loops positions the system 150 as a robust tool for addressing gaps in instructional materials within building design and maintenance workflows.

Figure 1F:
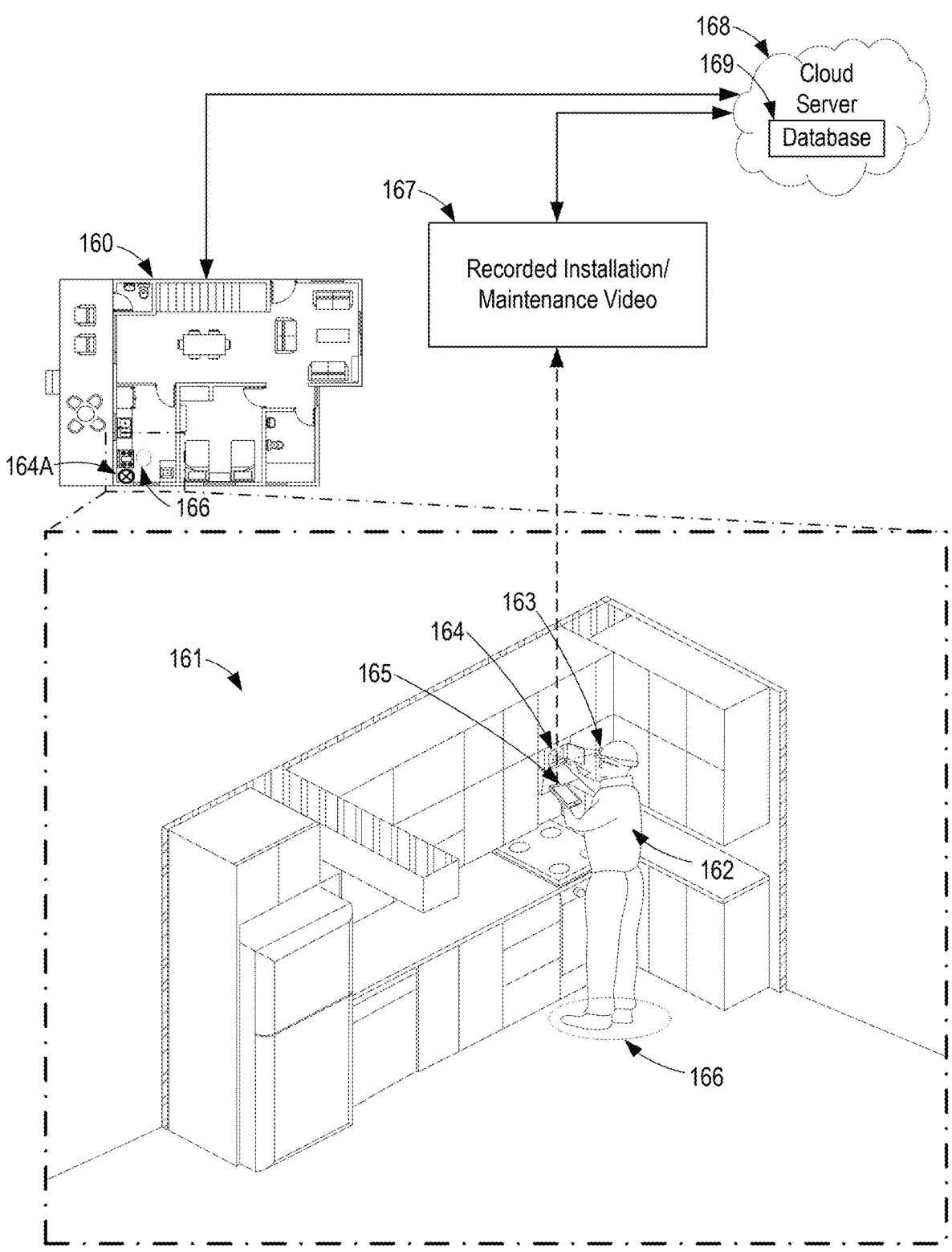
FIG. 1F illustrates an exemplary system for recording, uploading, and associating instructional content for a design element during or after installation and repair of a corresponding physical component of the design element.

Referring now to FIG. 1F, an exemplary system is illustrated for recording, uploading, and associating instructional content for a design element during or after installation and repair of a corresponding physical component of the design element. As illustrated, a digital twin design plan 160 is shown representing the layout and components of a physical building 161.

The building 161, representing the physical counterpart of the digital design plan 160, comprises a plurality of installed components, fixtures, systems, and appliances that support occupancy, utility, and structural functions. Over time, components within the building 161 require periodic servicing, repair interventions, or preventative maintenance activities to retain operability, safety compliance, and user satisfaction.

During a maintenance or service event, service personnel 162 may visit the physical building 161 to execute specific tasks related to diagnosing faults, performing corrective repairs, conducting routine inspections, or upgrading components. These tasks often require contextual awareness of the installed systems and their spatial arrangement within the building 161.

In some embodiments, the service personnel 162 may use a user device 165 to interact with the design plan 160 corresponding to the building 161. The user device 165 may be configured to display the digital twin 160, allow the service personnel 162 to access associated instructional content, and provide interfaces for associating new instructional materials generated during the servicing operation.

The user device 165 may include, but is not limited to, a tablet computer, smartphone, ruggedized handheld field device, AR headset, or a laptop. These devices may incorporate touchscreens, voice command modules, and wireless communication systems to facilitate seamless interaction with the digital twin 160 and external cloud-based resources.

In addition to the user device 165, the service personnel 162 may utilize a head-mounted device or head-mounted camera 163. The head-mounted camera 163 may be affixed to a helmet, safety glasses, or wearable frame, and configured to record live video feeds of the repair, servicing, or installation activities performed by the service personnel 162 within the building 161.

In the exemplary operation illustrated, the service personnel 162 needs to repair a control panel 164 located within the physical building 161. The control panel 164 may control various subsystems such as electrical circuits, HVAC operations, access systems, or building management sensors.

Upon arriving at the site, the service personnel 162 may identify the corresponding design element 164A within the digital twin 160. The design element 164A may represent the control panel 164 through graphical symbols, labels, or embedded metadata within the design plan 160.

The service personnel 162 may mark their current operational position 166 on the design plan 160 to spatially anchor the service activity in relation to the layout of the building 161. The position 166 may represent the precise location within the building 161 where the control panel 164 is physically located and where the repair task is underway.

In some embodiments, the position 166 of the service personnel 162 may be determined manually, wherein the user device 165 or another interface allows the personnel 162 to select their location by tapping or selecting a point on the displayed floor plan 160 corresponding to their actual working position.

Alternatively, in other embodiments, the position 166 of the service personnel 162 may be determined automatically by the user device 165, the head-mounted camera 163, or by integration with positioning systems such as GPS (for outdoor locations), Wi-Fi triangulation, Bluetooth beacons, ultra-wideband (UWB) systems, or inertial navigation sensors embedded in the wearable devices.

For example, Wi-Fi-based triangulation may estimate the personnel's location within the building 161 based on signal strength measurements from multiple Wi-Fi access points installed across the premises. Similarly, Bluetooth beacons installed in various rooms can be used to fine-tune indoor location detection with high accuracy.

Once the position 166 is determined, either manually or automatically, it is reflected on the design plan 160, allowing accurate correlation between the physical service activity and its digital representation. This correlation forms the basis for linking new instructional content to the correct spatial context in the digital twin (160).

During the execution of the repair task, the head-mounted camera 163 may continuously record the actions of the service personnel 162. The recorded feed may capture various details including disassembly of faulty components, application of repair techniques, calibration of devices, verification of functionality, and final assembly after the repair.

The recorded video 167 may serve as a live or post-processed instructional asset demonstrating the actual servicing procedure specific to the building 161, specific control panel 164, and under real-world conditions. Such recordings offer highly valuable procedural documentation, particularly for non-standard installations, retrofits, or field improvisations.

In some embodiments, the recording by the head-mounted camera 163 may be initiated manually by the service personnel 162 through user interfaces on the head-mounted device, voice commands, or automatic triggers based on detection of service activity near a marked design element 164A.

The recorded video 167 may be streamed in real-time to a cloud server 168 over wireless communication channels such as Wi-Fi, 4G/5G networks, or private LTE infrastructure, or alternatively, it may be temporarily stored locally on the user device 165 for later uploading once stable connectivity is available.

Upon reaching the cloud server 168, the recorded video 167 may be cataloged, processed, and stored in an instructional content database 169. The database 169 may maintain metadata linking the recorded video 167 to the design element 164A, the service personnel 162 who performed the task, the time and date of the recording, and other contextual information such as task type, service notes, or replacement parts used.

In some embodiments, the recorded installation or maintenance video 167 may undergo automated or manual post-processing before being made accessible through the design plan 160. Post-processing may include trimming irrelevant segments, blurring sensitive information, annotating important steps, or enhancing audio-visual clarity for training and reference purposes.

The cloud server 168 hosting the instructional content database 169 may support indexing, retrieval, version control, and permissions management for the recorded videos. Access to the videos may be restricted based on user roles, project associations, or security clearance requirements.

Subsequent users interacting with the design plan 160 may access the recorded video 167 linked to the design element 164A by selecting the associated marker, thereby gaining direct visual guidance on servicing or installing the corresponding physical component within the building 161.

In some embodiments, the system may further enable rating, commenting, or tagging features on the recorded videos, allowing users to provide feedback, suggest improvements, or annotate specific steps for clarity or future reference.

The availability of field-recorded instructional content through the digital twin 160 offers substantial advantages in terms of real-world accuracy, adaptability to non-standard situations, reinforcement of best practices, and creation of a living knowledge base specific to a particular building 161.

In further embodiments, the system may support aggregation of multiple recorded videos for a single design element 164A, such that users can view different service scenarios, alternative repair methods, or upgrades performed at different times.

For example, over the lifespan of a control panel 164, different videos may document initial installation, firmware upgrades, major repairs, and eventual replacement, offering a complete historical view of component lifecycle management within the digital twin 160.

The system depicted in FIG. 1F also enables knowledge transfer between different stakeholders across project phases, allowing construction teams, maintenance crews, facility managers, and owners to access consistent, high-quality instructional resources for managing building assets.

In some embodiments, AI algorithms may be employed to analyze the recorded videos 167 and automatically extract key segments, generate step summaries, identify tools used, and create searchable metadata, further enhancing the usability and discoverability of the instructional content.

In yet other embodiments, the system may integrate voice transcription services to capture verbal commentary by the service personnel 162 during the repair, automatically generating accompanying textual documentation or closed captions synchronized with the video timeline.

The real-time association of instructional content with design elements through systems such as that depicted in FIG. 1F transforms the static nature of design plans into dynamic, continuously evolving repositories of operational knowledge.

Such systems support continuous improvement initiatives, regulatory compliance documentation, training of new personnel, and risk mitigation through improved procedural adherence during maintenance and repair activities.

The recorded videos stored in database 169 may also be used for remote diagnostics, wherein a field technician may live stream a current task to a remote expert who can guide actions based on previously recorded procedures for the same or similar components.

Figure 1G:
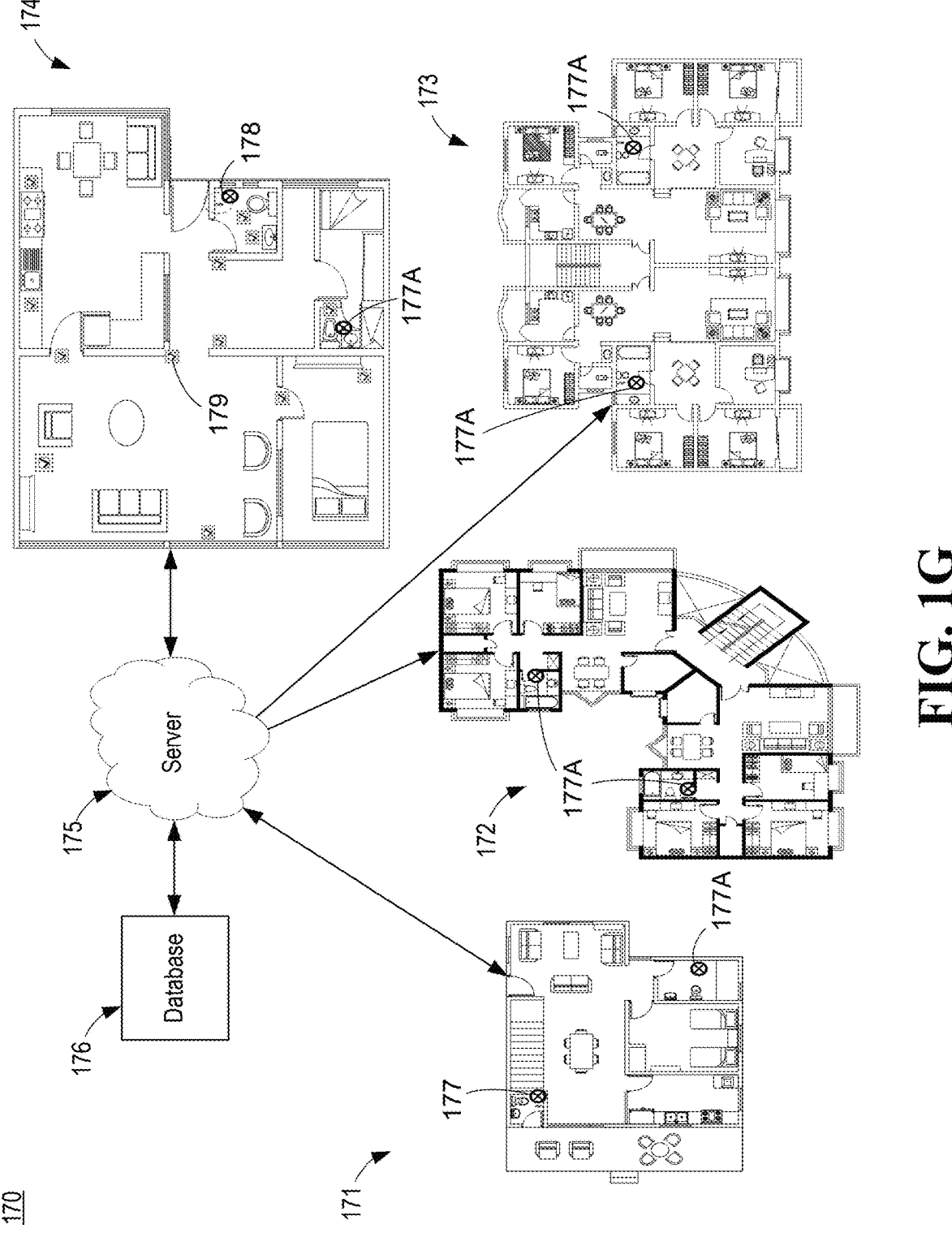
FIGS. 1G-1H illustrate an exemplary centralized system where instructional content added to a design element in a design plan automatically get associated with the same design elements found in other design plans.
Figure 1H:
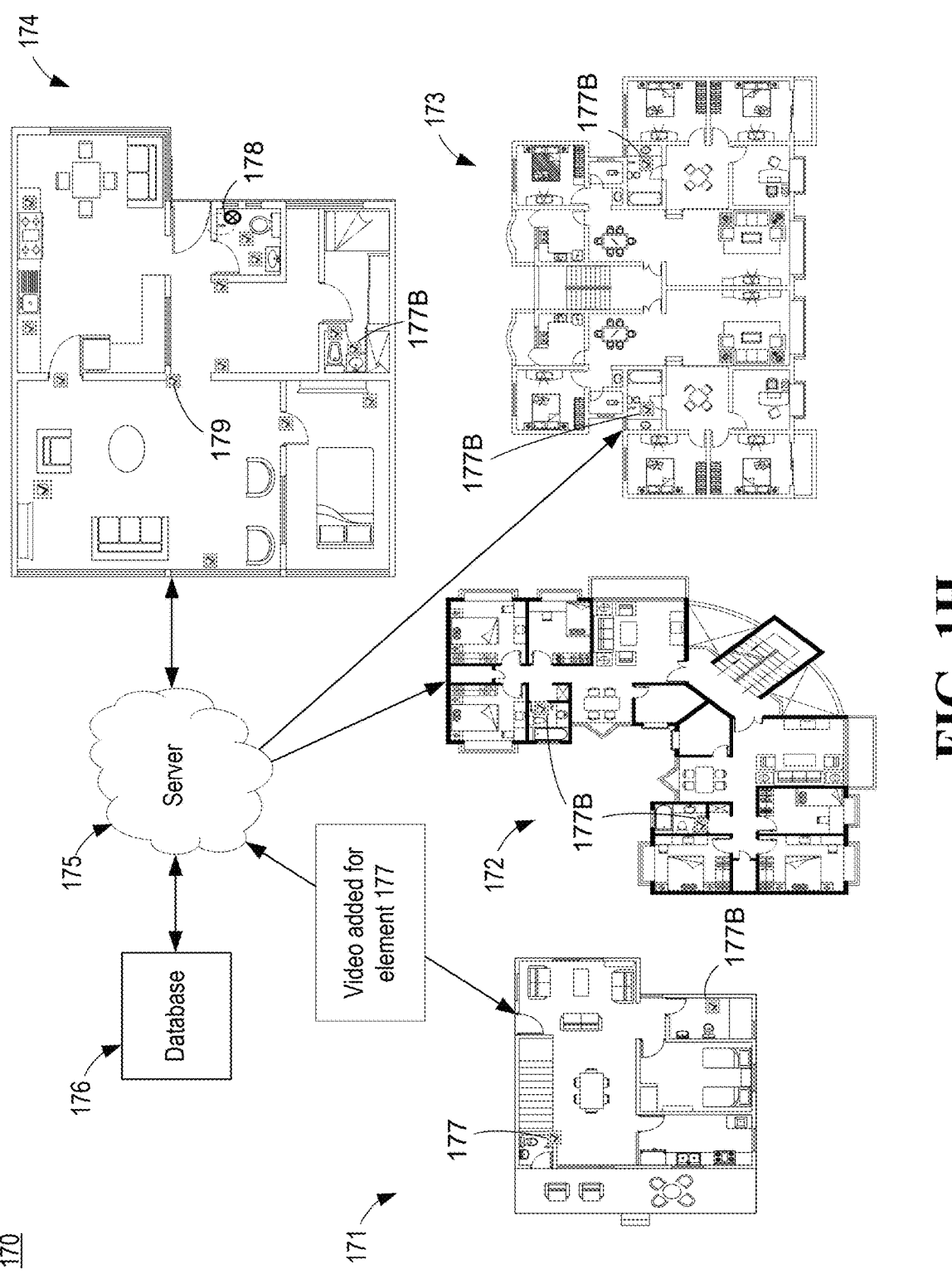

Referring now to FIGS. 1G-1H, an exemplary centralized system 170 is illustrated for associating instructional content across multiple design plans corresponding to different buildings or different portions of the same building. The system 170 offers a centralized approach where a cloud server 175 manages, updates, and synchronizes instructional content across various design plans 171, 172, 173, and 174 stored within the system 170.

The centralized server 175 may be configured to store a large repository of building design plans, each comprising various spaces, fixtures, structural elements, appliances, or systems, such as kitchens, bathrooms, HVAC units, electrical control panels, plumbing assemblies, and smart building devices. Each design plan may exist independently but share common elements across different buildings or sections.

Each of the design plans 171-174 managed by the server 175 may represent distinct physical structures, such as residential homes, commercial offices, apartment complexes, industrial plants, or different wings of a larger campus. Alternatively, design plans 171-174 may depict different levels, units, or sectors of a single high-rise or institutional building.

The database 176 connected to the server 175 stores all design elements, instructional content data, historical updates, user feedback, and metadata necessary for the intelligent management of instructional content associations within the system 170. The database 176 may be distributed, redundant, and backed by secure cloud architectures to enable reliability, scalability, and real-time access.

The design plans 171-174, when initially stored, may contain design elements both with and without associated instructional content. Those design elements for which instructional content has already been identified and linked may be visually indicated using icons or markers, such as content indications 179 depicted in design plan 174.

Content indications 179 represent (first appearance for available content) confirmed instructional content associated with corresponding design elements. Such content may include videos, manuals, specifications, safety protocols, or tool lists specific to the design element being indicated.

Conversely, one or more of the design plans 171-174 may also include design elements that have no instructional content currently associated. These design elements are represented using no-content indications 177 and 177A (second appearance for unavailable content) as shown across design plans 171, 172, and 173 in FIG. 1G.

The no-content indications 177 and 177A represent gaps where instructional materials, guides, or service documentation have yet to be created, found, or associated within the system. Such gaps are important to highlight for continuous improvement and operational readiness of the system 170.

In some embodiments, no-content indications 178 are present within design plan 174, marking those elements which, at the time of the plan's inclusion into the system 170, lacked sufficient instructional content associations necessary for supporting installation, maintenance, or repair operations.

The centralized architecture of system 170 is particularly advantageous because it allows instructional content added to one design plan to be automatically reflected across other design plans containing similar or identical design elements.

As illustrated in FIG. 1H, when instructional content is later created for or associated with a previously unlinked design element (such as a no-content indication 177 in design plan 171), the server 175 detects that the same design element occurs across other design plans 172, 173, and 174.

Upon detecting the occurrence of the same or matching design element across multiple design plans, the server 175 automatically propagates the newly created instructional content across the corresponding elements in the other design plans (172-174). This process provides uniformity, consistency, and completeness of instructional information throughout all affected projects.

Thus, the design plans 171-174 shown in FIG. 1H have been updated with new instructional content indications 177B. The indications 177B represent that the previous no-content elements now have linked instructional content following the content addition event for design element 177 in the design plan 171.

This intelligent, automatic updating prevents redundancy of effort, where instructional content creation for one building separately benefits all similar structures managed within the centralized system 170, without requiring manual intervention or duplication of content linking.

The server 175 performs similarity recognition between design elements by analyzing design element identifiers, component metadata, graphical representations, spatial dimensions, manufacturer specifications, and historical installation templates.

In some embodiments, the server 175 may use AI models trained on architectural drawings to automatically classify and link corresponding components even when symbol usage or graphical representations vary slightly across different design plans. The updating process handled by the server 175 may occur immediately upon addition of new instructional content or may be scheduled during low-usage periods to optimize network bandwidth, depending on system configuration preferences set by administrators.

The instructional content associated with design elements may comprise varied forms, such as standard operating procedures, real-world recorded videos, 3D rendered simulations, maintenance flowcharts, checklist templates, and safety compliance documents. Instructional content may originate from different sources, including original equipment manufacturers (OEMs), field engineers, contractors, system integrators, or generated in-house by AI-based content generation engines based on observed field data.

In some embodiments, the server 175 may maintain version histories for instructional content associated with each design element, allowing users to reference previous iterations, rollback to prior versions, or view evolution histories for compliance auditing.

The content propagation process through the server 175 not only accelerates the documentation enrichment across design plans but also reduces operational risks by providing consistent instructions for similar systems across multiple buildings.

Additionally, by automating the association of newly added instructional content, the centralized system 170 significantly reduces administrative overheads, allowing facility managers, construction supervisors, and maintenance planners to focus on critical activities rather than repetitive data entry tasks. The database 176 may track timestamps, user IDs, edit comments, and approval status for each instructional content addition or update, forming an auditable trail that is particularly valuable in highly regulated industries such as healthcare, aviation, or energy sectors.

In some embodiments, the server 175 may offer permission-based control, wherein only authorized users such as certified engineers, project leads, or compliance officers are permitted to add new instructional content or validate content associations. Moreover, the centralized server 175 may support content prioritization algorithms, where instructional content for life safety systems (e.g., fire alarms, sprinklers) is flagged for faster propagation and highlighted more prominently in updated design plans.

The server 175 may also support localization capabilities, allowing instructional content to be automatically adapted or translated based on the regional settings of a particular building project. For example, installation videos for HVAC systems may include region-specific compliance codes for North America, Europe, or Asia-Pacific.

When content is updated and propagated, users associated with the affected design plans 171-174 may receive notifications or alerts indicating availability of new instructional materials, thereby promoting immediate awareness and usage of the latest information. The centralized system 170 may optionally allow users to subscribe to specific design elements, so that they are notified when instructional content is updated for elements critical to their responsibilities.

In further embodiments, the system 170 may automatically evaluate the quality of instructional content updates using machine learning techniques, analyzing user feedback, interaction rates, and service ticket reductions associated with specific instructional content deployment.

By associating content updates across design plans, the system 170 effectively builds a "living" body of building operational knowledge that evolves over time based on real-world experiences and collaborative contributions. The association and propagation of instructional content across design plans 171-174 may extend beyond initial construction and commissioning phases into the maintenance, renovation, and retrofit phases of a building's lifecycle.

This continuous enrichment of instructional knowledge within the centralized system 170 promotes proactive facility management practices, reduces downtime during maintenance, enhances safety outcomes, and fosters better-informed operational decisions.

The structure of system 170 also facilitates scalable expansion, allowing additional design plans from new building projects to be seamlessly integrated and to benefit from pre-existing instructional content associations established across earlier projects. For example, a property management firm expanding its building portfolio may upload new floorplans into system 170, and those plans would immediately inherit instructional content linked to matching elements, eliminating the need for redundant content creation.

In addition, in enterprise-level deployments, the centralized system 170 may support advanced analytics to identify patterns in instructional content usage, knowledge gaps, and content aging, thereby guiding strategic content development initiatives. In yet another embodiment, predictive algorithms may suggest content updates or recommend preemptive maintenance activities based on frequency of access to instructional content associated with particular design elements across design plans.

In some embodiments, the controller (135) operating the AI engine may reside on one or both of a user device (131) and a cloud server (175). For example, a user device, such as a head-mounted device, tablet, smartphone, laptop, or augmented reality interface, may incorporate an onboard controller comprising a processor configured to execute an AI engine locally, thereby allowing rapid processing of design plan information, identification of design elements, customization of instructional content, and delivery of real-time guidance without dependence on continuous internet connectivity.

In other embodiments, the controller and AI engine may operate on a remote cloud server accessible by multiple user devices over a communication network, wherein heavier computational tasks such as deep learning-based defect detection, AI content generation, large database searches, and dynamic instructional content customization are performed remotely, with processed outputs transmitted to user devices in real time or near real time.

In further embodiments, a hybrid configuration may be implemented, wherein a user device and a cloud server each run portions of the AI engine, and the processing load is dynamically distributed based on factors such as task complexity, user device capabilities, network bandwidth, or operational priority. Such flexible architecture enhances system adaptability across different building environments, service scenarios, and device ecosystems, while providing seamless user experience and consistent delivery of instructional content linked to building design plans.

In some embodiments, a method for dynamically associating and delivering instructional content within a design plan of a building involves receiving, into a controller operating an AI engine, a digital representation of at least a portion of the building. The design plan may comprise graphical depictions of physical building components, such as HVAC units, plumbing fixtures, electrical panels, security systems, or other architectural features. The design plan may be formatted as a BIM file, CAD file, or a scanned or rasterized architectural drawing capable of being processed through pattern recognition. The AI engine processes the graphical depictions by comparing elements of the plan against a database of stored design element templates, enabling automatic identification of structures such as sinks, control panels, ceiling fans, air handling units, emergency exits, and other construction components.

Following identification of one or more design elements within the design plan, the controller searches an instructional content database for materials corresponding to the identified design elements. The instructional content database may reside locally on a user device or remotely on a cloud server. The instructional content may include installation procedures, repair guides, maintenance workflows, safety guidelines, regulatory compliance steps, or manufacturer-provided documentation. For example, if an HVAC system is identified within the design plan, the corresponding instructional content may comprise a step-by-step startup checklist, a seasonal maintenance schedule, a tutorial video for filter replacement, and a troubleshooting guide for common operational faults.

The controller subsequently generates an interactive user interface on a first user device, displaying the design plan with visual instructional content indicators (177, 177A, 177B, 178) overlaid on at least some of the identified design elements. Each instructional content indicator may take the form of a selectable icon, a hyperlinked symbol, a graphical annotation, or an embedded media window directly positioned over the graphical depiction of the associated building component. For example, a wrench icon could appear over an air conditioner to indicate available repair documentation, while a flashing icon could highlight a fire alarm system requiring updated safety compliance checks. These instructional content indicators are embedded with hyperlinks pointing to the respective instructional content files stored locally or in the cloud.

In some implementations, the appearance of the instructional content indicators changes based on the availability of corresponding instructional content. When complete and verified instructional content is available for a design element, the indicator may appear as a colored icon or a bold symbol; conversely, if the instructional content is missing or pending, the indicator may be rendered in grey or with a crosshatch pattern to visually inform users of incomplete data. This dynamic appearance assists users in navigating the design plan more efficiently and understanding the content availability status without additional clicks.

The method further includes receiving a user prompt to access the instructional content. The user prompt may be generated through various forms of interaction with the interactive user interface, including, but not limited to a tap, a click, a hover gesture using a cursor or stylus, a gaze-based selection using an eye-tracking system, or a voice command. For example, a technician wearing an augmented reality headset may utter the command "show instructions" while focusing on a highlighted sink component, triggering the retrieval and display of installation or repair procedures associated with that sink.

In other embodiments, the system detects a user selection of a corresponding design element itself, rather than the instructional content indicator. By selecting a portion of the design plan corresponding to a recognized component, the instructional content indicator is triggered to retrieve and present the associated instructional material. For example, tapping on the depiction of a control panel may automatically activate the loading of a wiring diagram tutorial linked to that control panel, even if no explicit indicator was initially selected.

In certain use cases, the receipt of the user prompt comprises detecting a user assignment of a service task to a design element. When a building manager or contractor assigns a maintenance task, such as "replace air filter in rooftop HVAC unit," to a technician, the system automatically preloads the relevant instructional content into the assigned technician's device. This preloading reduces operational delays and enables the technician to access precise maintenance workflows at the time of service without needing to manually search for appropriate guidance.

The method also supports receiving the user prompt based on the detection of physical proximity of the first user device to the physical counterpart of a design element. For example, as a technician carrying a smartphone or wearing a head-mounted device approaches a physical HVAC unit mapped within the digital design plan, the system recognizes the proximity through GPS, Bluetooth beacons, RFID tags, Wi-Fi triangulation, or inertial tracking sensors, and automatically loads the instructional content related to that HVAC unit, such as the manufacturer's recommended startup sequence or a video walkthrough of common troubleshooting steps.

The first user device upon which the interactive user interface is displayed may include a wide variety of computing devices, such as tablets, smartphones, head-mounted devices (HMDs), augmented reality (AR) headsets, virtual reality (VR) headsets, or wearable computing devices. In one exemplary implementation, a service personnel may use an AR headset that displays the design plan overlaid onto the real world. Instructional content indicators appear anchored directly over corresponding physical components, allowing the personnel to access step-by-step instructions, safety protocols, or manufacturer specifications without disengaging from the task at hand.

In embodiments where the user device is a head-mounted device, the instructional content may be presented as augmented reality overlays superimposed upon a real-time camera feed of the physical counterpart of the design element. For example, when the technician views a malfunctioning circuit breaker panel through the AR headset, the system overlays a color-coded wire diagram, labels component parts, and displays dynamic arrows or highlights showing the sequence of operations required to isolate and repair the fault. This AR-assisted visualization reduces cognitive load, improves repair accuracy, and accelerates troubleshooting processes.

Upon receiving a valid user prompt, whether by selection, task assignment, proximity detection, or verbal command, the system provides access to the corresponding instructional content. In some embodiments, access comprises streaming the instructional content directly from a remote cloud server to the first user device. The cloud server may intelligently deliver appropriate content versions based on device type, user role, language preference, and connection bandwidth. For example, an interactive 3D animation may be streamed for a user operating an AR headset, while a simplified PDF guide is sent to a smartphone user operating in a low-bandwidth environment.

Figure 2A:
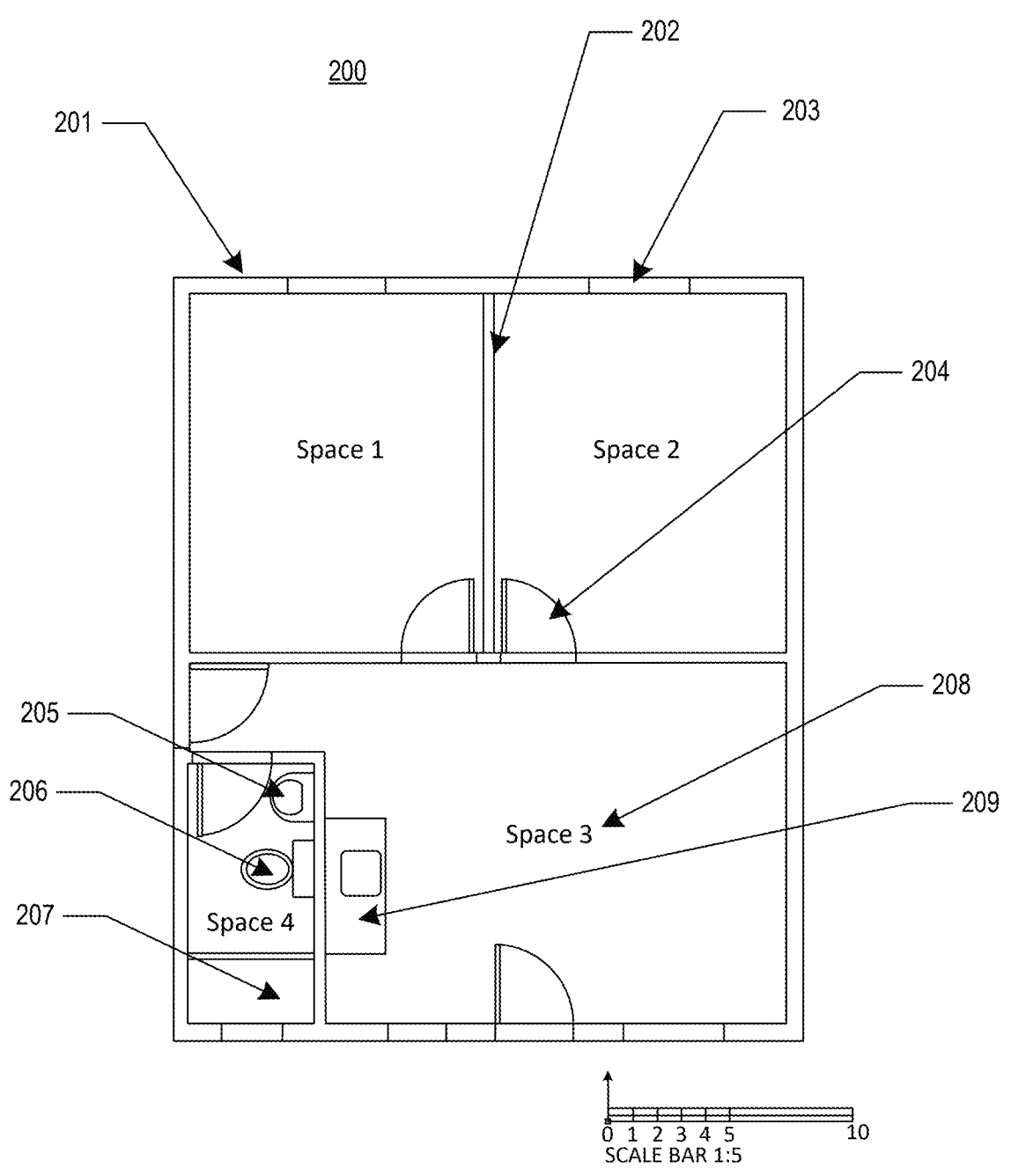
FIGS. 2A, 2B, 2C, and 2D illustrate a static representation of a floor plan and an AI analysis of the same to assess boundaries and design elements.
Figure 2B:
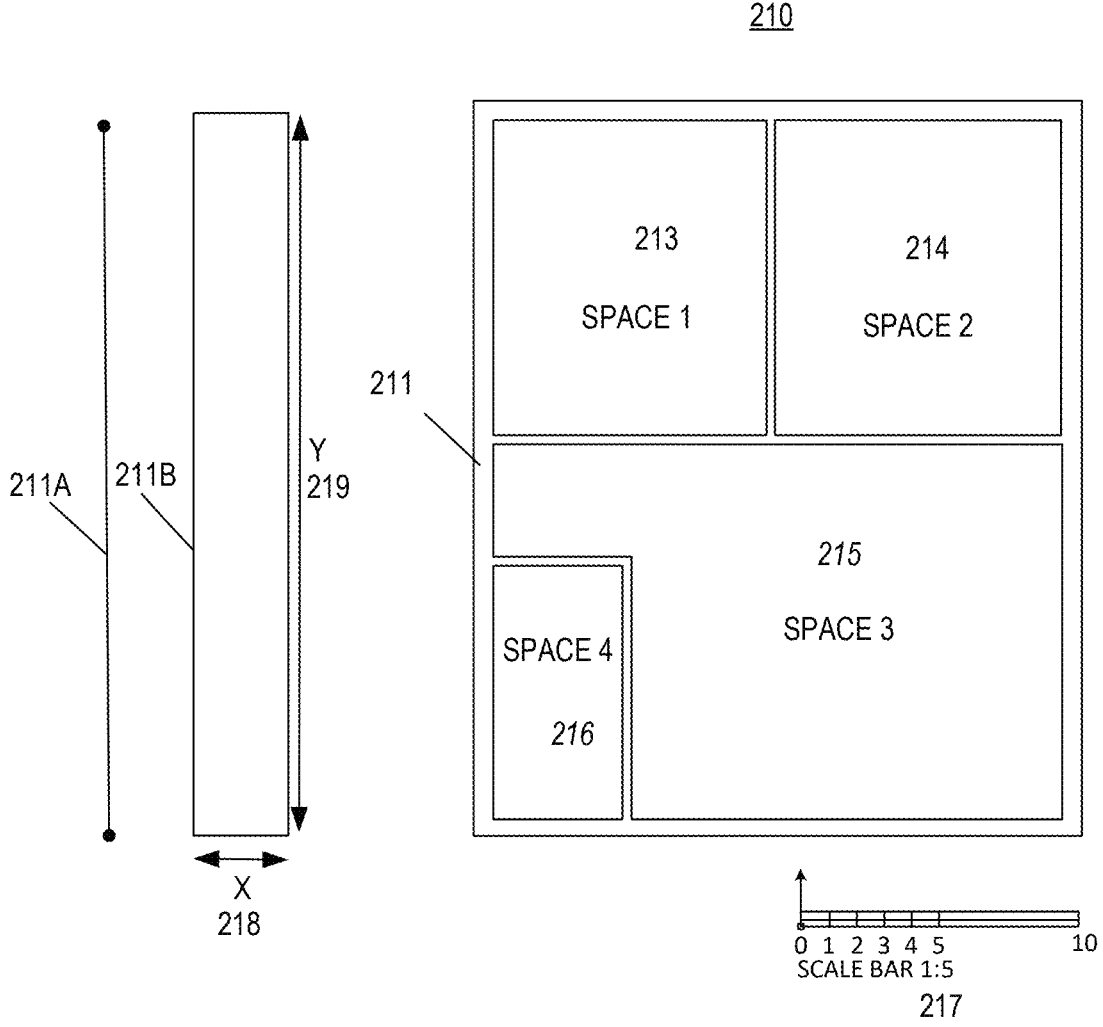

Referring now to FIG. 2A, a given two-dimensional reference 200 may have a number of elements that an observer and/or an AI engine may classify as features 201-209 such as, for example, one or more of: exterior walls 201; interior walls 202; doorways 204; windows 203; plumbing components, such as sinks 205, toilets 206, showers 207, water closets or other water or gas related items; kitchen counters 209 and the like. The two-dimensional references 200 may also include narrative or text 208 of various kinds throughout the two-dimensional references.

Identification and characterization of various features 201-209 and/or text may be included in the input two-dimensional references. Generation of values for variables included in generating a bid may be facilitated by splitting features into groups called 'disparate features' 201-209 and boundary definitions and generation of a numerical value associated with the features, wherein numerical values may include one or more of: a quantity of a particular type of feature; size parameters associated with features, such as the square area of a wall or floor; complexity of features (e.g. a number of angles or curves included in a perimeter of an area; a type of hardware that may be used to construct a portion of a building, a quantity of a type of hardware that may be used to construct a portion of the building; or other variable value.

In some embodiments, a recognition step may function to replace or ignore a feature. For example, for a task goal of the result shown in FIG. 2B, features such as windows 203, and doorways, 204, may be recognized and replaced with other features consistent with exterior walls 201 or interior walls 202 (as shown in FIG. 2A). Other features may be removed, such as the text 208, the plumbing features and other internal appliances and furniture which may be shown on drawings used as input to the processing. Again, such feature recognition may be useful to accomplish other goals, but for a goal of boundary 211 definition that delineates a floorplan 210 as illustrated in FIG. 2B a pictorial representation may be purposefully devoid of such features, as illustrated.

Referring now to FIG. 2B, a boundary 211 is illustrated around a grouping of defined spaces 213-216. Spaces are areas within a boundary (which may include but are not limited to rooms, hallways, stairwells, etc.).

FIG. 2B illustrates an AI predicted boundary 211 based upon an analysis of the floorplan 210 illustrated in FIG. 2A. A transition from FIG. 2A to FIG. 2B illustrates how an AI engine successfully distinguishes between wall features and other features such as a shower 207, kitchen counter 209, toilet 206, bathroom sink 205, etc., shown in FIG. 2A.

In another aspect, in some embodiments, a boundary may include a polygon 211B. A polygon may be any shape that is consistent with a design submitted for AI analysis. For example, a rectangular polygon 211B may be based upon a wall segment 211A and have a width ×218 and a length Y 219. Boundaries that include polygons are useful, for example, in creating a three-dimensional representation of a design plan.

According to the present invention, a boundary may be represented on a user interface as one or both of: one or more line segments, and one or more polygons. In addition, a feature may be represented as a single point, a polygon, an icon, or a set of polygons. In some embodiments, a point may be placed in a centroid position for the feature, and the centroid points may be counted, summarized, subtracted, averaged, or otherwise included in mathematical processes.

In some embodiments, an analytical use for a boundary may influence how a boundary is represented. For example, determination of a length of a wall section, or size of a feature may be supported via a boundary that includes a line segment. A count of feature type may be supported with a boundary that includes a single point or predefined polygon or set of polygons. Extrapolation of a two-dimensional reference into a three-dimensional representation may be supported with a boundary that includes polygons.

In one embodiment of the present invention, the AI engine is adept at analyzing a static representation of a floor plan to identify and generate a selectable array of editable components, such as walls, doors, and fixtures. These dynamic elements are then presented in an interactive user interface, where users can effortlessly select specific design elements to add annotations or to modify those elements directly. For example, a user can choose a window on the digital floor plan and opt to change its dimensions, or select a wall to annotate with instructions for material specifications. The AI's analytical prowess facilitates that these selections and subsequent modifications are intelligently integrated within the overall design framework, enabling a fluid and intuitive design alteration experience that supports real-time collaboration and planning accuracy.

A scale 217 may be used to indicate a size of features included in a technical drawing included in the two-dimensional reference. As indicated above, executable software may be operative with a controller to count pixels on an image and apply a scale to a bitmapped image. Alternatively, a user may input a drawing scale for a particular image, drawing or other two-dimensional reference. Typical units referenced in a scale include inches: feet, centimeters: meters, or any other appropriate unit.

In some embodiments, a scale 217 may be determined by manually measuring a room, a component, or other empirical basis for assessing a relative size. Examples therefore include a scale included as a printed parameter on two-dimensional reference or obtained from dimensioned features in the drawing. For example, if it is known that a particular wall is thirty feet in length, a scale may be based upon a length of the wall in a particular rendition of the two-dimensional reference and proportioned according to that length.

Figure 2C:
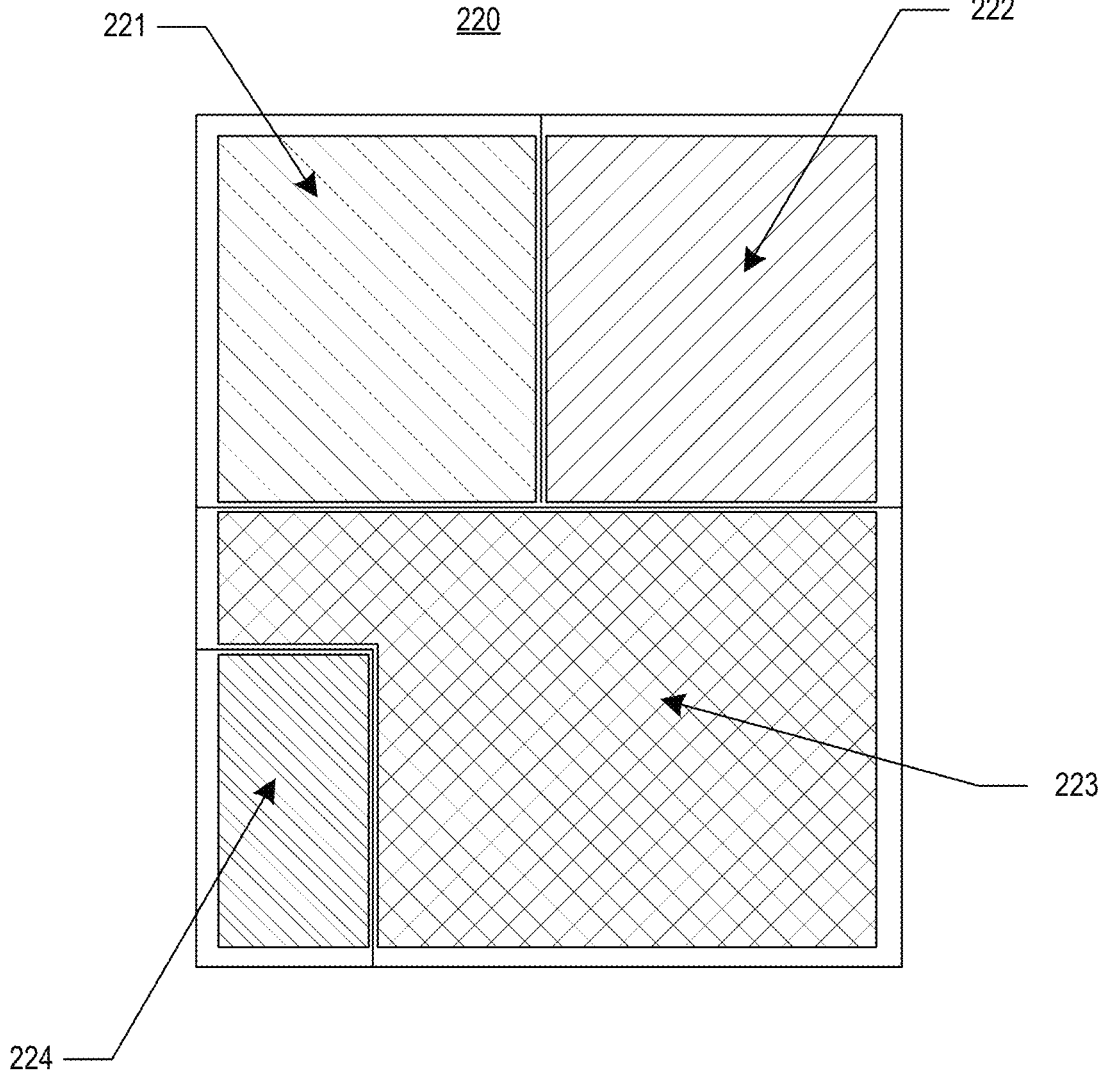

Referring now to FIG. 2C, a user interface 220 is illustrated with multiple regions 221-224. The multiple regions

221-224 may be presented via different hatch representations or other distinguishing pattern (in some embodiments regions may also be represented as various colors, etc.). During training of AI engines, and in some embodiments, when a submitted design drawing includes highly customized or unique features, a user may wish to adjust an automated identification of boundaries and automated filling of space within the boundaries.

During training of processes executed by a controller, such as those included in an AI engine made operative by the controller, and in some embodiments, when a submitted design drawing includes highly customized or unique features, an automated identification of boundaries and automated filling of space within the boundaries may be included in the interactive user interface may not be according to a particular need of a user. Therefore, in some embodiments of the present invention, an interactive user interface may be generated that presents a user with a display of one or more boundaries and pattern or color filled areas arranged as a reproduction of a two-dimensional reference input into the AI engine.

In some embodiments, the controller may generate a user interface 220 that includes indications of assigned vertices and boundaries, and one or more filled areas or regions with user changeable editing features to allow the user to modify the vertices and boundaries. For example, the user interface may enable a user to transition an element such as a vertex to a different location, change an arc of a curve, move a boundary, or change an aspect of polylines, polygons, arcs, circles, ellipses, splines, NURBS or predefined subsets of the interface. The user can thereby "correct" an assignment error made by the AI engine, or simply rearrange aspects included in the interface for a particular purpose or liking.

In some embodiments, modifications and/or corrections of this type can be documented and included in training datasets of the AI model, also in processes described in later portions of the specification.

Discrete regions may be regions associated with an estimation function. A region that is contained within a defined wall feature may be treated in different ways such as ignoring all areas within a boundary, to counting all areas within a boundary (even though regions do not include boundaries). If the AI engine counts the area, it may also make an automated decision on how to allocate the region to an adjacent region or regions that the region defines.

Figure 2D:
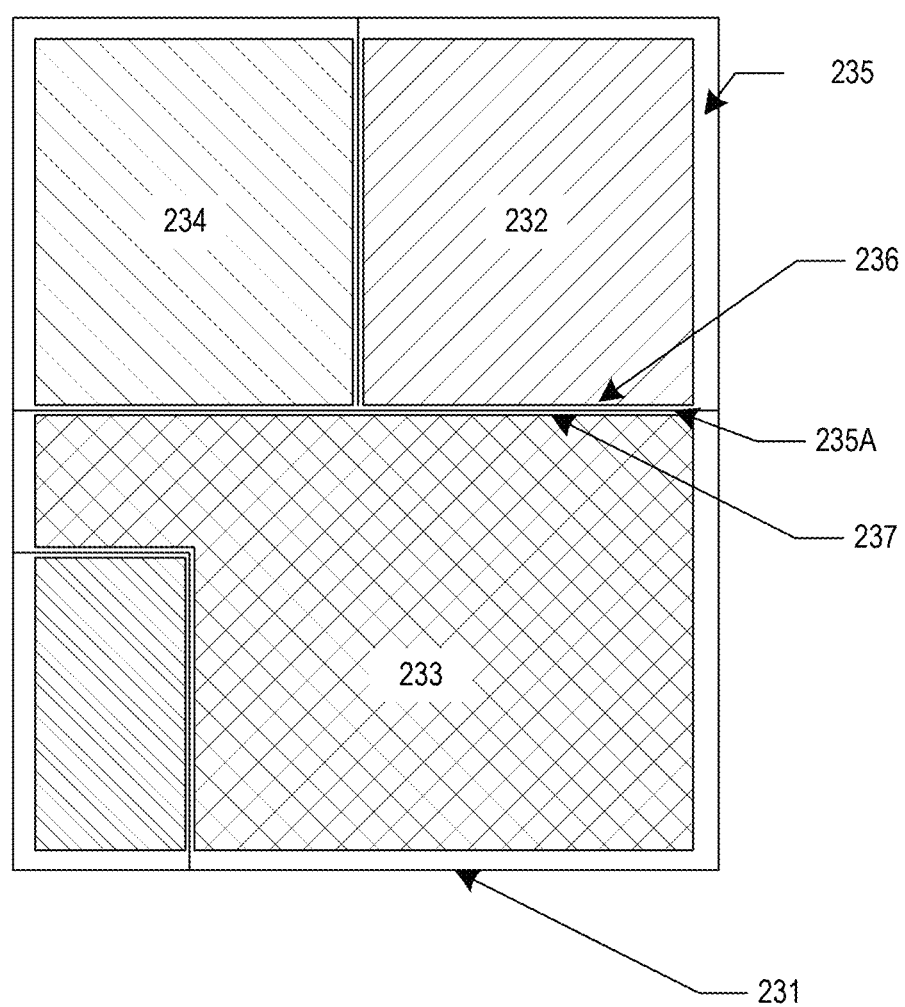

Referring to FIG. 2D, an exemplary user interface 230 illustrates a user interface floorplan model 231 with boundaries 236-237 between adjacent regions 233-234 with interior boundaries 236-237 that may be included in an appropriate region of a dynamic component. The AI may incorporate a hierarchy where some types of regions may be dominant over others, as described in more detail in later sections. Regions with similar dominance ranks may share space, or regions with higher dominance ranks may be automatically assigned to a boundary. In general, a dominance ranking schema will result in an area being allocated to the space with the higher dominance rank. In some embodiments, a dominance rank will allocate an area that may be used in determining an occupancy load. Moreover, in those embodiments that analyze a dynamic file (such as, for example, a Revit® compatible file) a dominance rank may be included, or added to, one or more dynamic features and be modified as the dynamic feature is modified. In some embodiments, the incorporation of a dominance rank may be instrumental in delivering automated suggestions for the revision of design plans. The dominance rank may serve as a strategic guide, steering the focus towards regions (or design elements) of higher dominance rank. For example, regions with a higher dominance rank are recommended to remain as unchanged as possible in the suggested revisions besides making sure that the revised designs of the regions comply with the best practices. The annotation process related to the selected design elements or dynamic components may also be presented based on the dominance rank of regions, dynamic components representing the regions, and the selected design elements on the design plans. This approach scrutinizes the annotations added to the regions or design elements with a higher dominance rank on the overall design, facilitating that modifications align with both regulatory requirements and the foundational elements that contribute significantly to the design's integrity.

In some embodiments, an area 235A between interior boundaries 236-237 and an exterior boundary 235 may be fully assigned to an adjacent region 232-234. An area 235A between interior boundaries 236-237 may be divided between adjacent regions 232-234 to the interior boundaries 236-237. In some embodiments, an area 235A between boundaries 236-237 may be allocated equally, or it may be allocated based upon a dominance scheme where one type of area is parametrically assessed as dominant based upon parameters such as its area, its perimeter, its exterior perimeter, its interior perimeter, and the like. Parameters may also be based upon items that are automatically counted using AI analysis of pixel patterns that identify a pattern as an item, such as, by way of non-limiting example, one or more of: doors or other paths of egress; plumbing fixtures; fixed obstacles; stairs; inclines; and declines.

In some examples, a boundary 235-237 and associated area 235A may be allocated to a region 232-234 according to an allocation schema, such as, for example, an area dominance hierarchy, to prioritize a kitchen over a bathroom, or a larger space over a smaller space. In some embodiments, user selectable parameters (e.g., a bathroom having parameters such as two showers and two sinks may be more dominant over a kitchen having parameters of a single sink with no dishwasher). These parameters may be used to determine boundary and/or area dominance. A resulting computed floorplan model may include a designation of an area associated with a region as illustrated in FIG. 2D. In various embodiments, different calculated features are included in a user interface floorplan model 231 such as features representing aspects of a wall, such as, for example, center lines, the extent of the walls, zones where doors open and the like, and these features may be displayed in selected circumstances.

Once boundaries have been defined a variety of calculations may be made by the system. A controller may be operative to perform method steps resulting in calculation of a variable representative of a floorplan area, which in some embodiments may be performed by integrating areas between different line features that define the regions.

Alternatively, or in addition to, method steps operative to calculate a value for a variable representative of an area, a controller may be operative to generate a value for element lengths, which values may also be calculated. For example, if ceiling heights are measured, presented in drawings, or otherwise determined, then volume for the room and surface area calculations for the walls may be made. There may be numerous dimensional calculations that may be made based on the different types of model output and the user-inputted calibration factors and other parameters entered by the user.

In some embodiments, a controller may be provided with two-dimensional references that include a series of architectural drawings with disparate drawings representing different elevations within a structure. A three-dimensional model may be effectively built based upon a sequenced stacking of the disparate drawings representing different levels of elevations. In other examples, the series of drawings may include cross-sectional representation as well as elevation representation. A cross-section drawing, for example, may be used to infer a common three-dimensional nature that can be attributed to the features, boundaries and areas that are extracted by the processes discussed herein. Elevation drawings may also present a structure in a three-dimensional perspective. Feature recognition processes may also be used to create three-dimensional model aspects.

Figure 3A:
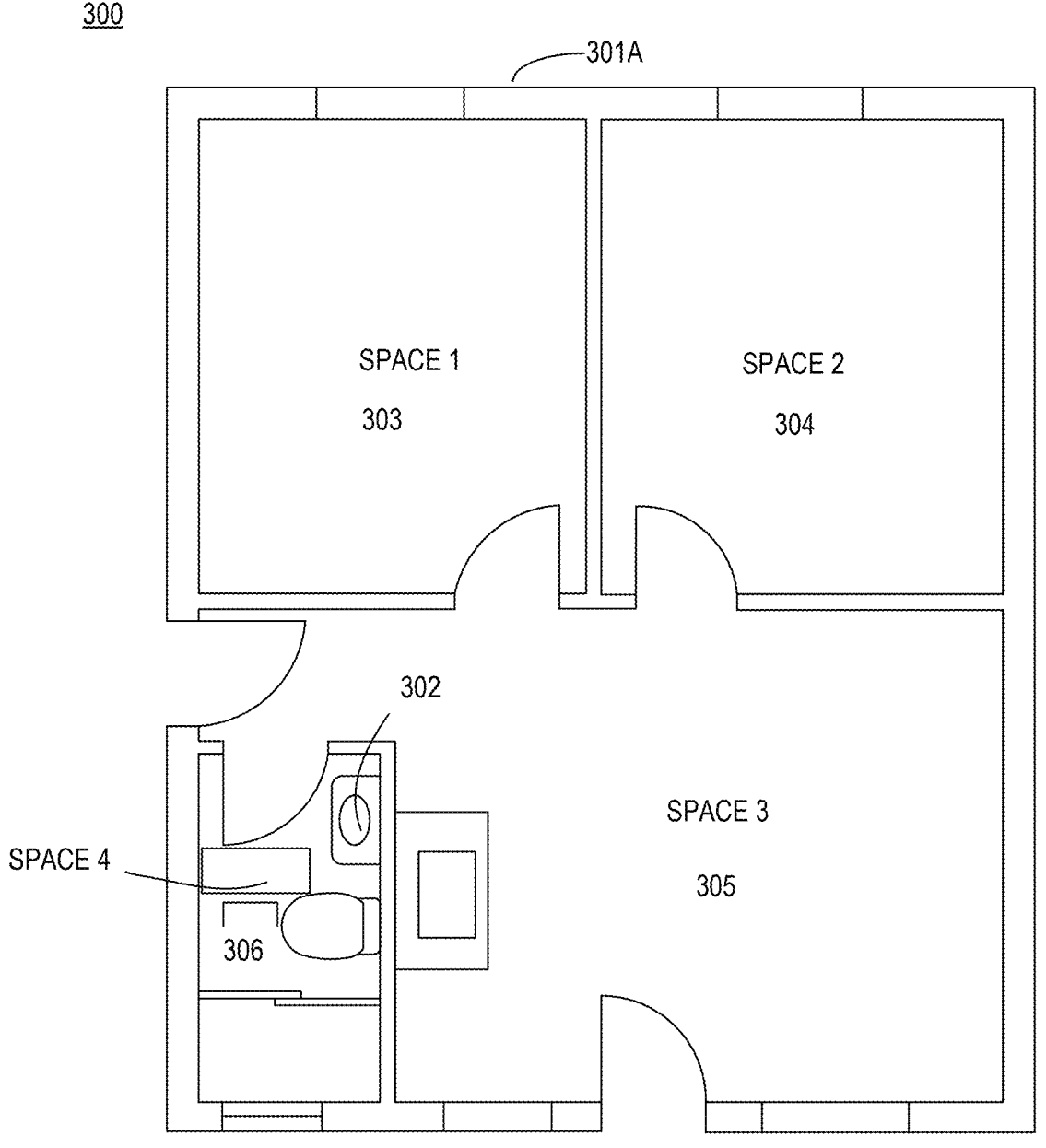
Figure 3B:
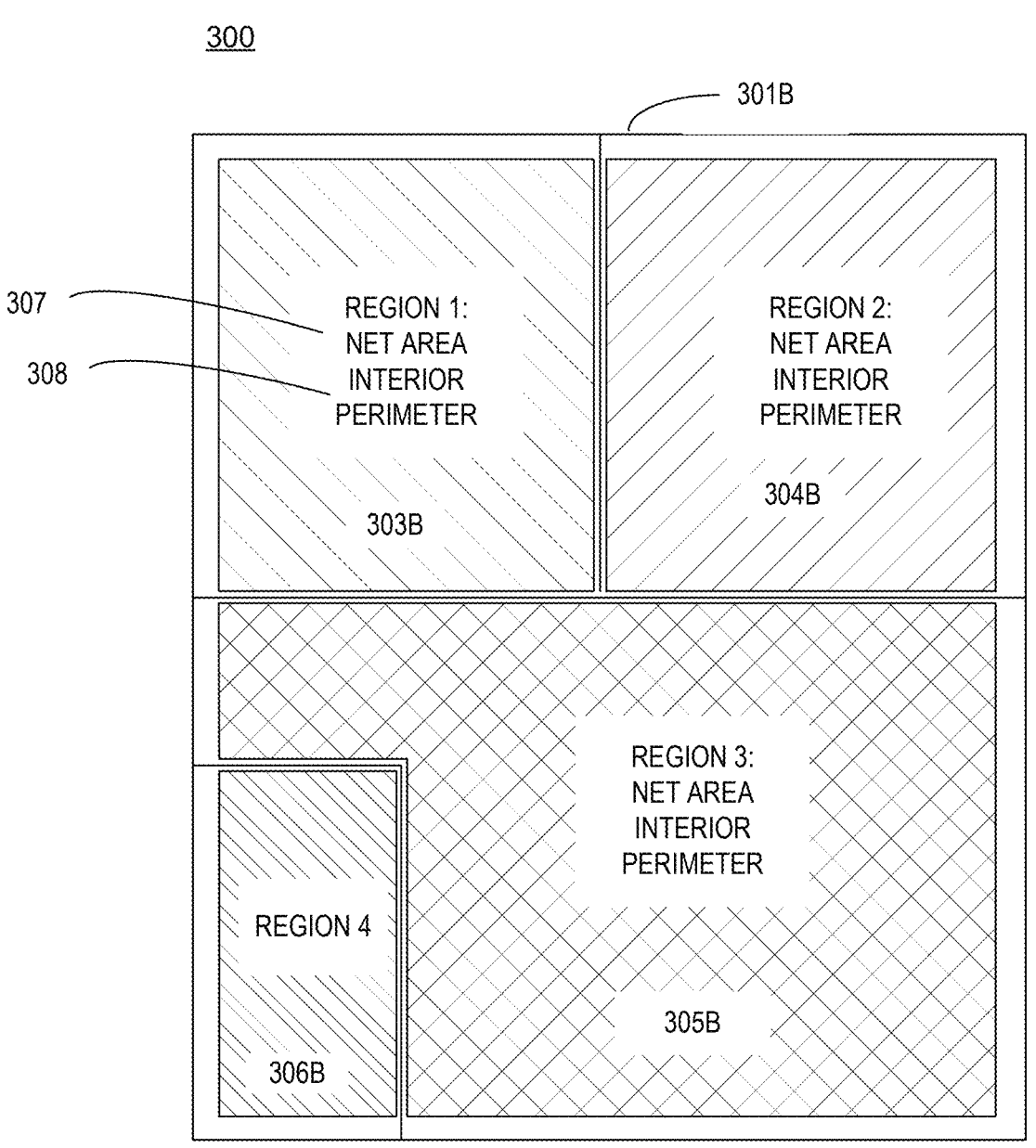
Figure 3C:
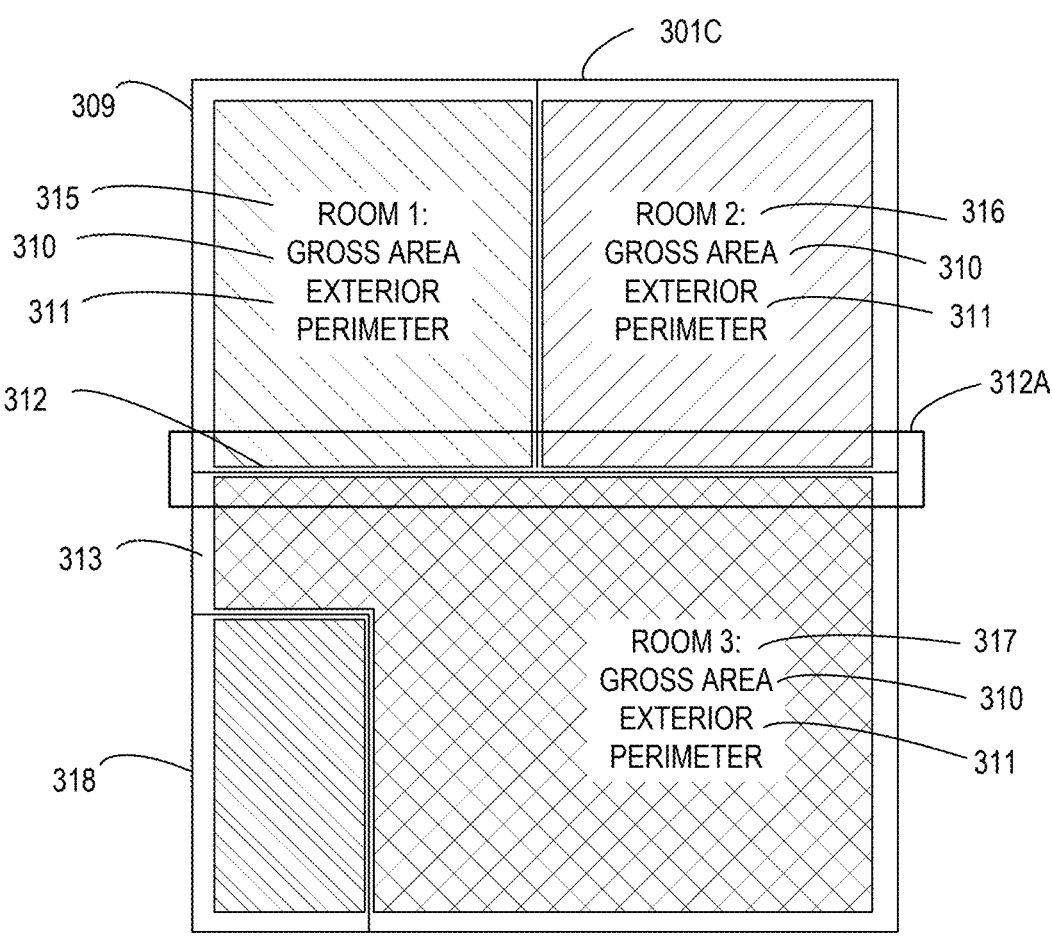

Referring now to FIGS. 3A-3C a user interface 300 may generate multiple different user views, each view has different aspects related to the two-dimensional reference drawing inputted. For example, referring now to FIG. 3A, a user interface 300 with a replication view 301A may include replication of an original floor plan represented by a two-dimensional reference, without any controller-added features, vectors, lines, or polygons integrated or overlaid into the floorplan. The replication view 301A includes various spaces 303-306 that are undefined in the replication view 301A but may be defined during the processes described herein. For example, some or all of a space 303-306 may correlate to a region in a region view 301B.

The replication view 301A, may also include one or more fixtures 302. A rasterized version (or pixel version) of the fixtures 302 may be identified via an AI engine. If a pattern is present that is not identified as a fixture 302, a user may train the AI engine to recognize the pattern as a fixture of a particular type. The controller may generate a tally of multiple fixtures 302 identified in the two-dimensional reference. The tally of multiple fixtures 302 may include some or all of the fixtures identified in the two-dimensional reference and may be used to generate an estimate for completion of a project illustrated by, or otherwise represented by, the two-dimensional reference.

Referring now to FIG. 3B, in the user interface 300 a user may specify to a controller that one of multiple views available is to be presented via the interface. For example, a user may designate via an interactive portion of a screen displaying the user interface 300 that a region view 301B be presented. The region view 301B may identify one or more regions and/or spaces 303B-306B identified via processing by a controller, such as, for example, via an AI engine running on the controller. The region view 301B may include information about one or more regions 303-306 delineated in the region view 301B of the user interface 300. For example, the controller may automatically generate and/or display information descriptive of one or more of: user displays, printouts or summary reports showing a net interior area 307 (e.g., a calculation of square footage available to an occupant of a region), an interior perimeter 308, a type of use a region 303B-306B will be deployed for, or a particular material to be used in the region 303B-306B. For example, Region 4 306B may be designated for use as a bathroom; and flooring and wallboard associated with Region 4 may be designated as needing to be waterproof material.

Referring now to FIG. 3C, a gross area region view 301C and 309 is illustrated. As illustrated in FIG. 3B, a user interface may include interactive devices for display of additional parameters, such as, for example, one or more of: a net interior area 307 may generate a designation of a value that is in contrast to a gross area 310 and exterior perimeter 311. The selection of gross area 310 may be more useful to a proprietor charging for a leased space, but may be less useful to an occupant than a net interior area 307 and interior perimeter 308. One or more of the net interior areas 307, interior perimeter 308 gross area 310 and exterior perimeter 311 may be calculated based upon analysis by an AI engine of a two-dimensional reference.

In addition, a height for a region may also be made available to the controller and/or an AI engine, then the controller may generate a net interior volume and vertical wall surface areas (interior and/or exterior).

In some embodiments, an output, such as a user interface of a computing device, smart device, tablet and the like, or a printout or other hardcopy, may illustrate one or both of: a gross area 310 and/or an exterior perimeter 311. Either output may include automatically populated information, such as the gross area of one or more rooms (based upon the above boundary computations) or exterior perimeters of one or more rooms.

In some embodiments, the present invention calculates an area bounded within a series of polygon elements (such as, for example, using mathematical principals or via pixel counting processes), and/or line segments.

In some embodiments, in an area of a bounded by lines intersecting at vertices, the vertices may be ordered such that they proceed in a single direction such as clockwise around the bounded area. The area may then be determined by cycling through the list of vertices and calculating an area between two points as the area of a rectangle between the lower coordinate point and an associated axis and the area of the triangle between the two points. When a path around the vertices reverses direction, the area calculations may be performed in the same manner, but the resulting area is subtracted from the total until the original vertex is reached. Other numerical methods may be employed to calculate areas, perimeters, volumes, and the like.

These views may be used in generating estimation analysis documents. Estimation analysis documents may rely on fixtures, region area, or other details. By assisting in generating net area, estimation documents may be generated more accurately and quickly than is possible through human-engendered estimation parameters.

With reference now again to FIGS. 3B and 3C, regions 303B-306B defined by an AI engine may include one or more Rooms in FIG. 3B subsequently have regions assigned as "Rooms" in FIG. 3C.

Referring now to FIG. 3D, a table is illustrated containing hierarchical relationships between area types 322-327 that may be defined in and/or by an AI engine and/or via the user interface. The area types 322-327 may be associated with dominance relationship values in relation to adjacent areas. For example, a border region 312-313 (as illustrated in FIG. 3C) will have an area associated with it. According to the present invention, an area 315-318 associated with the border region 312-313 may have an area type 322-327 associated with the area 315-318. An area 312A included in the border region 312-313 may be allocated according to a ratio based upon a dominance ranking of one feature as compared to another feature, which may be represented as a hierarchical relationship between the features, such as, for example, adjacent areas (e.g., area 315 and area 317 or area 317 and area 318), the hierarchical relationship may be used to generate a dominance ranking of one area over another area, or to ascertain factors useful in one or both of: annotating a design element or modifying a design element. For example, a dominance ranking may allocate space used to calculate one or more of: an occupancy load; a width and/or area of an egress path; a width and/or area of a common path; a length of a dead-end; egress capacity; and travel distance from a furthest point. In this context, regions assigned a higher dominance ranking are designated to be inherently associated with elevated safety standards.

Some embodiments of the present invention allocate one or more areas according to a user input (wherein the user input may be programmed to override and automated hierarchical relationship or be subservient to the automated hierarchical relationship). For example, as indicated in the table, a private office located adjacent to a private office may have an area in a border region split between the two adjacent areas in a 50/50 ratio, but a private office adjacent to a general office space may be allocated 60 percent of an area included in a border region, and so on.

Dominance associated with various areas or regions may be systemic throughout a project, according to customer preference, indicated on a two-dimensional reference by two-dimensional reference basis or another defined basis.

Figure 4:
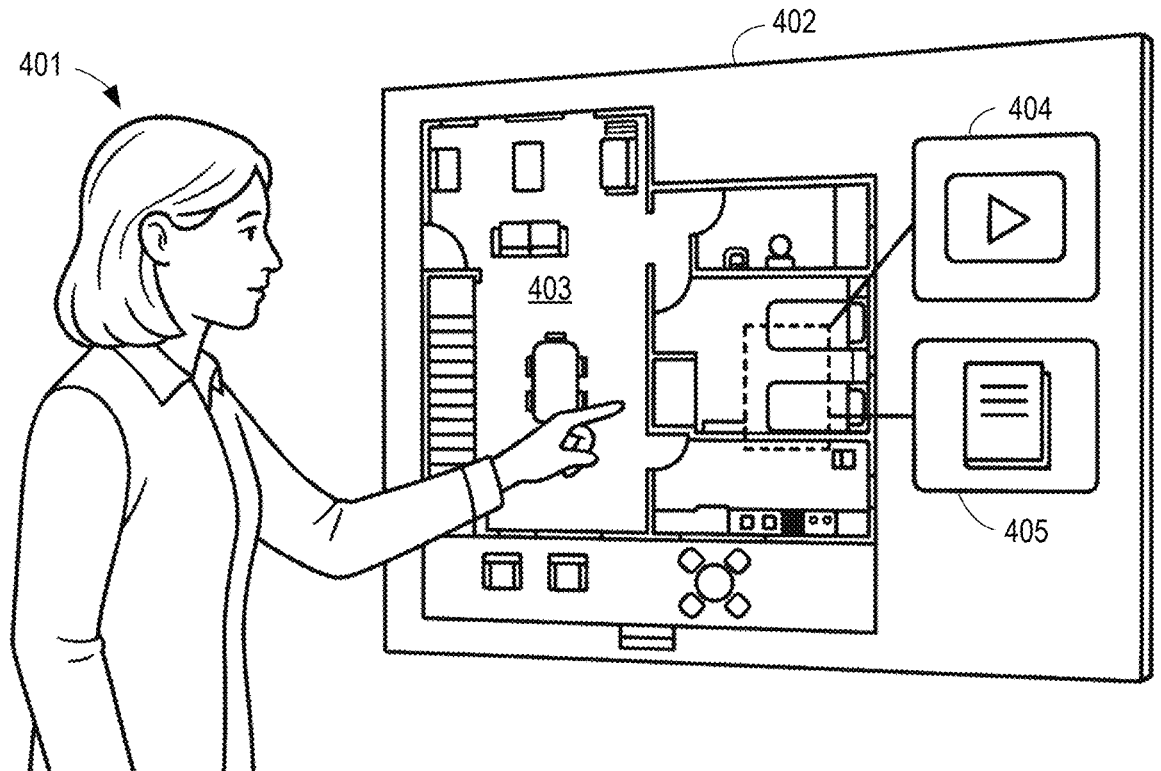
FIG. 4 illustrates an exemplary interactive user interface through which a user accesses instructional content associated with components of a design plan, in accordance with some embodiments of the present invention.

Referring now to FIG. 4, an exemplary interactive user interface 402 is illustrated through which a user 401 may access instructional content 404 and 405 associated with components of a design plan 403, in accordance with some embodiments of the present invention. The interactive user interface 402 may be presented on a touchscreen display, a monitor, a smart board, a tablet, an augmented reality device, or any other graphical output device capable of rendering and receiving user input based on design plan interactions.

The user 401 may be a contractor, an architect, a facilities maintenance technician, a field engineer, a site supervisor, or a property owner who wishes to interact with the digital representation of a building or a portion of the building, such as rooms, fixtures, systems, or appliances represented in the design plan 403. The user 401 may use a pointer device, such as a stylus, finger, or virtual pointer, to interact with the elements of the design plan 403 displayed on the interactive user interface 402.

The design plan 403 shown in the interface 402 may comprise multiple spaces, furniture layouts, utilities, and service components depicted through architectural symbols, icons, or rendered imagery. For example, the design plan 403 may include spaces such as living rooms, dining areas, bedrooms, bathrooms, kitchens, utility closets, corridors, and external patios, each graphically distinguishable from the other.

The user 401, through interaction with the interface 402, may select a specific component or a specific space in the design plan 403. Upon selecting a component, such as a kitchen sink, HVAC unit, lighting fixture, or a partition wall, the system may trigger retrieval and display of instructional content 404 or 405 associated with that selected design element. The user's selection may be registered via touch input, click input, hover detection, or gesture recognition, depending on the hardware capabilities of the interactive user interface 402.

Instructional content 404 and 405 may appear contextually adjacent to or overlaid upon the design plan 403 once a component is selected. The instructional content 404 may represent multimedia information such as videos, including installation walkthroughs, repair demonstrations, routine maintenance tutorials, or safety training segments. These videos may be sourced from a centralized database, generated by AI engines, or uploaded manually by project managers or system administrators.

The instructional content 405 may represent textual or document-based materials such as product manuals, installation specifications, wiring schematics, compliance guidelines, maintenance checklists, or component datasheets.

Accessing the manual icon 405 may open a panel, window, or modal displaying the relevant documentation in a readable or downloadable format, such as PDF, HTML, or interactive e-book layouts.

In some embodiments, the interactive user interface 402 may allow users to filter, sort, or search instructional content linked to different components of the design plan 403. For example, users may request to view only safety guides for selected fixtures or to display all available maintenance videos for all HVAC systems within the plan.

The instructional content 404-405 may be personalized or contextually customized based on the role of the user 401. For example, if the user 401 is identified as an apprentice technician through system login credentials, the instructional content retrieved may prioritize step-by-step videos and simplified manuals. Conversely, if the user 401 is a certified contractor, the interface may present technical specifications and advanced service manuals.

The system may maintain dynamic linkage between the design elements of the plan 403 and their associated instructional content 404-405. If updates occur, such as a new installation procedure or product recall, the associated instructional content may automatically update on the interactive user interface 402 without requiring manual refresh or user intervention.

In certain embodiments, the instructional content 404-405 accessed through the interactive user interface 402 may be downloadable for offline usage, shared through secured links with subcontractors, or archived for compliance verification during project audits or inspections.

Furthermore, the interactive user interface 402 may support annotations by the user 401. For example, the user 401 may annotate the design plan 403 to mark a service date, indicate areas requiring attention, attach a comment for future service personnel, or suggest modifications based on observed conditions at the site.

The interface 402 may also record user interactions, such as which instructional content was accessed, for how long, and which design elements were most interacted with, enabling administrators to derive insights into training needs, component reliability, or operational challenges faced during project execution.

The design plan 403 may be dynamic, allowing not only access to instructional content but also real-time editing, space reallocation, component repositioning, or dimension modifications, all of which can be recorded and synchronized with a central server or a distributed collaborative platform.

In an augmented reality embodiment, the interface 402 may project the design plan 403 into a real-world coordinate system, allowing the user 401 to view instructional content 404-405 directly overlaid onto physical components in a building, enhancing intuitiveness and minimizing context switching between design documents and physical inspection.

The instructional content 404 and 405 may be modular and layered. For example, initial interaction may reveal a brief summary or "quick view" guide, while deeper interactions, such as pressing an "expand" button, may load detailed video tutorials, full manuals, and troubleshooting decision trees.

In some configurations, the interface 402 may also offer the user 401 live access to technical support teams, including chatbots or human experts, who can provide supplemental instructional material or real-time assistance for the selected design component.

The overall architecture represented by FIG. 4 promotes a seamless transition from passive viewing of design plans 403 to active engagement with real-time instructional support systems, thereby improving the efficiency, accuracy, and safety of construction, maintenance, and operational workflows.

The visual presentation of the instructional content 404 and 405 adjacent to the design plan 403 facilitates intuitive spatial correlation between information and the physical or planned components it pertains to, reducing cognitive load and potential for user error.

In a multi-user collaborative environment, multiple users like user 401 may simultaneously interact with different parts of the design plan 403 through respective devices, and any annotations or instructional content access may be synchronized in real-time across all participants.

Figure 5A:
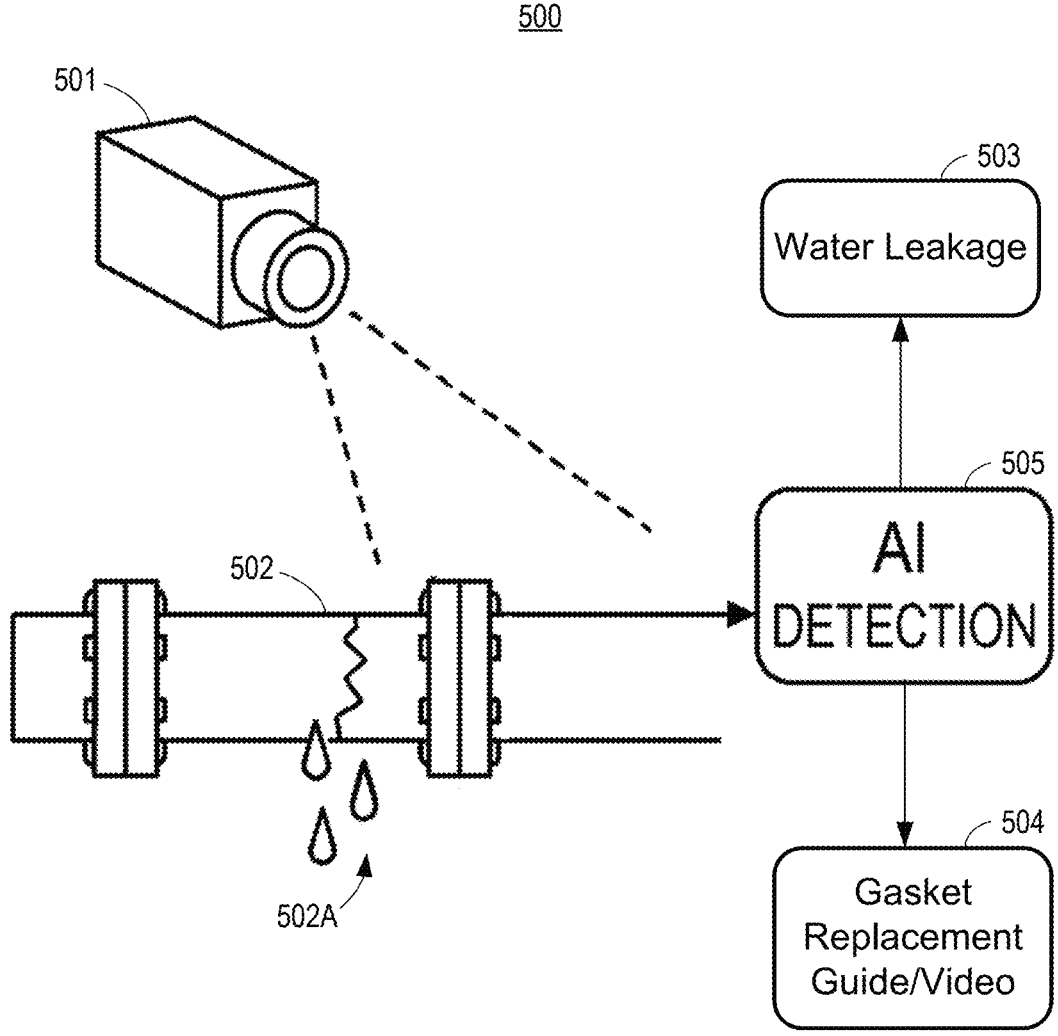
FIGS. 5A-5B illustrate an exemplary system for real-time monitoring and fault detection of physical components within a building, wherein an AI engine identifies issues and automatically associates corresponding instructional content with the affected components in a digital representation of the building.
Figure 5B:
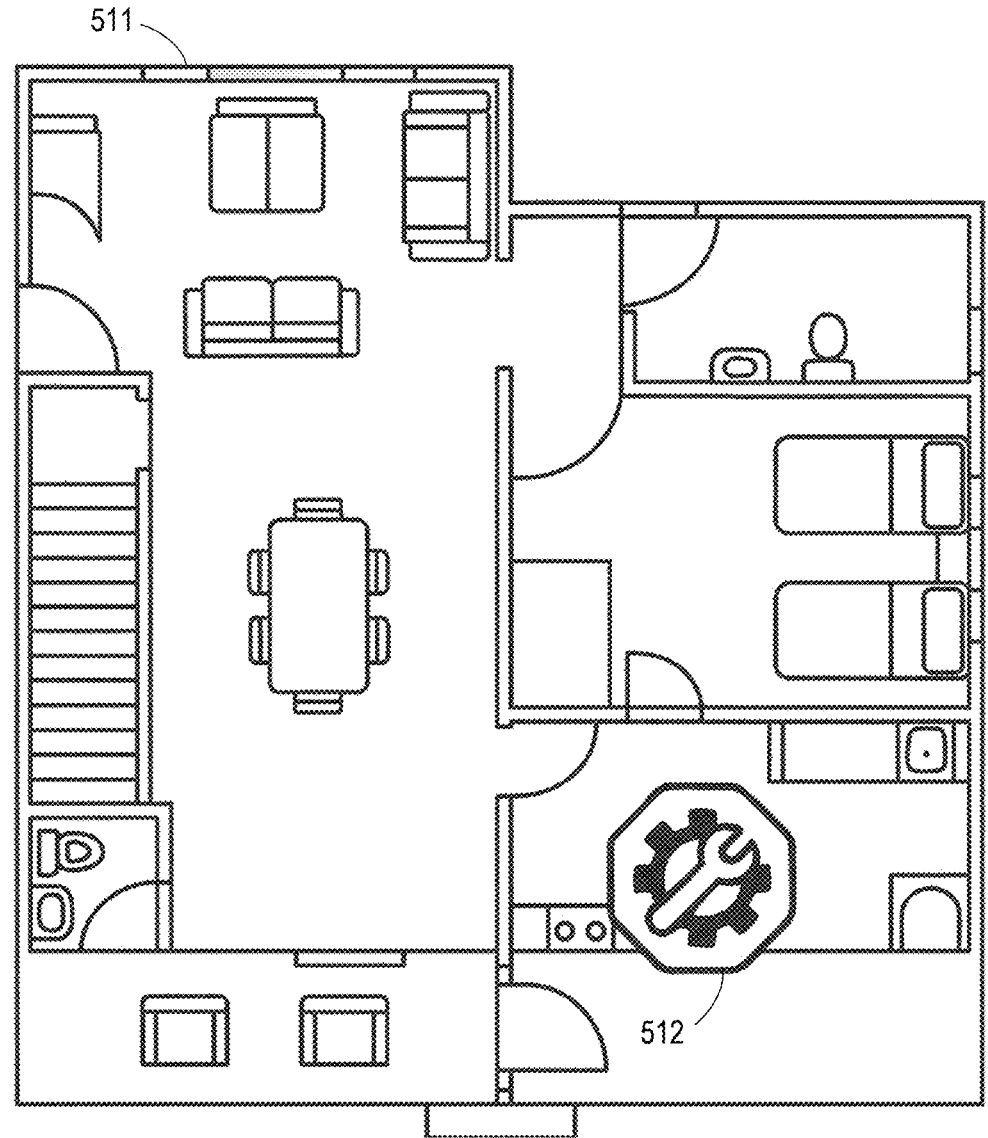

Referring now to FIGS. 5A-5B, an exemplary system 500 is illustrated for real-time monitoring and fault detection of physical components within a building, wherein an AI engine 505 identifies faults or issues 503 and automatically associates corresponding instructional content 504 with the affected components 502 within a digital representation 511 of the building, in accordance with some embodiments of the present invention. As illustrated in FIG. 5A, the system 500 includes a real-time camera 501 that captures live images or video feeds of a physical pipeline 502 or other building components installed within the building. The camera 501 may be part of a building management system (BMS) or an Internet of Things (IoT) infrastructure deployed across the building for continuous monitoring and operational oversight. The captured video feed from the camera 501 is transmitted to a controller, which may be implemented as part of a centralized server system, such as the server 175 described previously. The AI engine 505 operational on the controller processes the received images or video feeds to analyze conditions of the observed components 502. In the illustrated embodiment, the camera 501 captures a defect in the form of a leakage 502A from the pipeline 502, where the leakage 502A may manifest visually through indicators such as water droplets, surface discolorations, corrosion traces, or differential infrared signatures that the AI engine 505 is trained to recognize.

Upon receipt of the video or image data, the AI engine 505 may perform multi-stage image analysis including object recognition, defect localization, pattern matching, anomaly detection, and classification to determine the nature and severity of the detected issue 503 associated with the component 502. The AI engine 505 may leverage convolutional neural networks (CNNs) trained on large datasets of defect imagery to enhance detection accuracy, distinguishing between normal operational variances and actual defects such as leakages, cracks, loosening of fasteners, corrosion, thermal expansion failures, or material fatigue. Once the AI engine 505 identifies a defect, such as the water leakage 503 shown in FIG. 5A, it may perform a lookup in an associated content repository to find pre-existing instructional materials 504 that relate specifically to addressing the identified defect for the detected type of component 502. The instructional content 504 may include guides, tutorial videos, illustrated repair instructions, safety protocols, troubleshooting trees, or preventive maintenance checklists tailored to the particular type of pipeline 502, material specification, installation layout, and the nature of the fault 503.

In some embodiments, if multiple instructional resources 504 are available for a detected issue 503, the AI engine 505 may prioritize selection based on parameters such as recency, rating by other users, relevance to building codes, or specific contextual factors, such as procedures suited for emergency patching versus full-scale component replacement. The selected instructional content 504 is then digitally associated with the corresponding component 502 within a digital twin or design plan 511 of the building, thereby enriching the building's operational knowledge base with actionable repair or maintenance guidance, linked directly to detected real-world conditions. As shown in FIG. 5B, the digital twin 511, representing a layout of the building, is updated to reflect the detection of the fault through placement of a settings icon 512 corresponding to the component exhibiting the detected leakage 502A. The settings icon 512 may be visually differentiated from other design elements in the digital twin 511 through use of special graphics, highlighting, animation effects, or color coding to draw immediate attention to active faults requiring intervention.

In some embodiments, the settings icon 512 may be interactive, allowing a service technician, building operator, or maintenance contractor to click or tap on the icon 512 to immediately access the associated instructional content 504 necessary to remediate the detected issue 503. Additional metadata may be associated with the settings icon 512, including detection timestamps, confidence levels of AI assessment, severity assessments, recommended completion deadlines, tool requirements, or safety hazard ratings, thereby providing full context to field personnel before intervention begins. The instructional content 504 accessible through the settings icon 512 may be segmented into modular sections, such as diagnosis verification steps, recommended isolation procedures, material lists for repair, step-by-step replacement instructions, and post-repair validation procedures, facilitating modular access and task-by-task walkthrough for technicians. The digital representation 511 may automatically update in real-time or near real-time following detection by the AI engine 505, thereby maintaining a living, current model of the building's operational health, directly aligned with actual physical conditions observed through monitoring systems like the camera 501.

In some embodiments, upon resolution of the issue 503, such as the successful repair of the leakage 502A, the service personnel may update the system 500 to mark the status of the associated design element as "repaired," optionally attaching notes, images, or a video confirmation of repair completion for future reference. The AI engine 505 may further learn from such closure data, refining its detection algorithms, correlating defect patterns to repair actions, and building a more accurate predictive maintenance model over time based on empirical feedback loops. The camera 501 may be a fixed-position camera, a pan-tilt-zoom (PTZ) camera, a mobile robot-mounted camera, or a wearable camera integrated with technician equipment, depending on the architecture of the building's BMS and operational strategy. The AI engine 505 may optionally cross-reference sensor data from other systems, such as humidity sensors, pressure gauges, or flow meters, to validate the visual detection made from the camera 501, thereby improving reliability and reducing false positives in fault detection workflows.

The detected fault 503 and associated instructional content 504 may be logged into centralized databases for historical trend analysis, warranty tracking, insurance claim validation, or predictive lifecycle modeling of building systems. In some embodiments, the digital twin 511 may be accessed remotely through secure cloud platforms, allowing offsite maintenance managers or engineers to monitor building health, review detected issues 503, and initiate corrective action workflows through dispatched service teams. Furthermore, the system 500 may generate automated service tickets, maintenance alerts, and parts ordering requests based on detected issues 503 and the nature of the associated instructional content 504, thereby integrating into broader computerized maintenance management systems (CMMS) and reducing manual administrative burden.

In cases where no prior instructional content 504 is available for a newly detected issue 503, the AI engine 505 may flag the component 502 for human review, prompting subject matter experts to generate appropriate instructional material for future automatic association. In another embodiment, if the AI engine 505 identifies multiple issues 503 across different locations of the building concurrently, the system 500 may prioritize interventions based on severity, accessibility, and building usage context, such as giving higher priority to faults in critical infrastructure systems. The instructional content 504 linked to the detected issues may also be made available in multiple languages, tailored to the operating region of the building, thus facilitating effective servicing by a globally distributed or multilingual workforce.

The digital twin 511 with embedded interactive settings icons 512 may be viewed on a wide range of devices, including handheld tablets, augmented reality headsets, smart glasses, laptops, or large format interactive displays installed within facilities management centers. The system 500 depicted in FIGS. 5A-5B significantly enhances the responsiveness, traceability, and effectiveness of building maintenance operations, transforming passive design plans into intelligent, dynamic, service management platforms. In addition to leakages, the AI engine 505 may be trained to detect a wide variety of faults such as structural cracks, fire safety hazards, electrical faults, equipment overheating, mold growth, pest infestations, or vandalism damage, based on video and sensor data inputs, thus expanding its scope of monitoring and intervention coverage.

The real-time association of detected faults 503 with actionable instructional content 504 reduces diagnosis times, minimizes equipment downtime, improves occupant safety, and extends the operational life of building systems through proactive and informed maintenance actions. The system 500 may incorporate user feedback mechanisms allowing maintenance personnel to rate the usefulness, clarity, and applicability of the instructional content 504 accessed through the settings icons 512, thereby driving continuous refinement of system knowledge bases. The AI engine 505 may periodically retrain using collected repair outcomes and field data, thereby improving fault detection accuracy, expanding its library of detectable issues, and enhancing instructional content relevancy dynamically.

Historical visualization of detected and repaired faults on the digital twin 511 may enable strategic building upgrades, targeted retrofits, resource allocation planning, and regulatory reporting based on real empirical operational data rather than theoretical assumptions. Advanced configurations of system 500 may incorporate autonomous drones carrying camera 501 systems to perform scheduled or ad hoc inspections of building exteriors, facades, roofs, and other hard-to-access structures for defect detection and fault monitoring. The instructional content 504 may include mandatory safety pre-checks and compliance verifications, such that upon detecting a fault 503, the system 500 may suggest preliminary steps to secure the work area before beginning any repair action.

The system 500 may be integrated with Building Information Modeling (BIM) systems, allowing newly detected faults 503 and their instructional remedies 504 to be reflected in evolving as-built models of the building over time, thus closing the gap between design intent and operational reality. In some embodiments, AI engine 505 may assign urgency scores to detected faults 503 based on risk to human safety, environmental exposure, operational criticality, financial implications, and regulatory compliance requirements. The settings icon 512 in the digital twin 511 may be color-coded based on the urgency score, for example, red for critical issues, orange for high-priority issues, yellow for moderate issues, and green for informational observations, thereby allowing quick visual triage by facilities staff.

The system 500 may allow batch processing where multiple fault detections 503 across a facility are reviewed collectively, and maintenance campaigns are planned to optimize labor deployment, material procurement, downtime scheduling, and budgetary allocations. In another embodiment, detected faults 503 and linked instructional content 504 may trigger augmented reality overlays where service personnel, using AR glasses, see step-by-step repair guidance superimposed directly onto the physical component needing repair in real-world view. The captured video feeds from camera 501 and fault detection outputs 503 may be archived to build a time-lapse operational history of building system conditions, invaluable for forensic investigations, legal disputes, facilities planning, and insurance underwriting purposes.

In large-scale facilities management contexts, the system 500 provides a scalable, adaptable model for intelligent, data-driven maintenance across individual buildings, multi-building campuses, or multinational building portfolios through standardized detection and content association workflows integrated within a central AI-driven ecosystem.

An important aspect of the operation of the systems as have been described is the training of the AI engines that perform the functions as have been defined. A training dataset may involve a set of input drawings associated with a corresponding set of verified outputs. In some embodiments, a historical database of drawings may be analyzed by personnel with expertise in the field. user, including in some embodiments experts in a particular field of endeavor may manipulate dynamic features of a design plan or other aspects of a user interface to be used to train an AI engine, such as by creating or adding to an AI referenced database.

In some other examples, a trained version of an AI engine may produce user interfaces and/or other outputs based on the trained version of the AI engine. Teams of experts may review the results of the AI processing and make corrections as required. Corrected drawings may be provided to the AI engine for renewed training.

Aspects that are determined by a controller running an AI engine to be represented in a design plan may be used to generate an estimate of what will be required to complete a project. For example, according to various embodiments of the present invention, an AI engine may receive as input a two-dimensional reference and generate one or more of: boundaries, areas, fixtures, architectural components, perimeters, linear lengths, distances, volumes, and the like may be determined by a controller running an AI engine to be required to be required to complete a project.

For example, a derived area or region comprising a room and/or a boundary, perimeter or other beginning and end indicator may allow for a building estimate that may integrate choices of materials with associated raw materials costs and with labor estimates all scaled with the derived parameters. The boundary determination function may be integrated with other standard construction estimation software and feed its calculated parameters through APIs. In other examples, the boundary determination function may be supplemented with the equivalent functions of construction estimation to directly provide parametric input to an estimation function. For example, the parameters derived by the boundary determinations may result in estimation of needed quantities like cement, lumber, steel, wallboard, floor treatments, carpeting, and the like. Associated labor estimates may also be calculated.

As described herein, a controller executing an AI engine may be functional to perform pattern recognition and recognize features or other aspects that are present within an input two-dimensional reference or other graphic design. In a segmentation phase used to determine boundaries of regions or other space features, aspects that are recognized as some artifact other than a boundary may be replaced or deleted from the image. An AI engine and/or user modified resulting boundary determination can be used in additional pattern recognition processing to facilitate accurate recognition of the non-wall features present in the graphic.

For example, in some embodiments, a set of architectural drawings may include many elements depicted such as, by way of non-limiting example, one or more of: windows, exterior doors, interior doors, hallways, elevators, stairs, electrical outlets, wiring paths, floor treatments, lighting, appliances, and the like. In some two-dimensional references, furniture, desks, beds, and the like may be depicted in designated spaces. AI pattern recognition capabilities can also be trained to recognize each of these features and many other such features commonly included in design drawings. In some embodiments, a list of all the recognized image features may be created and also used in the cost estimation protocols as have been described.

Figure 6A:
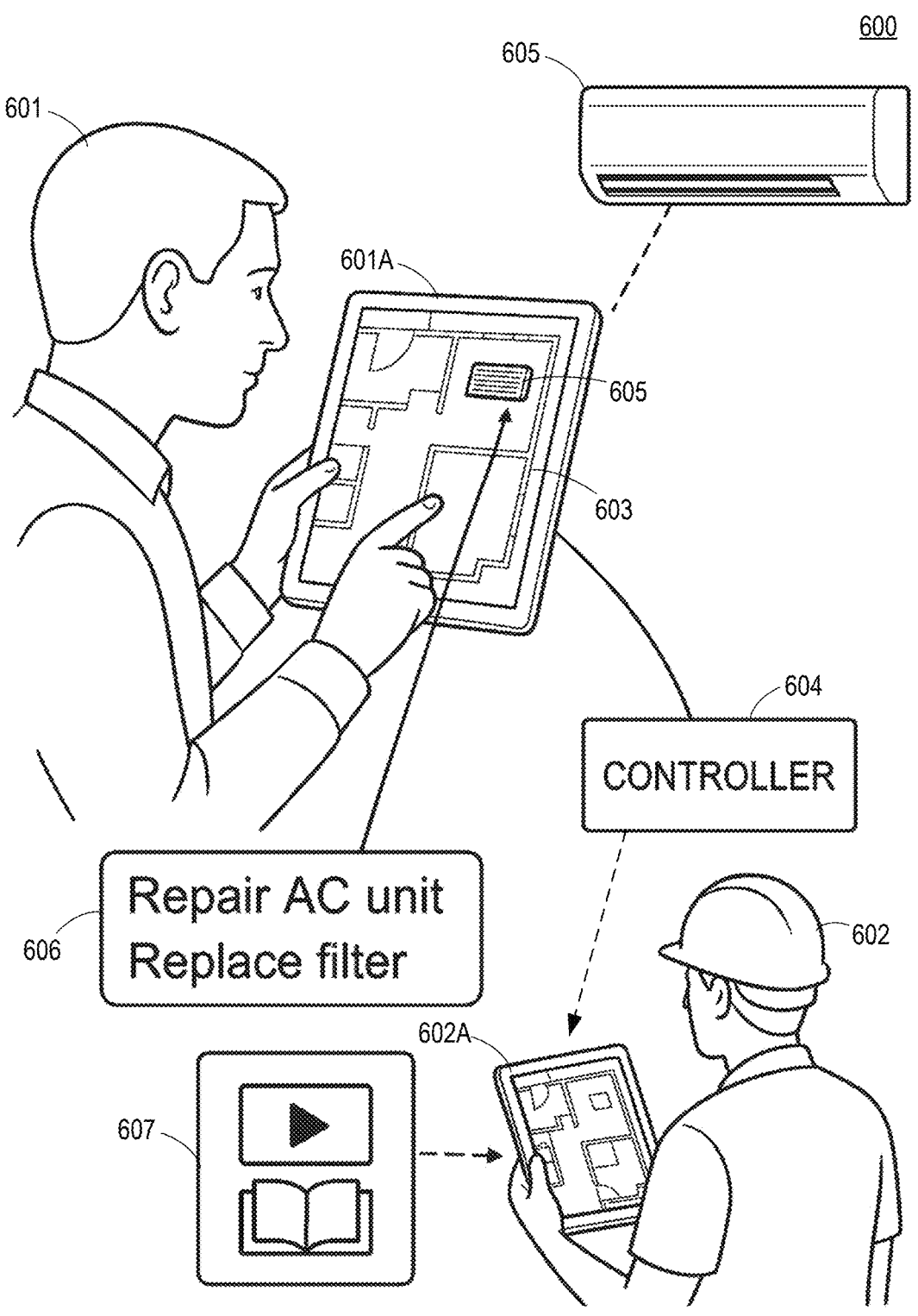
FIGS. 6A-6B illustrate an exemplary system for assigning maintenance or repair tasks to service personnel via a design plan interface, wherein a controller identifies the assigned task and automatically preloads and delivers relevant instructional content to the service personnel for execution of the task.
Figure 6B:
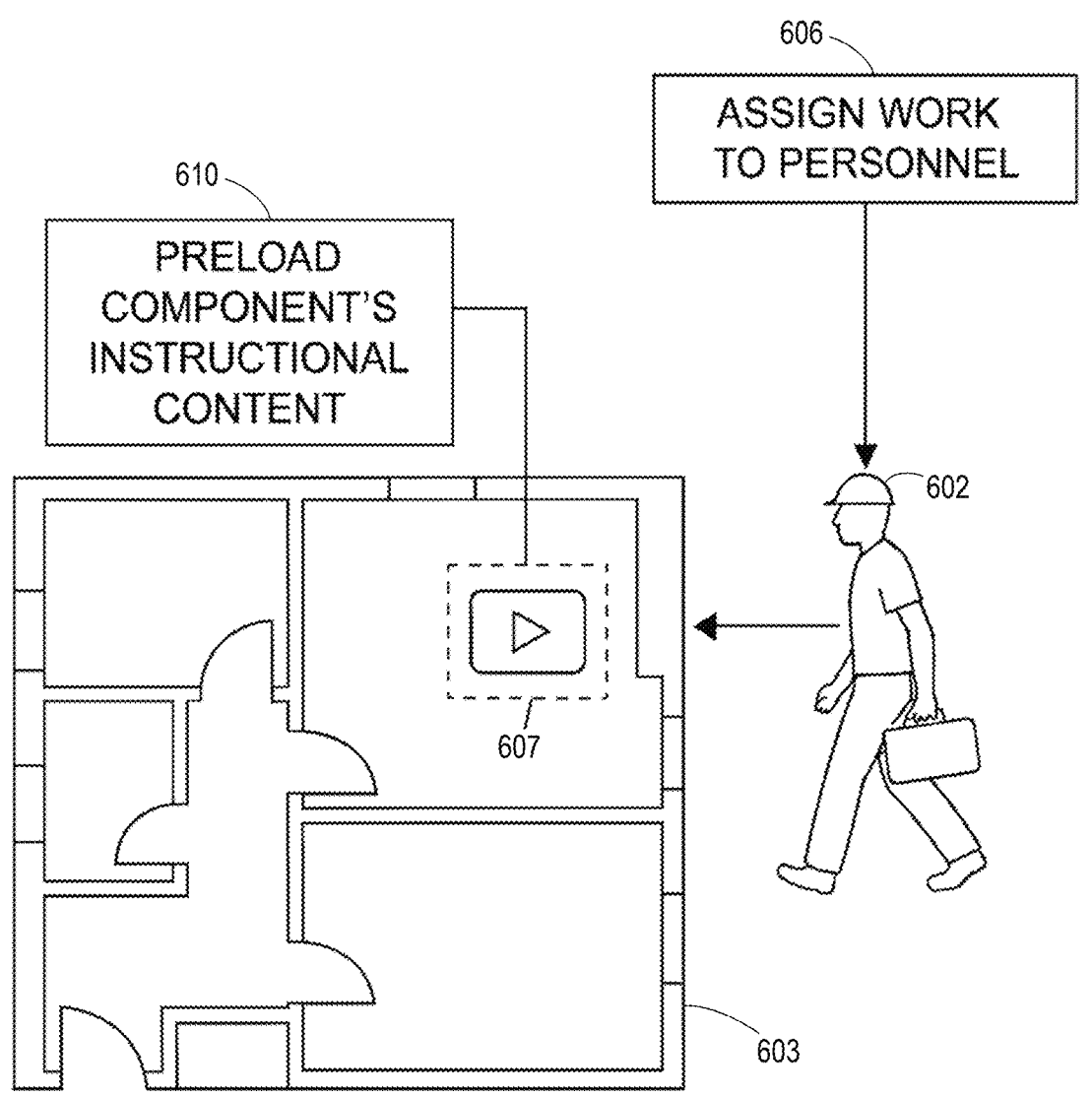

Referring now to FIGS. 6A-6B, an exemplary system 600 is illustrated for assigning maintenance or repair tasks to a service personnel via a design plan interface, wherein a controller identifies the assigned task and automatically preloads and delivers relevant instructional content to the service personnel for execution of the task, in accordance with some embodiments of the present invention. As illustrated in FIG. 6A, a first user 601, who may be a contractor, a facility manager, a managing entity, or a building owner, accesses a digital representation 603 of a building through a first user device 601A. The digital representation 603 may comprise a detailed layout of a physical building and may further include various markings and indications for maintenance needs, such as settings icons (e.g., settings icon 512 described previously with respect to FIG. 5B) that represent components or areas requiring servicing, inspection, or upgrades. Through the user interface of the first user device 601A, the first user 601 is enabled to identify one or more components needing attention, select specific service tasks, and initiate assignment workflows directed to designated service personnel.

In the illustrated embodiment, the first user 601 interacts with the digital representation 603 to assign a service task related to an air conditioning unit 605, such as repairing the AC unit 605 or replacing its air filter. By selecting the AC unit 605 on the digital representation 603, the first user 601 may generate an annotation or task assignment 606 describing the work required. This annotation 606 may be entered via typing, voice input, selection from pre-configured service templates, or through graphical marking directly on the digital representation 603. Once the service task 606 is defined, the controller 604, which is operational within the first user device 601A and/or within an associated cloud system, generates an assignment directive toward a second user 602, who is identified as a service technician or maintenance personnel responsible for execution of the assigned task (606).

As part of the task assignment workflow, the second user 602 is notified through the second user device 602A, which may comprise any of a mobile tablet, a smartphone, a ruggedized field device, or a wearable computing platform configured to communicate with the centralized server and local controllers. The second user device 602A may also include a controller 604 operating an AI engine that receives the assigned service task 606 and automatically determines relevant instructional content 607 associated with the service task 606. The instructional content 607 may include one or more of: video tutorials for AC unit repair, step-by-step product manuals, recommended tool lists, safety guidelines, manufacturer specifications, common troubleshooting procedures, or maintenance checklists.

In some embodiments, the instructional content 607 may be determined by parsing the assigned task 606 using natural language processing (NLP) techniques to extract key service parameters, such as component type (AC unit 605), identified issue (filter replacement), and required actions (repair, maintenance, inspection). The AI engine may reference a centralized instructional content repository, a localized device cache, or cloud-accessible databases to locate the instructional content 607 best matching the assigned service task 606. Upon identification, the instructional content 607 may be automatically downloaded and preloaded into the memory of the second user device 602A, allowing the second user 602 to access the necessary resources even in environments with limited or intermittent network connectivity.

In an exemplary embodiment depicted in FIG. 6B, the instructional content 607 may be preloaded into the second user device 602A based on geolocation and movement tracking. As the second user 602 approaches the physical location of the building corresponding to the digital representation 603, the controller 604 may determine, based on GPS data, indoor positioning systems, Bluetooth beacons, or Wi-Fi triangulation, that the service personnel 602 is within proximity of the assigned component or building. Upon detecting the approach, the system 600 triggers a preload command 610, transferring the instructional content 607 related to the assigned component (605) to a readily accessible memory partition of the second user device 602A.

This proactive preloading 610 facilitates that the second user 602 has uninterrupted access to vital instructional material immediately upon arrival at the service site, without needing to initiate manual searches or wait for data retrieval over possibly constrained mobile networks. The preloading 610 process may further tailor the instructional content 607 by dynamically adapting to the second user 602's device capabilities, such as optimizing video formats, compressing files, or converting documents into offline-viewable formats compatible with the second user device 602A.

As the second user 602 engages with the physical AC unit 605, the preloaded instructional content 607, comprising visual cues, animated walkthroughs, step-by-step procedures, or schematic diagrams, may be accessed directly via the user interface of the second user device 602A. In some embodiments, augmented reality (AR) features may overlay maintenance instructions onto the live camera feed of the AC unit 605 through the second user device 602A, guiding the second user 602 interactively through the repair or replacement procedure. In other embodiments, voice-assisted instructions may be available, allowing the second user 602 to receive auditory prompts while keeping hands free for physical operations.

The assigned work 606 and the instructional content 607 may be synchronized with back-end maintenance management systems to automatically update work order statuses, log service times, and capture completion evidence. In some cases, after completion of the repair or maintenance action, the second user 602 may upload completion notes, post-service images, or video confirmations through the second user device 602A, which may be archived within the centralized database for future reference, compliance documentation, or performance analytics.

The controller 604 may also log metadata relating to service actions, such as the exact timestamp when the second user 602 arrived onsite, the duration of the repair task, the instructional content 607 accessed, and any deviations recorded from standard procedures. This metadata can later be used to perform statistical analysis, optimize maintenance schedules, forecast part replacements, or assess technician training needs based on service performance trends.

In additional embodiments, the instructional content 607 preloaded to the second user device 602A may be dynamically updated during the course of the assigned task if new information becomes available, such as revised manufacturer instructions, updated safety warnings, or availability of a new repair method. In such cases, the controller 604 may issue real-time content refresh prompts to the second user device 602A without disrupting the workflow of the second user 602.

Moreover, the system 600 may support differentiated levels of instructional content 607 based on the skill level or certification status of the second user 602. For example, apprentice-level personnel may be provided with highly detailed, annotated guides and basic troubleshooting checklists, whereas experienced technicians may be provided with concise quick-reference summaries tailored for efficiency. In some implementations, the preloading mechanism 610 may personalize the instructional content 607 based on the historical service records, certifications, and user preferences associated with the second user 602.

In still further embodiments, the assignment of tasks 606 and preloading 610 of instructional content 607 may incorporate predictive analytics, wherein the system 600 forecasts service needs based on historical maintenance patterns, sensor readings, or AI-based failure predictions. In such predictive models, the instructional content 607 may be pre-identified and cached even before a formal service ticket is generated, thereby reducing response times and improving building system uptime.

The instructional content 607 accessed by the second user 602 may also include diagnostic tools embedded within the digital content, such as interactive fault trees, decision-support wizards, virtual simulations, or self-assessment checklists that help confirm diagnosis before physical intervention begins. In augmented embodiments, the second user device 602A may also facilitate live collaboration with remote experts during task execution, allowing the second user 602 to initiate video calls, share live feeds, and receive real-time feedback while executing repairs or maintenance actions.

In an alternative embodiment, the system 600 may support batch assignments, where the first user 601 assigns a group of related service tasks (e.g., replacing air filters in multiple AC units 605 across different floors) to the second user 602, and the controller 604 systematically preloads instructional content 607 relevant to each assigned unit. The user interface of the second user device 602A may organize the tasks and instructional content into a prioritized to-do list, with geolocation-optimized routing to minimize travel times between service points.

In some cases, the instructional content 607 may be linked with digital asset management (DAM) systems to retrieve component-specific documentation, warranty statuses, manufacturer part catalogs, or procurement links, allowing the second user 602 to request spare parts or replacements seamlessly from the field. In other embodiments, the system 600 may be integrated with augmented inspection tools where, upon completing the assigned task 606, the second user 602 is prompted to perform validation checks, document before-and-after states, and confirm operational performance through test protocols included within the instructional content 607.

Figure 7A:
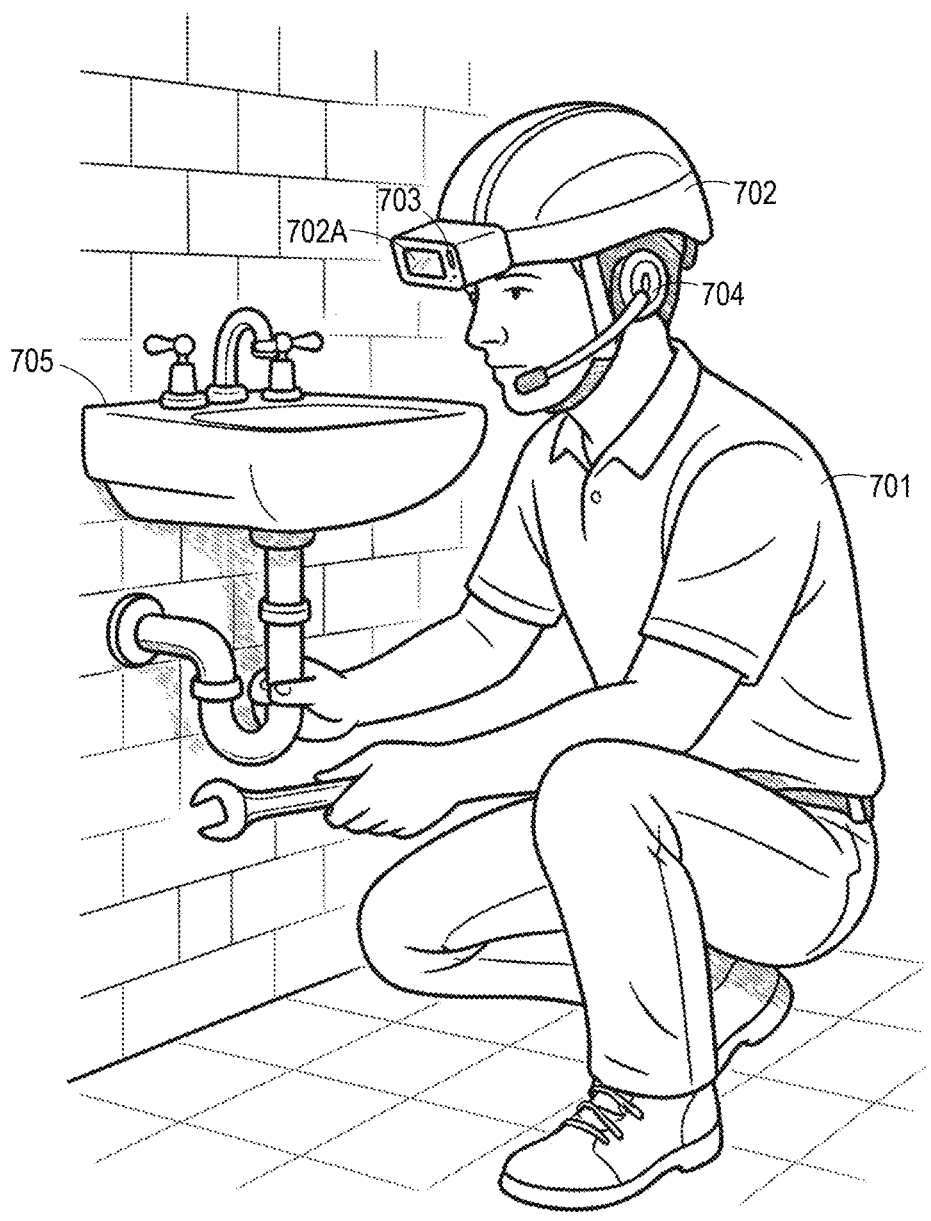
FIGS. 7A-7C illustrate an exemplary system for guiding service personnel during maintenance and repair operations using wearable devices configured to display context-specific instructional content, including visual overlays and location-based information derived from a building design plan.
Figure 7B:
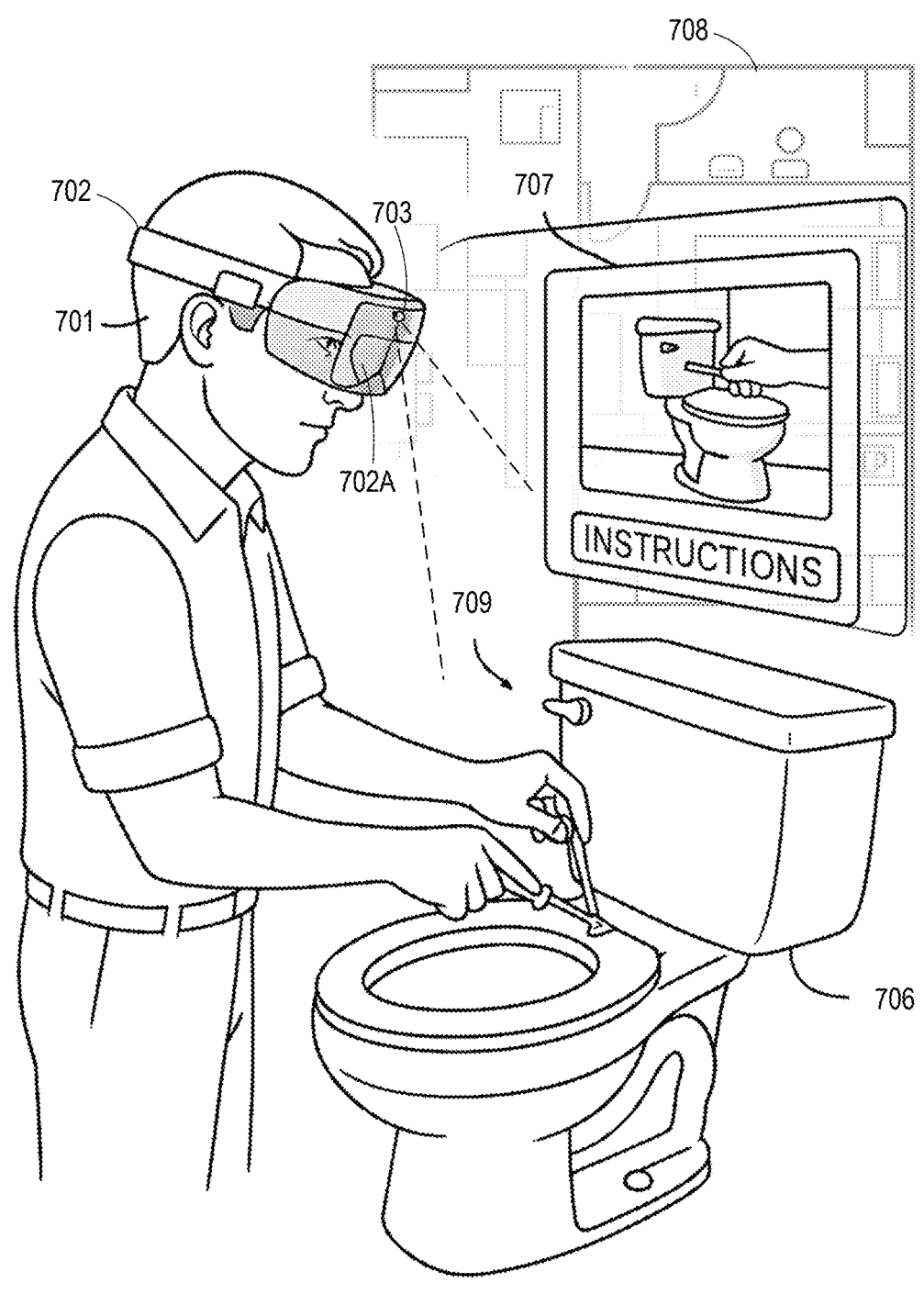
Figure 7C:
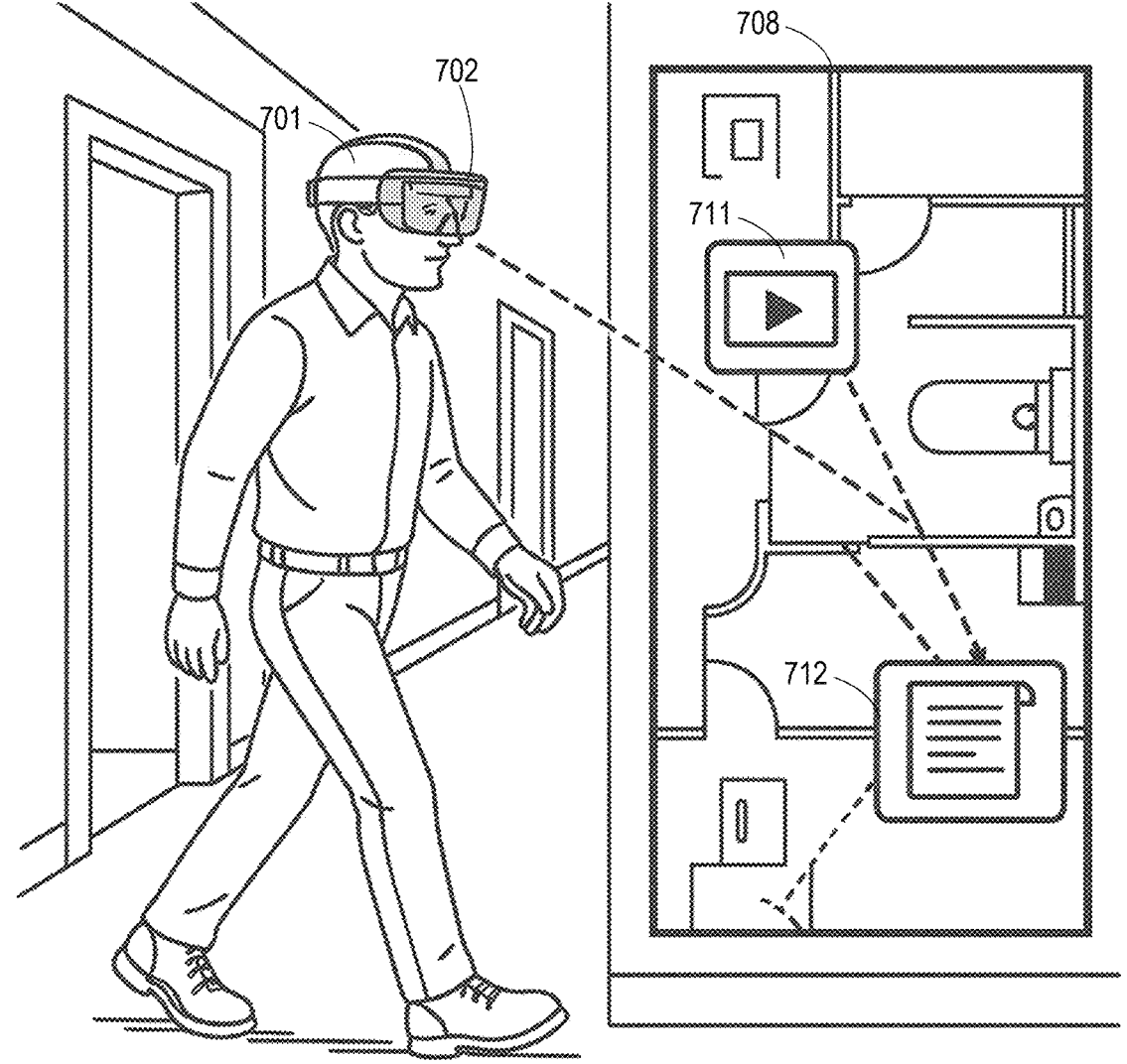

Referring now to FIGS. 7A-7C, exemplary systems are illustrated for assisting service personnel during installation, maintenance and repair operations using wearable devices configured to provide real-time instructional content tailored to specific tasks and building environments, in accordance with some embodiments of the present invention. FIG. 7A depicts a service personnel 701 engaged in repair work, wearing a head-mounted device (HMD) 702 configured for interactive guidance. The HMD 702 may be structured with multiple functional components including a display 702A positioned in the user's field of vision, a camera 703 for real-time visual data capture, and a speaker-microphone combination 704 facilitating verbal communication between the user and a remote or onboard AI engine.

The HMD 702 worn by the service personnel 701 may incorporate a compact controller, such as a microprocessor running an AI engine configured for task analysis and guidance generation. Additional components housed within the HMD 702 may include integrated circuits (ICs) for processing operations, communication modules for establishing wired or wireless connectivity (e.g., Wi-Fi, Bluetooth, 5G), and an onboard power source such as a rechargeable battery. These systems enable the HMD 702 to operate in a standalone manner or in connection with cloud servers through secure communication protocols.

As further illustrated in FIG. 7A, the service personnel 701 is depicted repairing a sink 705. The camera 703, integrated into the HMD 702, may capture real-time visual data of the work area surrounding the sink 705, transmitting the captured feed either to an onboard AI engine or to a cloud-based server environment hosting an AI analysis engine. The AI engine may apply computer vision techniques, such as image recognition, pattern analysis, and activity tracking, to infer the stage of repair work being conducted by the service personnel 701.

The speaker-microphone combination 704 integrated with the HMD 702 allows the service personnel 701 to engage in real-time verbal communication with the AI engine. For example, the service personnel 701 may issue voice commands to request specific instructional content, clarification on procedures, request a checklist for the sink component 705, or even seek live assistance through audio prompts. The AI engine, in response, may provide step-by-step voice-guided instructions based on the captured working context.

In some embodiments, the system may utilize natural language processing (NLP) to parse verbal queries issued by the service personnel 701, dynamically adjusting the instructional support provided through auditory or visual means on the display 702A. This interaction allows hands-free operation, which may particularly be beneficial during mechanical or plumbing repair tasks requiring the service personnel's full physical engagement.

Referring now to FIG. 7B, the service personnel 701 continues repair operations, but the HMD 702 is now depicted as displaying visual instructional content via the display 702A. The example illustrates a scenario where the service personnel 701 is engaged in servicing a water closet 709 associated with a water tank 706. The display 702A of the HMD 702 may project a repair video 707 showing step-by-step instructions on how to address a leakage issue within the water tank 706.

In such embodiments, the AI engine may retrieve the instructional video 707 based on real-time context analysis-identifying that the service personnel 701 is located near the water tank 706 by comparing visual cues captured by the camera 703 to a stored database of design elements associated with a digital representation 708 of the building layout. The digital plan 708 may be updated dynamically with positional data, allowing the system to predict and prepare relevant instructional material as the service personnel 701 approaches specific components.

The system may allow the display 702A to present the instructional content 707 in an augmented reality (AR) format, superimposing visual overlays directly onto the real-world view of the water closet 709 through the lens of the HMD 702. Such overlays may include animated arrows indicating unscrewing sequences, color-coded regions highlighting areas requiring attention, and textual annotations describing each procedural step.

The augmented instructional content 707 displayed on the display 702A may further include interactive features, such as touch or gesture-responsive virtual buttons, enabling the service personnel 701 to pause, rewind, or advance through procedural videos without needing to disengage from the repair task at hand.

The service personnel 701 may be able to simultaneously view the physical environment (e.g., the water closet 709) while receiving contextual instructional cues projected via the display 702A, thereby promoting efficient and accurate task execution without the need to consult separate manuals, mobile devices, or printed schematics.

In some embodiments, the system may utilize sensor fusion techniques combining camera 703 data, gyroscope, accelerometer, and magnetometer data from the HMD 702 to track the service personnel's head movement and gaze direction. This tracking enables dynamic adjustment of AR content to stay aligned with the physical component being repaired.

Referring now to FIG. 7C, an additional use case is illustrated where the service personnel 701 is navigating a building interior while wearing the HMD 702. The digital representation 708 of the building is projected onto the display 702A, allowing the service personnel 701 to visualize spatial markers corresponding to service tasks. Markers 711 and 712 are depicted, representing preloaded instructional content associated with different service tasks.

In some embodiments, the system's AI engine may proactively determine task sequencing based on spatial relationships among service tasks. For example, if the service personnel 701 is assigned both pipeline maintenance and water closet repair within the building, the AI engine may analyze building layout data and recommend that the pipeline maintenance task be completed first if it is logically or physically prerequisite to the water closet repair.

The AI engine may monitor the service personnel's movement within the building using GPS (for large spaces), indoor positioning systems (e.g., Wi-Fi triangulation, BLE beacons), or visual odometry techniques using the camera 703 to infer location based on environmental features recognized from the digital map 708.

The system may preload instructional content 711 and 712 based on proximity predictions. For example, if the service personnel 701 is approaching a maintenance location, the system may preload corresponding video tutorials, part lists, torque specifications, or troubleshooting checklists to the local storage of the HMD 702 to minimize latency when content access is needed.

In addition to location-based preloading, the system may factor in task urgency, dependencies, and available tools listed for each service task to optimize the order of task execution and instructional content presentation.

In some embodiments, preloaded instructional content 711 and 712 may be tagged with metadata specifying the estimated task time, complexity rating, required equipment, and potential hazards. This information may be selectively displayed based on user preference or AI determination of information relevance.

The system may also adaptively manage the instructional content display modality based on the operational context. For example, if the service personnel 701 is stationary and focused on a complex repair, the HMD 702 may present detailed video walkthroughs; if the service personnel 701 is moving between locations, simplified text prompts or map-based wayfinding cues may be emphasized.

In another embodiment, the AI engine may infer the service personnel's working efficiency or task comprehension level based on motion analysis (e.g., hand movements captured by camera 703), and dynamically adjust the depth and pace of instructional content accordingly.

The HMD 702 may further allow the service personnel 701 to capture snapshots or short video clips of their progress through a simple verbal command or a minimal-touch gesture, automatically associating captured media with the corresponding design element in the digital building representation 708.

Captured work progress imagery may be uploaded to a central server where supervisors or maintenance managers can perform remote verification of completed tasks, thus enabling semi-autonomous task monitoring and quality assurance workflows.

In certain embodiments, the AI engine may trigger prompts asking the service personnel 701 to verify component identifiers (e.g., serial numbers, barcodes) or installation labels through the camera 703, cross-referencing detected identifiers with service records for validation.

Voice recognition capabilities integrated with the HMD 702 may allow the service personnel 701 to verbally log work completion notes, parts used, or unexpected conditions encountered, thus minimizing disruption and enabling comprehensive recordkeeping.

The service personnel 701 may receive real-time alerts if the AI engine detects operational anomalies during the repair work, such as component misalignment, incorrect tool usage, or improper torque application based on visual analysis of the captured workstream.

Instructional content 711 and 712 may optionally include embedded safety prompts, reminding the service personnel 701 to perform specific actions such as isolating electrical circuits, using personal protective equipment (PPE), or conducting leak tests post-repair.

In some embodiments, when multiple service personnel are collaborating on different parts of the same building system, their HMDs 702 may synchronize their local maps, allowing real-time team awareness and coordination assistance through shared annotations or alerts.

The AI engine may optionally maintain a real-time service log correlating time-stamped actions performed by the service personnel 701 with the accessed instructional content 711, 712, thereby building an auditable record of procedural compliance and knowledge flow.

Such records may be leveraged for continuous improvement of instructional content, retraining of AI models, staff training evaluation, and optimization of future maintenance scheduling.

Figure 8:
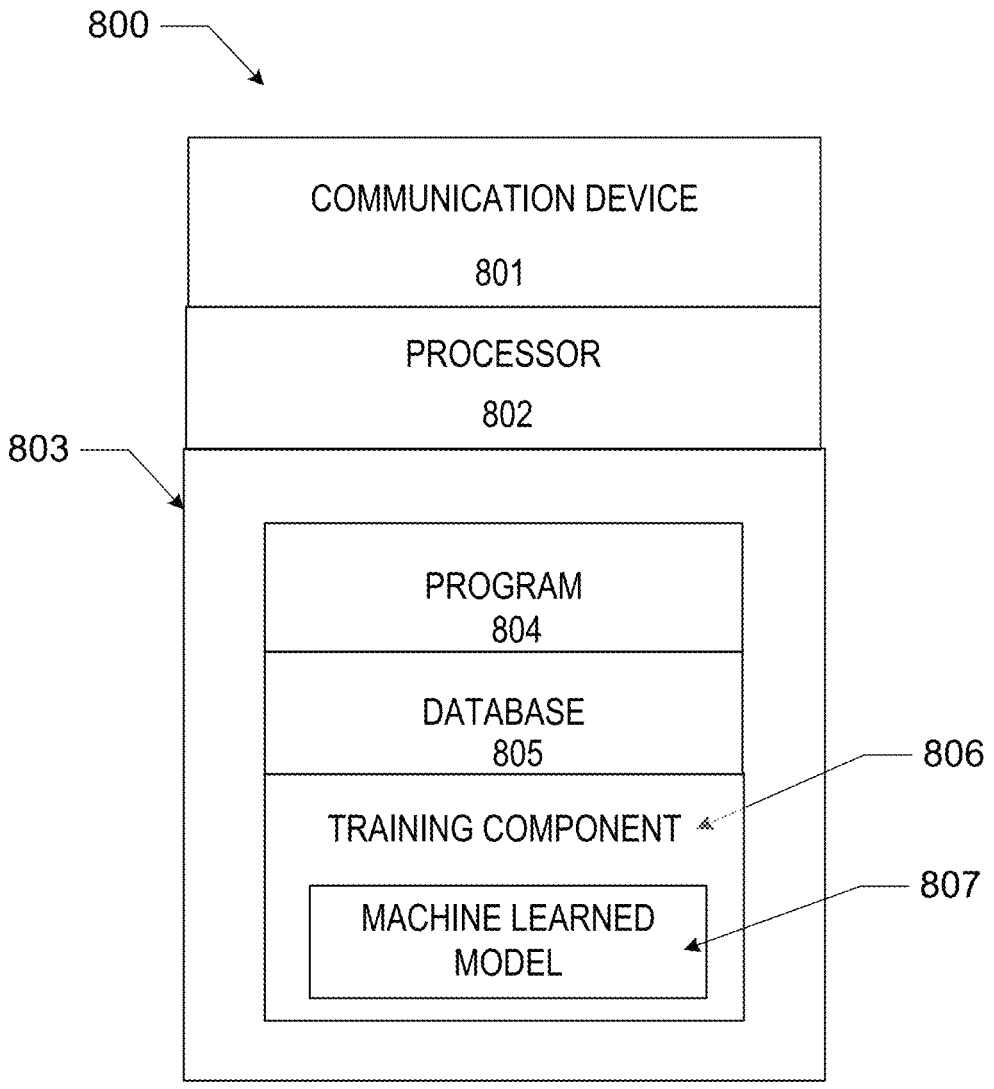
FIG. 8 illustrates exemplary processor architecture for use with the present disclosure.

Referring now to FIG. 8, an automated controller is illustrated that may be used to implement various aspects of the present disclosure, in various embodiments, and for various aspects of the present disclosure, controller 800 may be included in one or more of: a wireless tablet or handheld device, a server, a rack mounted processor unit. The controller may be included in one or more of the apparatuses described above, such as a Server, and a Network Access Device. The controller 800 includes a processor unit 802, such as one or more semiconductor-based processors, coupled to a communication device 801 configured to communicate via a communication network (not shown in FIG. 8). The communication device 801 may be used to communicate, for example, with one or more online devices, such as a personal computer, laptop, or a handheld device.

The processor 802 is also in communication with a storage device 803. The storage device 803 may comprise any appropriate information storage device, including combinations of magnetic storage devices (e.g., magnetic tape and hard disk drives), optical storage devices, and/or semiconductor memory devices such as Random Access Memory (RAM) devices and Read Only Memory (ROM) devices.

The storage device 803 can store a software program 804 with executable logic for controlling the processor 802. The processor 802 performs instructions of the software program 804, and thereby operates in accordance with the present disclosure. In some embodiments, the processor may be supplemented with a specialized processor for AI related processing. The processor 802 may also cause the communication device 801 to transmit information, including, in some instances, control commands to operate apparatus to implement the processes described above. The storage device 803 can additionally store related data in a database 805. The processor and storage devices may access an AI training component 806 and database, as needed which may also include storage of machine-learned models 807.

Figure 9:
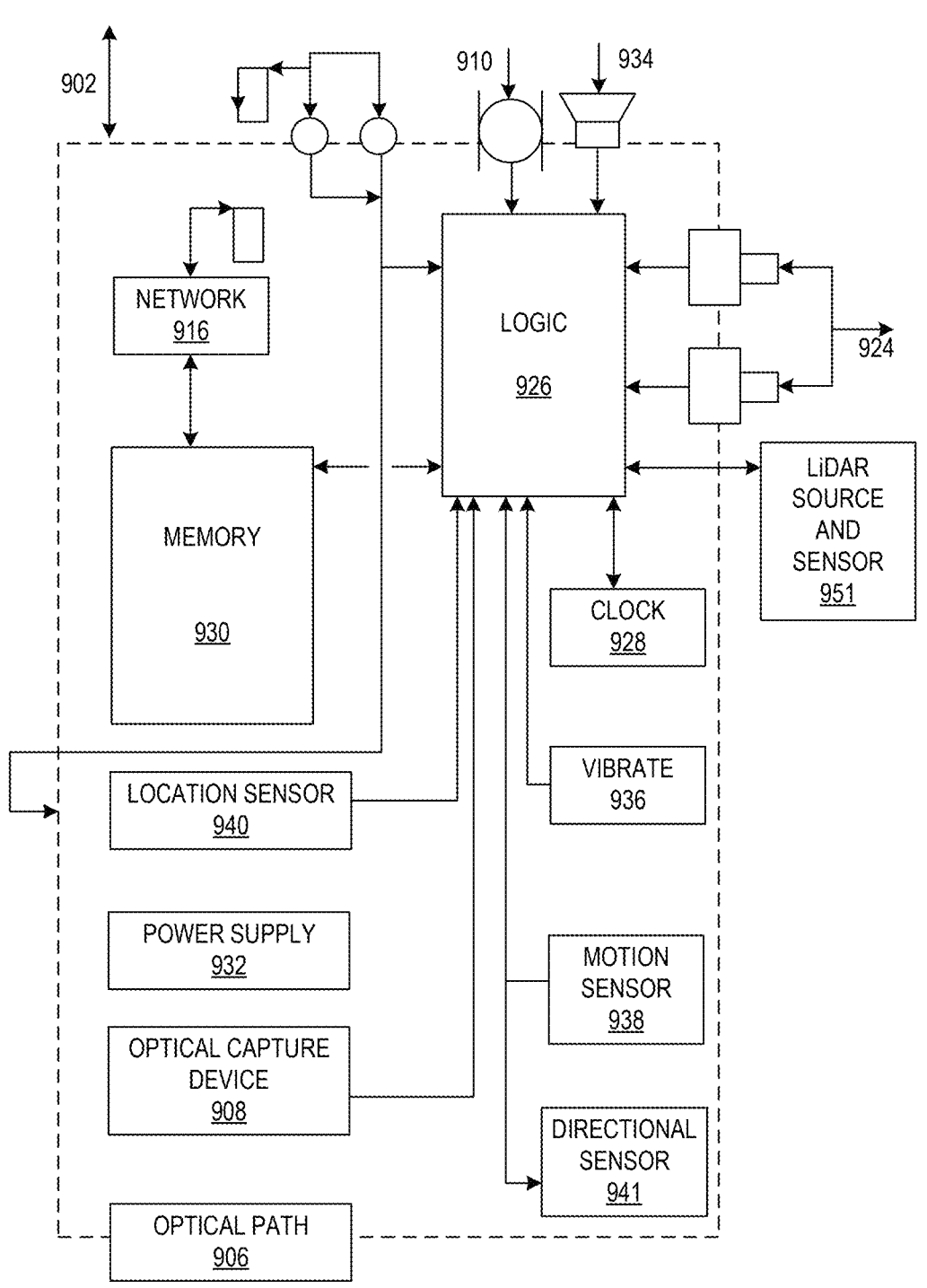
FIG. 9 illustrates exemplary mobile device architecture for use with the present disclosure.

Referring now to FIG. 9, a block diagram of an exemplary mobile device 902 is illustrated. The mobile device 902 comprises an optical capture device 908 to capture an image and convert it to machine-compatible data, and an optical path 906, typically a lens, an aperture, or an image conduit to convey the image from the rendered document to the optical capture device 908. The optical capture device 908 may incorporate a Charge-Coupled Device (CCD), a Complementary Metal Oxide Semiconductor (CMOS) imaging device, or an optical Sensor 924 of another type.

A microphone 910 and associated circuitry may convert the sound of the environment, including spoken words, into machine-compatible signals. The microphone 910 may also be utilized by users to provide audio annotations (or for speech-to-text annotations) of the present invention. Input facilities may exist in the form of buttons, scroll wheels, or other tactile Sensors such as touchpads. In some embodiments, input facilities may include a touchscreen display.

Visual feedback to the user is possible through a visual display, touchscreen display, or indicator lights. Audible feedback 934 may come from a loudspeaker or other audio transducer. Tactile feedback may come from a vibrate module 936.

A motion Sensor 938 and associated circuitry convert the motion of the mobile device 902 into machine-compatible signals. The motion Sensor 938 may comprise an accelerometer that may be used to sense measurable physical acceleration, orientation, vibration, and other movements. In some embodiments, motion Sensor 938 may include a gyroscope or other device to sense different motions.

A location Sensor 940 and associated circuitry may be used to determine the location of the device. The location Sensor 940 may detect Global Position System (GPS) radio signals from satellites or may also use assisted GPS where the mobile device may use a cellular network to decrease the time required to determine location.

The mobile device 902 comprises logic 926 to interact with the various other components, possibly processing the received signals into different formats and/or interpretations. Logic 926 may be operable to read and write data and program instructions stored in associated storage or memory 930 such as RAM, ROM, flash, or other suitable memory. It may read a time signal from the clock unit 928. In some embodiments, the mobile device 902 may have an on-board power supply 932. In other embodiments, the mobile device 902 may be powered from a tethered connection to another device, such as a Universal Serial Bus (USB) connection.

The mobile device 902 also includes a network interface 916 to communicate data to a network and/or an associated computing device. Network interface 916 may provide two-way data communication. For example, network interface 916 may operate according to the internet protocol. As another example, network interface 916 may be a local area network (LAN) card allowing a data communication connection to a compatible LAN. As another example, network interface 916 may be a cellular antenna and associated circuitry which may allow the mobile device to communicate over standard wireless data communication networks. In some implementations, network interface 916 may include a Universal Serial Bus (USB) to supply power or transmit data. In some embodiments, other wireless links may also be implemented.

As an example of one use of mobile device 902, a reader may scan an input drawing with the mobile device 902. In some embodiments, the scan may include a bit-mapped image via the optical capture device 908. Logic 926 causes the bit-mapped image to be stored in memory 930 with an associated timestamp read from the clock unit 928. Logic 926 may also perform optical character recognition (OCR) or other post-scan processing on the bit-mapped image to convert it to text.

A directional sensor 941 may also be incorporated into the mobile device 902. The directional device may be a compass and be based upon a magnetic reading or based upon network settings.

A LIDAR sensing system 951 may also be incorporated into the mobile device 902. The LiDAR system may include a scannable laser light (or other collimated) light source which may operate at nonvisible wavelengths such as in the infrared. An associated sensor device, sensitive to the light of emission may be included in the system to record time and strength of returned signal that is reflected off of surfaces in the environment of the mobile device 902. In some embodiments, as have been described herein, a 2-dimensional drawing or representation may be used as the input data source and vector representations in various forms may be utilized as a fundamental or alternative input data source. Moreover, in some embodiments, files which may be classified as BIM input files may be directly used as a source on which method steps may be performed. BIM and CAD file formats may include, by way of non-limiting example, one or more of: BIM, RVT, NWD, DWG, IFC and COBie. Features in the BIM or CAD datafile may already have defined boundary aspects having innate definitions such as walls and ceilings and the like. An interactive user interface may be generated that receives input from a user indicating a user choice of types of innate boundary aspects a user provides instruction to the controller to perform subsequent processing on.

In some embodiments, a controller may receive user input enabling input data from either a design plan format or similar such formats, or also allow the user to access BIM or CAD formats. Artificial intelligence may be used to assess boundaries in different manners depending on the type of input data that is initially inputted. Subsequently, similar processing may be performed to segment defined spaces in useable manners as have been discussed. The segmented spaces may also be processed to determine classifications of the spaces.

As has been described, a system may operate (and AI Training aspects may be focused upon) recognition of lines or vectors as a basic element within an input design plan. However, in some embodiments, other elements may be used as a fundamental element, such as, for example, a polygon and/or series of polygons. The one or more polygons may be assembled to define an area with a boundary, as compared, in some embodiments, with an assembly of line segments or vectors, which together may define a boundary which may be used to define an area. Polygons may include different vertices; however common examples may include triangular facets and quadrilateral polygons. In some embodiments, AI training may be carried out with a singular type of polygonal primitive element (e.g., rectangles), other embodiments will use a more sophisticated model. In some other examples, AI engine training may involve characterizing spaces where the algorithms are allowed to access multiple diverse types of polygons simultaneously. In some embodiments, a system may be allowed to represent boundary conditions as combinations of both polygons and line elements or vectors.

Depending upon one or more factors, such as processing time, a complexity of the feature spaces defined, and a purpose for AI analysis, simplification protocols may be performed as have been described herein. In some embodiments, object recognition, space definition or general simplification may be aided by various object recognition algorithms. In some embodiments, Hough type algorithms may be used to extract diverse types of features from a representation of a space. In other examples, Watershed algorithms may be useful to infer division boundaries between segmented spaces. Other feature recognition algorithms may be useful in determining boundary definitions from building drawings or representations.

In some embodiments, the user may be given access to movement of boundary elements and vertices of boundary elements. In examples where lines or vectors are used to represent boundaries and surrounding areas, a user may move vertices between lines or center points of lines (which may move multiple vertices). In other examples, elements of polygons such as the user may move vertices, sides, and center points. In some embodiments, the determined elements of the space representation may be bundled together in a single layer. In other examples, multiple layers may be used to distinguish distinct aspects. For example, one layer may include the AI optimized boundary elements, another layer may represent area and segmentation aspects, and still another layer may include object elements. In some embodiments, when the user moves an element such as a vertex the effects may be limited only to elements within its own layer. In some examples, a user may elect to move multiple or all layers in an equivalent manner. In still further examples, all elements may be assigned to a single layer and treated equivalently. In some embodiments, users may be given multiple menu options to select disparate elements for processing and adjustment. Features of elements such as color and shading and stylizing aspects may be user selectable. A user may be presented with a user interface that includes dynamic representations of a feature, or other aspects of a design plan, and associated values and changes may be input by a user. In some embodiments, an algorithm and processor may present to the user comparisons of various aspects within a single model or between different models. Accordingly, in various embodiments, a controller and a user may manipulate aspects of a user interface and AI engine.

Referring now to FIGS. 10A-10B, an exemplary flowchart 1000 is illustrated depicting method steps 1001-1015 that may be executed in some embodiments of the present invention. The method steps of flowchart 1000 describe a process for dynamically associating, customizing, and delivering instructional content corresponding to design elements identified within a building design plan. The flowchart 1000 illustrates a sequence of operations that may be performed by a controller operating an artificial intelligence engine to receive a design plan, identify design elements, search or generate instructional content, display associated indicators within an interactive user interface, and deliver the instructional content to a user based on received prompts or interactions.

At step 1001, the process begins by receiving into a controller a first two-dimensional representation of at least a portion of a building. This two-dimensional representation may come from a variety of sources, including a design file from a CAD system, a scanned architectural drawing, or even a hand-drawn sketch. For example, a user may submit a blueprint of a residential building or a commercial floor plan. This step is the starting point where the controller accesses the design that forms the basis of all further modifications and analysis. The input file can be in various formats, such as DWG, DXF, PDF, JPEG, or even TIFF, representing different types of drawings, including technical schematics or hand-rendered layouts. This initial submission is vital for the controller's analysis because it provides the spatial framework, dimensions, and elements that the system will work with throughout the process.

At step 1002, the controller processes the received two-dimensional representation by converting it into a raster image. This conversion is important when the input file is in vector format, such as a DWG or DXF file, which stores data as geometric shapes, lines, and curves. Rasterization turns these elements into pixels, allowing the controller to work with a detailed grid-based representation of the design. This step is important for enabling the AI engine to interpret the design in a way that supports component recognition, boundary formation, and further manipulation of the design. For example, if the design includes multiple walls and doorways in vector format, they will be translated into a raster image composed of pixels that represent those elements. This step enables the system to analyze the plan as an image, which becomes the basis for AI-driven analysis in subsequent steps.

At step 1003, the controller employs an artificial intelligence engine to analyze the rasterized image and identify architectural components. These components may include elements such as walls, doors, windows, columns, and other features present in the design. For example, if the input file contains a blueprint of a house, the AI engine recognizes where walls begin and end, the placement of windows, and the dimensions of rooms. This process may involve segmentation techniques where the AI divides the image into distinct regions based on pixel patterns and contrast. This segmentation allows the system to discern individual components in the design and associate them with specific architectural elements. The system may also rely on a pre-trained model, which has been trained on thousands of architectural designs to recognize common features. Once the components are identified, they are tagged and categorized for use in later steps.

At step 1004, the system determines the scale of the components identified in the two-dimensional representation. Scaling is important because architectural drawings are often reduced or enlarged for presentation purposes, and the system needs to work with real-world dimensions. The controller may extract scale information directly from the input file, such as a dimension line or a scale bar included in the original drawing. If no scale information is present, the user may be prompted to provide known dimensions, such as the width of a doorway or the length of a wall. For example, the user could input that a doorway is three feet wide, and the system would use that information to proportionally calculate the size of all other elements in the design. This step is important to converting pixel-based data into accurate real-world measurements, allowing the system to manipulate the design with precision.

At step 1005, the controller arranges the identified components into a user interface to form boundaries between various spaces in the design. For example, walls identified by the AI engine in step 1003 are used to define the boundaries of rooms, hallways, and other architectural spaces. These boundaries are presented in the user interface, allowing the user to visualize how the different components relate to each other spatially. For example, in the design of an office floor plan, the system would use wall elements to separate individual office spaces, meeting rooms, and common areas. These boundaries are dynamic and can be adjusted by the user if needed. The user can interact with the interface by selecting boundaries to modify them, such as moving a wall or expanding a room, and the system will automatically update the design in real time based on those inputs.

At step 1006, the system generates an area for a feature based upon the boundaries that have been formed. Once the boundaries of rooms, hallways, and other spaces are defined, the system calculates the area of each enclosed space. For example, in a residential floor plan, the system will calculate the square footage of each bedroom, living area, kitchen, and other rooms. This information is important for both the user and the system, as it provides real-time feedback about the dimensions and proportions of spaces within the design. The system can use this area information to facilitate that the design adheres to user-specified requirements or spatial constraints, such as facilitating that a room meets minimum size requirements for comfort or function. The user can then adjust the layout if the calculated areas do not meet their expectations.

At step 1007, the system goes further to generate the length and/or area of a feature based upon a formed boundary. In this step, the system provides detailed dimensions for individual elements within the design. For example, the system may calculate the length of a hallway, or the area of a patio, based on the boundaries formed in the previous steps. If the design includes special features such as curved walls or non-rectangular rooms, the system will use advanced algorithms to calculate the precise area and length of those features. This allows the user to gain a more comprehensive understanding of the design and make any important modifications. The system also provides measurements for specific architectural details, such as the width of doorways, the height of ceilings, or the surface area of windows, giving the user the detailed information needed to refine the design.

At step 1008, user modifications to the generated boundaries or identified features are received through the user interface. The interactive user interface presented to the user enables selection, adjustment, or creation of new boundaries or adjustment of existing detected components in the received design plan. For example, a user such as an architect or a field engineer may modify the AI-detected outline of a kitchen space by dragging one or more boundary lines to align better with the true walls visible in the 2D representation. The system records the user-adjusted coordinates or vector data corresponding to the modified boundaries, thereby enabling further processing based on the realigned geometry.

At step 1009, the controller dynamically recalculates the length and/or area of the features based on the user-modified boundaries. Once the user adjusts one or more boundary lines, the artificial intelligence engine automatically recomputes the associated dimensional properties, including perimeter, surface area, and feature ratios. For example, if a user shifts a boundary wall outward by three feet, the recalculated area for a living room or a bedroom is automatically updated in real-time. This dynamic recalculation enables immediate feedback to the user regarding how their adjustments impact measurements and overall building layout dimensions.

At step 1010, the controller associates the modified boundaries with corresponding structural or functional metadata derived from a component database. Upon finalization of the modified boundaries, the system retrieves metadata associated with the adjusted features, such as component type (e.g., load-bearing wall, partition wall, door, window), material requirements (e.g., drywall, reinforced concrete), applicable building codes, and associated installation or maintenance procedures. For example, a modified boundary identified as a structural wall could trigger metadata indicating the minimum thickness requirements based on national or local construction standards, as retrieved from a compliance or component database stored locally or on a cloud server.

At step 1011, the controller displays the modified boundaries and associated metadata in the interactive user interface. The recalculated measurements and linked metadata are overlaid or displayed adjacent to the respective design elements within the interface. For example, when a user taps on a resized room boundary, a contextual popup may show details such as the new room dimensions, material estimates, associated load ratings, and any specific installation notes. This approach provides the user with immediate visibility into the implications of boundary modifications, promoting design integrity and regulatory compliance early in the building planning process.

At step 1012, the controller generates instructional content for the modified boundaries or features based on the associated metadata. Using the metadata linked to the modified features, the controller retrieves or dynamically generates specific instructional materials relevant to the feature's construction, installation, or maintenance. For example, for a newly defined mechanical room boundary, the controller may generate or retrieve step-by-step installation videos, HVAC layout specifications, or maintenance manuals tailored for the mechanical room layout and dimensions. This generation may be based on AI-driven matching or retrieval techniques utilizing a pre-curated instructional content library.

At step 1013, the controller updates the design plan to incorporate the user-modified boundaries and recalculated measurements. Once the modifications, recalculations, and associated metadata assignment are finalized, the design plan is updated in the system's internal storage. This update includes the revised geometry (in vector, CAD, or BIM-compatible formats), the recalculated area and perimeter measurements, and any associated instructional content links embedded into the updated plan. The update creates a dynamically modified, intelligent design plan that represents not only physical layouts but also a full set of associated procedural and instructional information ready for downstream use.

At step 1014, the updated design plan, boundaries, and associated instructional content are stored into a centralized database. The centralized database may be a local server, an enterprise storage system, or a cloud-based architecture that supports multi-user access, versioning control, and secure data backup. For example, an architecture firm working collaboratively across several locations may store updated design plans to a centralized repository that ensures all team members are accessing the latest annotated and dimensionally accurate design versions enriched with contextually linked instructional content.

At step 1015, the controller enables export of the updated design plan along with the calculated dimensions and associated instructional content. The export functionality allows the updated design plan to be converted into standardized formats such as PDF, DXF, RVT (Revit), IFC (Industry Foundation Classes), or proprietary formats containing embedded hyperlinks to instructional videos, manuals, and compliance guides. The exported design plan may be delivered to contractors, project managers, maintenance teams, or regulatory bodies, providing them not only with geometric layout data but also operational and instructional intelligence seamlessly tied to the respective design elements.

Figure 11:
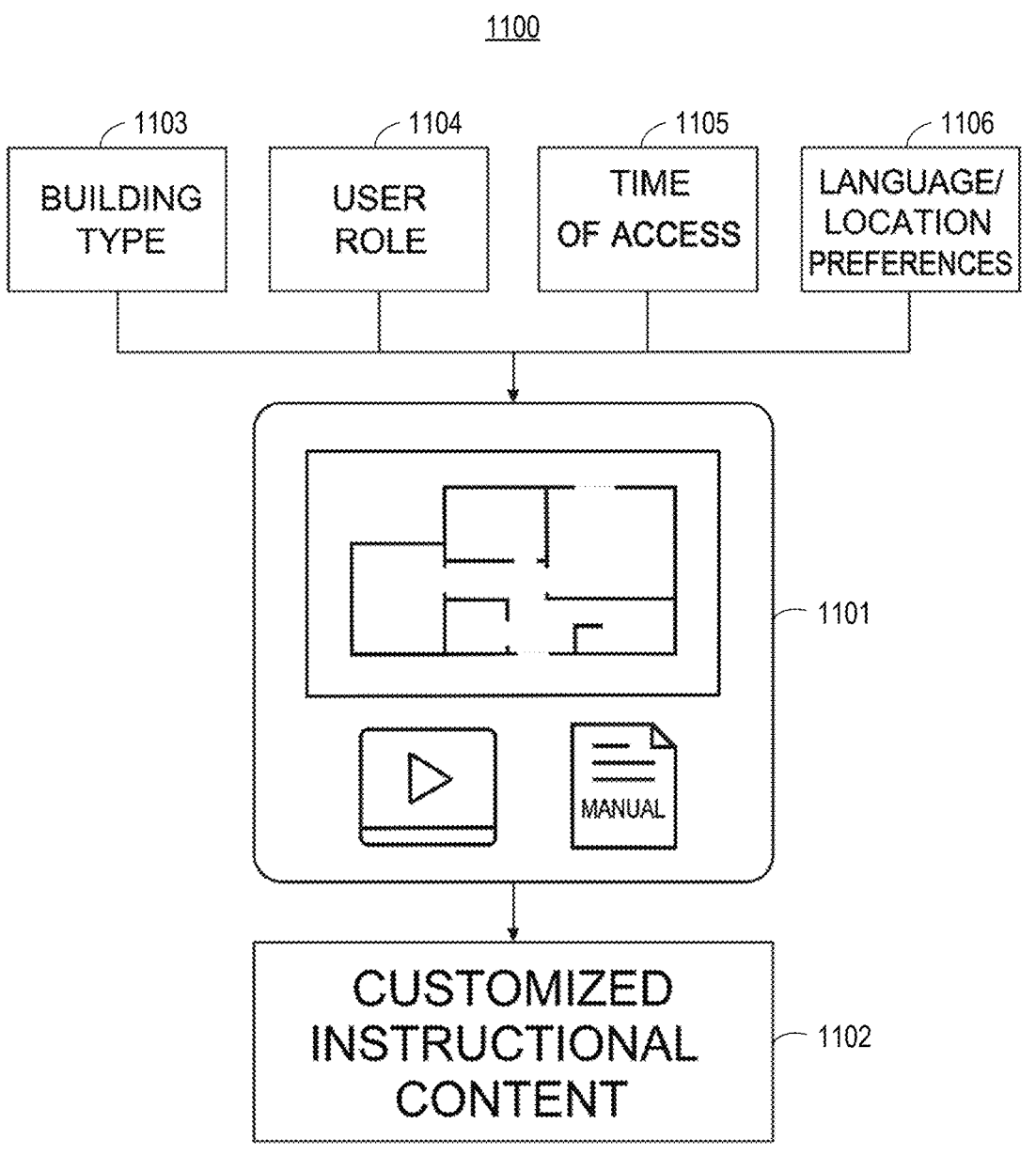
FIG. 11 illustrates an exemplary system for generating customized instructional content based on contextual parameters such as building type, user role, time of access, and language or location preferences, in accordance with some embodiments of the present invention.

Referring now to FIG. 11, an exemplary system 1100 is illustrated for dynamically generating customized instructional content 1102 based on multiple contextual parameters associated with a design plan 1101, in accordance with some embodiments of the present invention. The system 1100 operates through a controller, which may be integrated with or separate from a user device, the controller configured with an AI engine capable of processing the design plan 1101 alongside contextual information comprising building type 1103, user role 1104, time of access 1105, and language or location preferences 1106. The design plan 1101 may represent a two-dimensional (2D) or three-dimensional (3D) depiction of a building layout and may include marked design elements such as HVAC systems, plumbing fixtures, electrical panels, security devices, and other operational components.

In some embodiments, the building type 1103 may be determined automatically by the controller based on metadata embedded within the design plan 1101 itself. For example, design plans drafted using Building Information Modeling (BIM) standards often tag spaces with usage classifications such as "residential," "commercial," "health-care," "hospitality," or "industrial." The controller may parse such metadata to infer the building type 1103 without requiring explicit user input. In alternate embodiments, the building type 1103 may be determined based on manual input from a user at the time of uploading or accessing the design plan 1101, or by cross-referencing the building's postal address with publicly available records identifying the building's designated purpose.

The building type 1103 may influence the customized instructional content 1102 significantly. For example, for a residential building, instructional content 1102 associated with a heating, ventilation, and air conditioning (HVAC) unit may prioritize simplicity and safety instructions suitable for a homeowner, whereas in a hospital building, the corresponding instructional content 1102 for an HVAC unit may emphasize maintenance procedures compliant with sterile environment protocols and health safety standards.

Similarly, the user role 1104 may be determined by authenticating the user accessing the design plan 1101. The authentication process may involve credentials stored within an organizational database, role-based access control (RBAC) systems, or context-inferred roles based on the user's historical interaction patterns with the system. User roles 1104 may include classifications such as electrician, plumber, HVAC technician, apprentice, project manager, contractor, facility manager, or inspector, among others. In some embodiments, user roles 1104 may represent skill level or years of experience of a user and based on which, the AI engine may provide customized or personalized content to the user.

Customized instructional content 1102 may vary significantly based on the user role 1104. For example, an apprentice accessing the design plan 1101 may be presented with highly detailed instructional content 1102, including step-by-step videos, glossary terms, cautionary notes, and visual highlights, whereas a licensed electrician may receive condensed procedural diagrams with quick-reference data sheets linked to the same design element within the design plan 1101.

The time of access 1105 may be determined using system clocks synchronized with global time servers. The controller may analyze whether the instructional content 1102 request occurs during regular working hours, emergency service windows (e.g., overnight), or scheduled maintenance windows, and generate customized instructional content 1102 accordingly. Scheduled maintenance access may provide comprehensive procedures covering inspection, preventive maintenance, and full-component servicing, while emergency access during nighttime hours may emphasize temporary fixes, damage control steps, and expedited isolation procedures for rapid response.

In some embodiments, the time of access 1105 may also factor into seasonal variations in instructional content 1102. For example, HVAC system maintenance instructional content 1102 accessed during winter may prioritize heating system diagnostics, whereas access during summer may emphasize cooling system checks. Similarly, plumbing instructional content 1102 accessed in colder climates during winter may include freeze prevention techniques for exposed piping systems.

Language and location preferences 1106 may be determined either from the device settings of the accessing user, manually selected preferences at login, or by geolocation analysis using GPS, Wi-Fi triangulation, IP address mapping, or cellular tower triangulation. In embodiments where multiple users collaborate from diverse linguistic backgrounds, the system may generate multi-language instructional content 1102 adapted to each participant's language preference.

For example, a design plan 1101 accessed by a service team comprising English-speaking and Spanish-speaking personnel may present bilingual customized instructional content 1102 with language toggling options. In another embodiment, customized instructional content 1102 for a building located in France may automatically prioritize content in French and adapt to European Union-specific building standards, codes, and material specifications when applicable.

The customized instructional content 1102 may be generated by dynamically selecting, assembling, and presenting modular content elements from a centralized content repository maintained by the controller or a cloud server. These modular content elements may include installation guides, repair procedures, troubleshooting flowcharts, material specification sheets, regulatory compliance documentation, safety instruction videos, and augmented reality (AR) overlays tailored for real-time repair guidance.

Referring specifically to the design plan 1101 shown in FIG. 11, the plan may include graphical representations of walls, doors, fixtures, appliances, and mechanical systems, with digital markers linked to underlying instructional datasets. Upon accessing a specific marker, the controller dynamically generates the customized instructional content 1102 appropriate to the building type 1103, user role 1104, time of access 1105, and language/location preference 1106 parameters at that moment.

In certain embodiments, building type 1103 analysis may further distinguish between specialized subcategories such as data centers, cleanrooms, pharmaceutical laboratories, and critical infrastructure buildings. Customized instructional content 1102 for a data center HVAC system, for example, may focus on minimizing temperature fluctuations to protect server uptime and detailed monitoring of airflows to prevent localized hotspots.

Similarly, the controller may dynamically generate safety-specific instructional content 1102 based on building type 1103. For example, content for a healthcare facility may include infectious disease containment procedures during maintenance work on ventilation systems, while a chemical plant may trigger the inclusion of hazardous material handling guides in the customized instructional content 1102.

User role 1104 may influence not only the format but also the depth and complexity of instructional content 1102. A supervisor accessing a design plan 1101 may receive higher-level summary dashboards showing component service status, last maintenance dates, and compliance reports, whereas a service technician receives granular operational tasks with live sensor data feeds, technical blueprints, and live chat support links.

Instructional content 1102 may also be customized to different experience levels within the same user role 1104, with apprentices receiving more exhaustive learning modules while experienced personnel access streamlined, action-oriented guidance.

Time of access 1105 may additionally influence the recommended tools and parts highlighted within instructional content 1102. For example, if emergency access is detected, the controller may prioritize temporary fixes requiring minimal specialized tools, whereas during a scheduled maintenance window, the controller may recommend comprehensive toolkits and thorough part replacements.

Language/location preferences 1106 may also tailor measurement systems and units displayed in the instructional content 1102. For example, content for users located in the United States may use imperial units (e.g., inches, feet), whereas content for users in Europe or Asia may be adapted to metric units (e.g., millimeters, meters) automatically.

Furthermore, location preference 1106 may trigger the inclusion of region-specific regulatory compliance procedures in the instructional content 1102. For example, plumbing repairs in California may require low-flow fixture compliance verification under CALGreen standards, which would be reflected in the content generated.

In advanced embodiments, the system 1100 may perform cross-referencing between the determined building type 1103 and user role 1104 to identify additional specialized instructional content 1102 needs. For example, an electrician accessing a design plan 1101 for a hospital may automatically receive infection control risk assessment (ICRA) procedures alongside standard electrical repair guides.

The instructional content 1102 may not be static but rather dynamically updated based on the real-time detection of updated best practices, manufacturer alerts, safety bulletins, or regulatory changes retrieved from external content feeds linked to the controller.

The generation of customized instructional content 1102 may further include dynamically embedding interactive multimedia elements such as AR overlays, simulation walk-throughs, 3D component visualizations, and real-time service logging tools into the user interface accessing the design plan 1101.

In embodiments supporting collaboration, customized instructional content 1102 may be further divided between users based on their individual parameters. For example, an HVAC technician and a plumber working on adjacent systems may each receive role-specific guidance customized to their needs while working off the same digital design plan 1101.

The AI engine generating customized instructional content 1102 may incorporate machine learning models trained on historical service records, user feedback, task completion times, and error rates to predict the most effective instructional format, sequence, and depth for each new service interaction.

Such predictive customization may prioritize presenting critical safety warnings upfront during high-risk tasks, summarize steps during low-risk tasks, and dynamically adjust content presentation as the user progresses through service steps in the field.

Additionally, the controller may recognize building operational schedules and time-critical constraints while generating customized instructional content 1102. For example, if the building type 1103 is a school, and access is occurring during school hours, the controller may recommend only low-noise, non-invasive maintenance actions for execution.

In some embodiments, customized instructional content 1102 may integrate proactive reminders for sustainability practices, such as recommending eco-friendly repair methods, energy-saving configuration settings, or responsible material disposal tips, particularly when building type 1103 or location preferences 1106 indicate green building certifications.

The design plan 1101 interface may feature an adaptive layout wherein instructional content 1102 modules are dynamically repositioned based on screen size, device type (e.g., tablet, smart glasses, large interactive display), and user accessibility needs, thereby enhancing usability in diverse operational environments.

Customized instructional content 1102 may also incorporate automatic task logging features that capture timestamps, user actions, equipment serial numbers scanned via device cameras, and completion verification images, all seamlessly linked back to the digital design plan 1101.

In some configurations, when the AI engine detects complex multi-stage service procedures based on user role 1104 and building type 1103, it may break down instructional content 1102 into progressive stages with checkpoints requiring user acknowledgment before proceeding.

The customized instructional content 1102 may also include "quick action" modules for common faults detected during access, enabling immediate response workflows, such as isolating electrical circuits, shutting off water valves, or triggering BMS alerts through a simple touch or verbal command.

Figure 12:
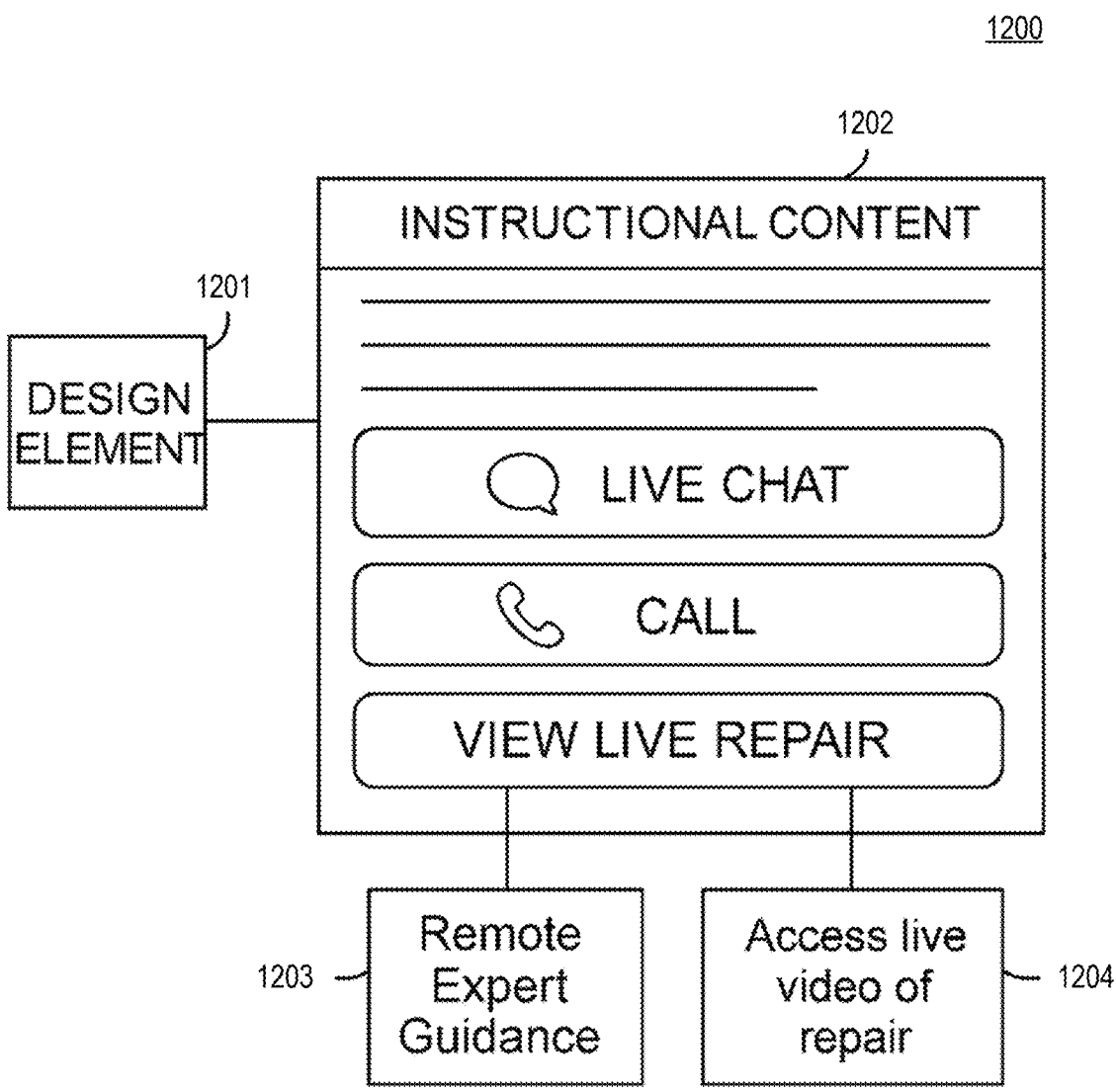
FIG. 12 illustrates an exemplary interface for interacting with a design element to access associated instructional content, including selectable options for facilitating remote expert guidance and real-time repair assistance, in accordance with some embodiments of the present invention.

Referring now to FIG. 12, an exemplary interface 1200 is illustrated for interacting with a design element 1201 within a digital representation of a building or system, and for accessing associated instructional content 1202, in accordance with some embodiments of the present invention. The instructional content 1202 provides various options for facilitating immediate guidance, assistance, and collaboration, comprising a live chat function, a live call function, and a real-time live repair view function. These features significantly enhance operational effectiveness by connecting field personnel with remote experts or with peers performing similar repair tasks, thereby offering direct instructional support tied to the design element 1201.

In the embodiment illustrated, a user interacting with a design element 1201 on a digital plan may access an interface 1200 displaying instructional content 1202. The design element 1201 may correspond to any building system component, such as an HVAC unit, a plumbing fixture, a control panel, or a sensor array. Upon selecting the design element 1201, the user device may retrieve and display the instructional content 1202 related to that specific component, where the instructional content 1202 may include text, images, videos, manuals, and additionally, interactive options for seeking real-time support.

The instructional content 1202 prominently features selectable buttons to initiate live chat, live call, or view a live repair session. Selecting the live chat button initiates a real-time text-based conversation with a remote expert familiar with the selected design element 1201. This functionality enables users encountering unexpected installation conditions or service anomalies to seek clarification without leaving the job site, thus avoiding delays associated with traditional ticket-based support systems.

The live chat function may connect the user directly with manufacturer-certified technicians, building facility managers, product specialists, or supervisory personnel depending on the context. In one embodiment, the system may automatically match the user to an available expert based on the user role (e.g., technician, apprentice), the building type (e.g., hospital, residential complex), or the nature of the design element 1201 (e.g., critical HVAC system vs. cosmetic fixture).

The call function further extends the assistance capabilities by establishing a voice communication session between the field personnel and a remote expert. Initiating the call function through the instructional content 1202 may launch a VoIP session, a direct cellular call, or a push-to-talk radio communication based on the devices and network settings configured in the system.

During a live call, the service personnel may discuss complex troubleshooting steps, receive verbal walk-through instructions, confirm component specifications, or verify compliance procedures specific to the design element 1201. The live call interaction may be supplemented by file sharing capabilities, allowing the expert to send annotated images, diagrams, or documentation for instant reference.

The view live repair function, as shown in FIG. 12, enables service personnel to access a live video stream of another personnel performing repair work on the same or a similar design element 1201 at a different location. This capability fosters experiential learning, peer collaboration, and rapid upskilling by allowing field personnel to observe best practices and repair techniques being executed in real-time.

In some embodiments, access to a live repair video may be controlled through consent-based sharing. Service personnel performing the live repair may receive a request to stream their repair session, and upon approval, their camera feed (e.g., from a wearable device or smartphone) is transmitted securely to the requesting user viewing the instructional content 1202. This creates a live mentoring environment where knowledge transfer happens organically and contextually.

The option for remote expert guidance 1203 provides users a seamless channel to escalate issues or request higher-level technical assistance beyond the basic instructional content 1202. The remote expert guidance 1203 may include screen sharing capabilities where the expert can annotate over the user's live view of the design plan or mark areas of interest on the digital representation for better guidance.

Remote expert guidance 1203 may also involve the expert assuming limited control of the user interface to pull up additional specifications, zoom into specific sections of the design element 1201, or initiate diagnostic sequences on interconnected smart components where remote monitoring capabilities are available.

In another embodiment, multiple users interacting with the same design element 1201 from different locations may engage in a shared collaborative session, where one user repairs a component while others observe, interact, and participate through live annotations, questions, and suggestions overlaid on the instructional content 1202.

The access to live video of repair 1204 enhances situational awareness, especially in cases where written instructions or still images may not adequately convey the complexity of the repair task. Viewing live video allows users to see nuanced procedures, tool handling, component disassembly, and environmental factors affecting the repair, leading to more confident and successful task execution.

Accessing live repair video 1204 also enables real-time feedback and course correction. For example, if a viewer notices that the live demonstrator is using an incorrect tool or deviating from a standard protocol, they may send immediate feedback via integrated chat or voice to prevent procedural errors.

The instructional content 1202, as part of the interface 1200, may dynamically adapt based on the context of the service task, user's history, severity of the issue, and available support resources. For example, during emergency repair scenarios, the system may prioritize offering immediate call and live video access options more prominently than lengthy text-based manuals.

In some embodiments, the live chat, call, and live repair options are tiered based on service contracts, user certification levels, or organizational policies. For example, apprentices may initially be restricted to live chat support, while certified technicians may access full live video and remote expert support capabilities.

Moreover, the system may record live repair sessions accessed through the view live repair option 1204, tagging them with metadata such as design element identification, timestamp, building type, and issue category, thereby enriching the instructional content database for future reference and training use.

The remote expert guidance 1203 accessed through the interface 1200 may involve experts operating from centralized remote operation centers or distributed across global locations, thereby enabling 24/7 support across different time zones for facilities operating internationally.

In one embodiment, the remote expert connected through the remote expert guidance 1203 may employ advanced tools such as 3D model viewers, real-time system diagnostics dashboards, and augmented reality markers to provide highly contextualized and visually guided assistance during the session.

The interface 1200 also supports fault escalation workflows. If during a live session it becomes apparent that a problem cannot be resolved remotely, the system may initiate automated escalation processes, dispatching a specialized repair crew or ordering replacement parts with minimal user intervention.

Further, in environments where data security and privacy regulations apply, all communication sessions initiated through the instructional content 1202, including live chats, calls, and live video streams, may be encrypted end-to-end, and access logs may be maintained for audit and compliance purposes.

The user experience within the interface 1200 may be enhanced by intelligent matching algorithms, which route user requests to the most relevant expert based on parameters such as prior similar cases handled, expertise in the specific brand/model of the design element 1201, or user language preferences.

In some embodiments, the system may proactively suggest engaging a remote expert or viewing a live repair based on context analysis. For example, if the system detects that the service personnel has spent an above-average amount of time reviewing basic instructional content 1202 without initiating repairs, it may prompt additional live assistance options.

The instructional content 1202 displayed in interface 1200 may be further integrated with artificial intelligence engines capable of natural language processing, allowing users to converse in plain language with the system or the remote expert, describing symptoms, asking clarifying questions, or requesting alternate repair methods.

The interface 1200 may also feature confidence scoring metrics, where the AI engine assesses the likelihood of successful task completion based on user interaction history, and recommends real-time interventions accordingly through remote expert guidance 1203 or live repair access 1204.

In cases involving safety-critical repairs, the system may require mandatory remote supervision via live video before authorizing task closure or system restart, thereby embedding an additional layer of risk mitigation within operational workflows.

The live chat and call options in the instructional content 1202 may also include canned responses, templates, or rapid access to knowledge base articles, accelerating information retrieval for common queries related to the design element 1201.

The entire interaction framework embodied in FIG. 12 may be integrated with broader enterprise resource planning (ERP) and computerized maintenance management systems (CMMS), enabling automatic ticket generation, progress tracking, and knowledge graph updates based on each repair or maintenance interaction initiated.

Through such integrations, repair outcomes derived from instructional content 1202 interactions may feed into analytics engines that identify systemic issues, training gaps, or design improvements needed across portfolios of similar design elements 1201.

Advanced machine learning models may analyze aggregated interaction patterns across multiple buildings and users to optimize future instructional content 1202 prioritization, streamline expert availability scheduling, and refine real-time support protocols.

The interface 1200 may additionally support multi-modal communication, allowing a seamless transition between chat, voice, and video modes during a live support session without losing session context or requiring re-authentication.

In another embodiment, service personnel accessing the instructional content 1202 may invite multiple experts into the same live session, enabling collaborative troubleshooting for complex multi-disciplinary issues involving overlapping system domains.

Gamification elements may also be incorporated into the instructional content 1202, awarding badges, experience points, or certifications to service personnel based on successful completion of repairs with minimal external assistance, fostering skill development.

The live video streams accessible through the view live repair function 1204 may optionally be enriched with real-time augmented reality overlays showing tooltips, procedural arrows, or hazard highlights superimposed on the viewed component, thereby further enhancing situational awareness.

In some cases, instructional content 1202 may offer preview thumbnails or video excerpts for available live repair sessions, enabling users to select the most relevant session based on component type, fault type, or procedural similarity.

In emergency mass-failure scenarios (e.g., natural disasters, systemic building failures), the system 1200 may broadcast live repair sessions to multiple users simultaneously to maximize knowledge dissemination and coordinate parallel repairs across affected sites.

Remote expert guidance 1203 may also involve integrated diagnostic tools, allowing the expert to query system logs, sensor data, or device configurations remotely, and provide data-driven repair recommendations in near-real-time.

Figure 13:
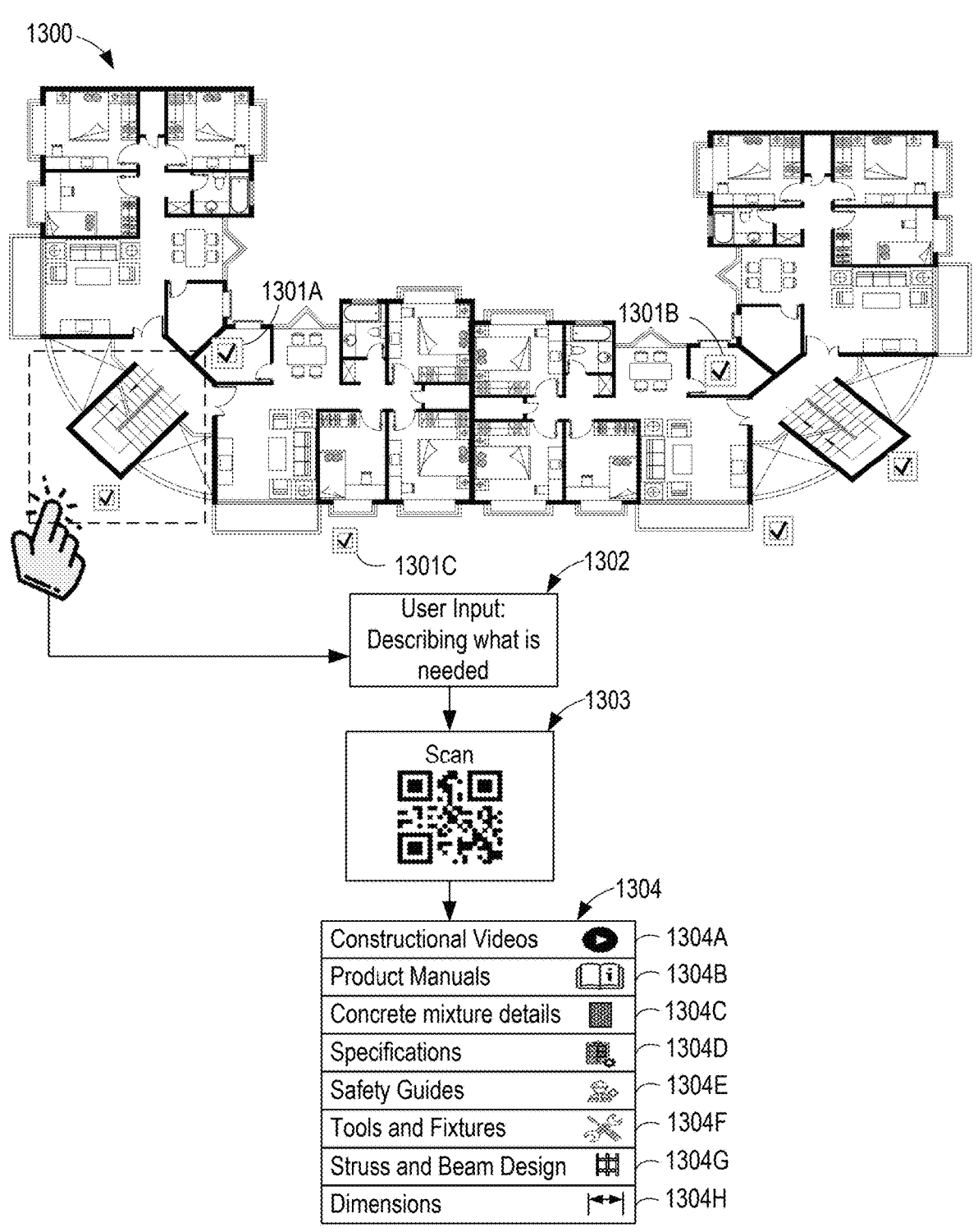
FIG. 13 illustrates an exemplary method of associating and accessing instructional content on a design plan, in accordance with some embodiments of the present invention.

Referring now to FIG. 13, an exemplary method is illustrated for associating and accessing instructional content 1304 on a design plan 1300, in accordance with some embodiments of the present invention. As illustrated, the design plan 1300 represents a digital or virtual layout of a building, facility, or infrastructure system comprising a plurality of structural and system components represented as design elements. The design plan 1300 may be stored locally on a user device or may be remotely accessed through a server or cloud-based platform.

Within the design plan 1300, a plurality of design elements is represented, where selected design elements are associated with content markers 1301A, 1301B, and 1301C. Each content marker 1301A-1301C corresponds to a design element for which instructional content 1304 has been pre-associated or dynamically generated by the system. The content markers 1301A-1301C may be interactive visual icons or overlays positioned on the digital representation of the design plan 1300, facilitating user interaction and selection.

In some embodiments, a user interacting with the design plan 1300 may click or tap on one or more of the content markers 1301A-1301C. Upon selection, the system may immediately retrieve and display associated instructional content 1304 related to the selected design element. Such interaction enables direct, context-sensitive access to needed installation, repair, or maintenance guidance without requiring manual lookup or cross-referencing.

Alternatively, where no pre-existing instructional content 1304 is associated with a selected design element, the system may provide an option for the user to submit a user input 1302. The user input 1302 may involve describing the type of assistance or information required, such as requesting a construction manual, specification sheet, or repair guide corresponding to the selected design element.

The system may present a structured input interface for receiving the user input 1302, comprising drop-down menus, checklists, free-text fields, voice dictation, or predefined templates depending on the user's device capabilities and operational environment. The user input 1302 may be processed locally on the user device or transmitted to a backend AI engine for processing.

Upon receiving the user input 1302, the AI engine may analyze the request, referencing internal databases, external repositories, and real-time web resources to locate, generate, or compile the requested instructional content 1304. The AI engine may apply natural language processing to interpret free-text inputs, semantic analysis to determine user intent, and predictive algorithms to suggest additional or related content.

Following processing of the user input 1302, the system generates a scannable code, exemplified in FIG. 13 as a QR code 1303. The QR code 1303 encapsulates a digital link, token, or identifier that points to the location of the corresponding instructional content 1304, whether stored on a local database, remote server, or external cloud service.

The QR code 1303 may be presented visually on the user's interface, printed onto a maintenance work order, displayed on an augmented reality overlay, or transmitted via secure messaging to field personnel. The user may then scan the QR code 1303 using a mobile device, wearable scanner, or integrated scanning feature on their head-mounted display or tablet.

Upon scanning the QR code 1303, the user's device resolves the embedded link and accesses the instructional content 1304, which may comprise one or more categories of information. As depicted in FIG. 13, the instructional content 1304 may include constructional videos 1304A, product manuals 1304B, concrete mixture details 1304C, specifications 1304D, safety guides 1304E, tools and fixtures information 1304F, truss and beam design 1304G, and dimensions 1304H.

Constructional videos 1304A may include recorded or animated demonstrations of assembly, installation, inspection, and disassembly procedures for the component or system associated with the selected design element. These videos may vary based on project phase, component type, and regional standards.

Product manuals 1304B may encompass manufacturer-supplied installation guides, user manuals, operating procedures, and compliance documentation. These manuals may be version-controlled and retrieved based on model numbers or production batches associated with the design element.

Concrete mixture details 1304C may provide formulation data, curing times, temperature sensitivity profiles, and admixture specifications relevant to the building structure or foundation represented in the selected design element.

Specifications 1304D may include mechanical, electrical, plumbing, and architectural specification sheets, outlining performance characteristics, material requirements, dimensional tolerances, and regulatory compliance information necessary for proper installation or servicing.

Safety guides 1304E may present step-by-step safety protocols, personal protective equipment (PPE) requirements, lockout-tagout procedures, fall prevention strategies, and environmental hazard warnings applicable to the component, system, or surrounding work environment.

Tools and fixtures information 1304F may detail the recommended or required tools, fasteners, mounting kits, testing equipment, and specialty devices necessary to execute installation, servicing, or removal tasks for the selected design element.

Struss and beam design 1304G may involve structural design diagrams, load calculations, stress distribution analysis, reinforcement schedules, and best practices for assembling or inspecting structural members associated with the design element.

Dimensions 1304H may include detailed blueprints, tolerance dimension drawings, coordinate layouts, and geometric references for precise fabrication, positioning, and fitting of the associated building component.

In one embodiment, the system may prioritize generating QR codes 1303 for design elements deemed to have higher maintenance frequency, complex installation requirements, or mission-critical operational importance within the building infrastructure.

Multiple QR codes 1303 may be generated and grouped into thematic sets if a service activity involves multiple interconnected components, such as servicing an HVAC system requiring ductwork inspection, compressor servicing, and thermostat recalibration.

The QR codes 1303 generated for the design elements may include embedded metadata such as project identifiers, building location coordinates, timestamp of generation, user role of requester, and expiration duration for temporary access control.

Dynamic QR codes 1303 may be regenerated periodically or in response to updates in the instructional content 1304, reflecting real-time modifications, policy changes, or newly available methods discovered post-construction.

In some embodiments, a centralized content management system (CMS) may track QR code scans, user access patterns, instructional content downloads, and subsequent service outcomes, providing analytics for continual improvement of instructional content quality and accessibility.

The generated instructional content 1304 accessed through the QR code 1303 may be modular and progressive, offering beginner-level overviews followed by increasingly detailed, expert-level content depending on user interaction history and feedback.

In another embodiment, access to instructional content 1304 through QR code 1303 scanning may be restricted based on user authorization levels, such that sensitive structural data or safety-critical information is only available to certified personnel.

The system may integrate augmented reality (AR) experiences triggered by scanning QR code 1303, where the instructional content 1304 is projected onto the real-world view of the corresponding physical component, offering a guided, contextually anchored repair or installation walk-through.

During emergencies, such as flood, fire, or structural collapse risks, the QR code 1303 method may expedite retrieval of emergency shutdown procedures, evacuation plans, and critical system isolation instructions embedded within safety guides 1304E.

The design plan 1300 itself may be dynamically updated to reflect the status of QR code associations, such as visually distinguishing design elements with accessible instructional content versus those requiring content generation or human review.

In collaborative environments, multiple users accessing the same design plan 1300 may independently generate and scan QR codes 1303 for their respective tasks, with the system intelligently managing content redundancy and conflict resolution.

Version control systems may track changes to instructional content 1304 linked to QR codes 1303, allowing users to access historical content versions or receive notifications when updated methods or regulatory changes impact previously accessed material.

In some embodiments, scanning the QR code 1303 may launch a structured repair, maintenance, or installation workflow embedded within the instructional content 1304, tracking task completion, generating digital checklists, and submitting electronic completion reports.

The interface for generating QR code 1303 based on user input 1302 may offer intelligent auto-completion suggestions, voice-to-text input, and real-time validation to streamline and simplify the content request process, particularly in field conditions.

The system 1300 depicted in FIG. 13 thus offers a robust, flexible, and highly scalable mechanism for dynamically associating and accessing instructional content 1304 linked to design elements of a building or project, optimizing maintenance, installation, and inspection workflows.

Through seamless integration of user-driven input 1302, AI-based content generation, QR code 1303 encoding, and multi-format instructional content 1304 delivery, the system empowers users to rapidly obtain actionable information precisely when and where it is needed.

The modular nature of the instructional content 1304 categories 1304A-1304H allows for tailoring information packages suited to user roles (e.g., apprentice vs. senior technician), project phases (e.g., initial construction vs. retrofit), and urgency levels (e.g., scheduled maintenance vs. emergency response).

Figure 14:
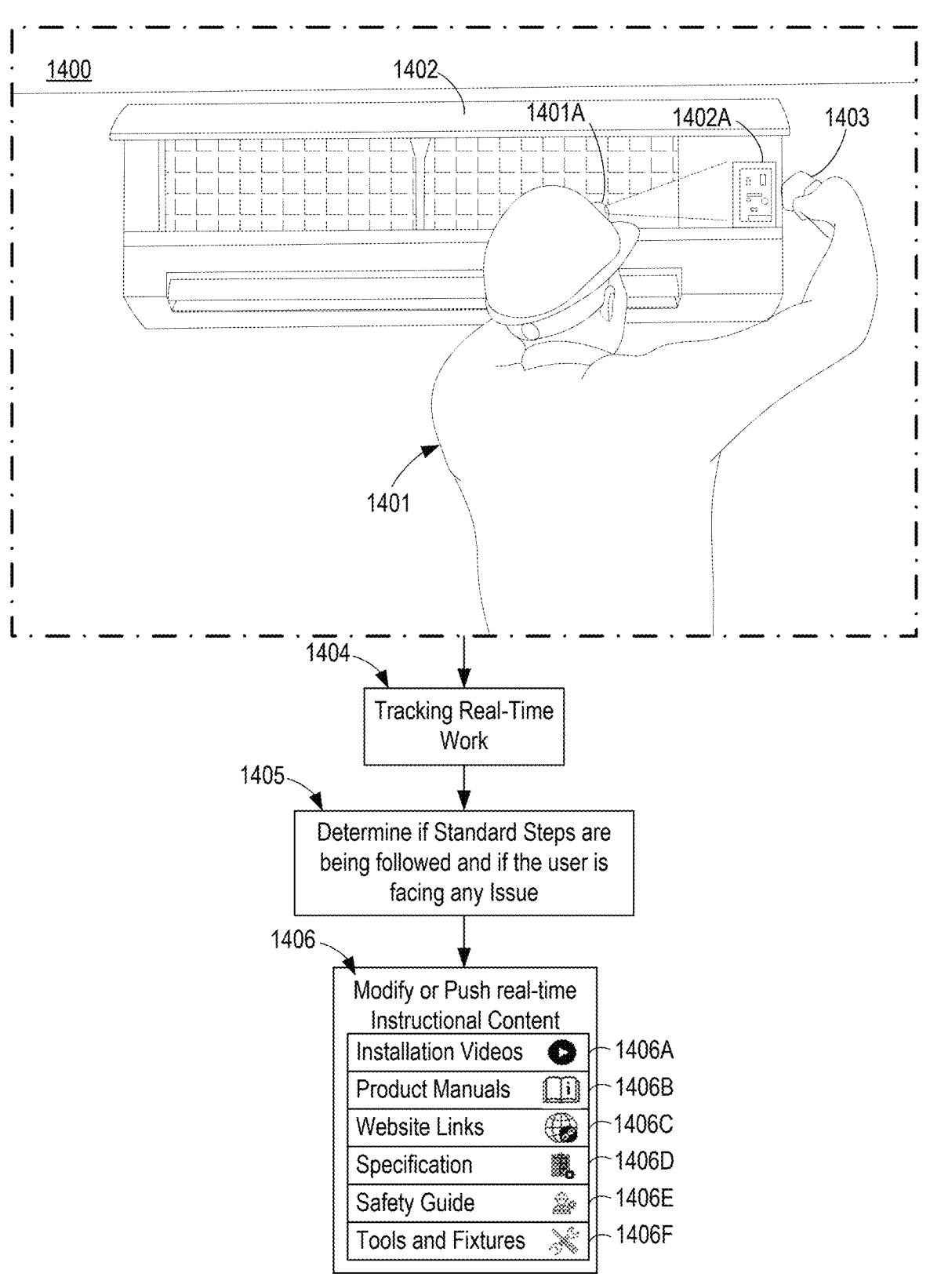
FIG. 14 illustrates an exemplary method of assisting service personnel with instructional content during installation and repair of a component within a physical building, in accordance with some embodiments of the present invention.

Referring now to FIG. 14, an exemplary system and method (1400) is illustrated for assisting a service personnel 1401 with instructional content during installation or repair of a component within a building, in accordance with some embodiments of the present invention. The system 1400 provides a real-time, intelligent support framework where an AI engine dynamically monitors the work performed by the service personnel 1401 and modifies or delivers instructional content based on the actual progression of the service task.

As illustrated in FIG. 14, the service personnel 1401 may be working to service or repair an air conditioning (AC) unit 1402 mounted within the building. The service personnel 1401 may be equipped with a head-mounted camera 1401A capable of capturing a real-time video feed of the ongoing repair activities. The head-mounted camera 1401A is positioned to capture not only the actions performed by the service personnel 1401 but also the surrounding environment, the tools 1403 being used, and the specific parts 1402A of the AC unit 1402 being manipulated during the repair process.

The video feed generated by the head-mounted camera 1401A may be transmitted wirelessly to a controller operating an AI engine. The AI engine is configured to perform real-time processing and analysis of the captured visual data to facilitate step 1404, wherein the service task performed by the service personnel 1401 is actively tracked. Tracking 1404 encompasses frame-by-frame object recognition, hand movement analysis, tool identification, sequence recognition, and anomaly detection to monitor the progression and correctness of the repair procedure.

During the tracking 1404 process, the AI engine compares the real-time activities of the service personnel 1401 against a predefined standard procedure stored in an instructional database. The standard procedure may include a sequence of steps recognized as the best practice for repairing the specific type and model of AC unit 1402. In step 1405, the AI engine determines whether the service personnel 1401 is following the standard steps or if any deviation, error, or hesitation indicates that the personnel is facing an issue.

To determine whether the standard steps are being followed in step 1405, the AI engine may analyze the sequence of detected actions. For example, the AI engine may check if the power supply to the AC unit 1402 has been safely disconnected before accessing internal components, or if the correct sequence of removing the front panel, accessing the filter, and replacing malfunctioning parts is being adhered to. Any divergence, such as skipping a safety disconnection step or incorrect tool usage, may trigger the AI engine to intervene.

In some embodiments, the AI engine may detect potential issues faced by the service personnel 1401 based on behavioral indicators such as prolonged inactivity near a component, repeated motion patterns suggesting difficulty, unrecognized tool usage, or visual anomalies like parts not fitting as expected. Based on such detections, the AI engine may infer that the service personnel 1401 is encountering challenges and may initiate assistance.

Upon determining either deviation from standard procedures or difficulties faced by the service personnel 1401, the AI engine advances to step 1406 where it modifies or pushes real-time instructional content to the service personnel 1401. The pushed instructional content may be selected from a repository containing multiple content types, each suited to specific intervention needs.

The real-time instructional content 1406 may include a variety of formats. For example, installation videos 1406A may be dynamically streamed to the service personnel's head-mounted display or user device, offering visual step-by-step guidance synchronized with the current task stage. Such videos may be specific to the make and model of the AC unit 1402 being serviced.

Product manuals 1406B may be retrieved and displayed, providing schematic diagrams, technical specifications, and maintenance guidelines pertinent to the AC unit 1402 and its subcomponents 1402A. The product manuals 1406B may highlight specific pages or sections relevant to the detected service stage.

Website links 1406C may be suggested that direct the service personnel 1401 to external resources, manufacturer troubleshooting forums, parts ordering portals, or regulatory compliance advisories related to the repair at hand.

Specification sheets 1406D may be presented when the AI engine detects that the service personnel 1401 is working with parts 1402A requiring precise fitting, torque specifications, or electrical ratings. Such real-time access to specifications facilitates precision in the repair task and reduces post-repair failures.

Safety guides 1406E may be pushed to the service personnel 1401 in real-time if the AI engine detects unsafe practices such as handling live wires, improper grounding, or exposure to refrigerant gases during servicing of the AC unit 1402. These guides may be dynamically filtered based on context, urgency, and detected hazard level.

Tools and fixtures information 1406F may be provided if the AI engine identifies that an incorrect tool 1403 is being used or if specialized fixtures are needed for a particular service operation. This information may include visual identification guides, recommended models, and access locations within the facility.

In some embodiments, the AI engine may generate dynamic, situation-specific instructional content not previously stored. For example, if the camera 1401A captures an unexpected wiring configuration, the AI engine may analyze the deviation, generate a custom instruction on how to rewire safely, and present it in real time.

The instructional content 1406 delivered to the service personnel 1401 may be layered, offering immediate next steps while allowing deeper exploration if the service personnel 1401 wishes to review detailed instructions or alternative repair methods.

Furthermore, the AI engine may adapt the format and delivery of the instructional content based on real-time feedback, such as eye-tracking data from the head-mounted device indicating confusion or misunderstanding, thereby switching from textual to video-based instructions as needed.

The system 1400 may include voice-based interaction where the service personnel 1401 verbally requests clarification or assistance, and the AI engine responds with appropriate instructional content or troubleshooting suggestions tailored to the verbal query.

In addition to pushing remedial content, the system 1400 may also log deviations from standard procedures detected in step 1405, building a historical record of service task quality, personnel training needs, and maintenance outcomes.

Historical analytics generated from multiple service operations tracked using the system 1400 may inform predictive maintenance strategies, identifying components like the AC unit 1402 or tools 1403 that repeatedly lead to difficulties or procedural non-conformance.

In some embodiments, the head-mounted camera 1401A may be part of a broader IoT sensor network, with additional data inputs from environmental sensors monitoring temperature, humidity, or vibration near the AC unit 1402 to enhance situational awareness.

Real-time instructional content 1406 may also incorporate regulatory compliance reminders based on jurisdictional codes applicable to building systems, thereby aiding the service personnel 1401 in maintaining legal conformity during repairs.

The AI engine may also support proactive guidance by forecasting next steps in the repair based on current actions, and preloading instructional content 1406A-1406F accordingly, minimizing wait times and maintaining workflow continuity.

User profiles may influence the nature of instructional content delivery; for example, a novice service personnel 1401 may receive more detailed, granular guidance, while an expert user may receive only critical alerts or advanced procedural updates.

In another embodiment, the AI engine may detect if the service personnel 1401 is using makeshift repairs or unauthorized parts and may push warnings, standard replacement parts lists, and ordering instructions to prevent non-compliant fixes.

Training modules may be integrated into the system 1400, allowing service personnel 1401 to simulate repair procedures using head-mounted displays and instructional content 1406 before attempting real-world repairs.

Upon successful completion of a service task, the AI engine may generate an automated service report based on tracked activities, accessed content, and confirmed task stages, providing verifiable documentation for maintenance records.

Advanced implementations may integrate with Building Management Systems (BMS) to update system logs, notify stakeholders, and trigger re-certification procedures for critical systems following repairs validated through the system 1400.

The real-time AI monitoring may include machine vision algorithms capable of recognizing wear indicators, tool degradation, or part aging during the course of normal repairs, prompting preventive maintenance actions ahead of scheduled cycles.

In some embodiments, the head-mounted camera 1401A may feature thermal imaging capabilities, aiding in the detection of thermal anomalies like overheating compressors in the AC unit 1402, further enhancing diagnostic precision.

Voice prompts, graphical overlays, vibration feedback, or haptic alerts may be incorporated to deliver the real-time instructional content 1406 unobtrusively yet effectively during hands-on repair tasks.

The modular architecture of instructional content 1406A-1406F allows for continuous content updates without disrupting system operation, with AI-driven relevance scoring determining which new or revised content gets presented in future service sessions.

Service personnel 1401 encountering unique issues not covered by existing instructional content 1406 may initiate a feedback capture process, allowing user-generated content to supplement or expand the instructional database over time. Augmented reality (AR) overlays generated based on the camera feed 1401A may dynamically align virtual instruction cues with real-world components, reducing cognitive load and error potential during complex repairs.

Workload balancing may be achieved by analyzing cumulative repair histories logged through the system 1400, identifying personnel strengths and areas needing additional training or procedural reinforcement.

Referring now to FIGS. 15A-15B, an exemplary flowchart 1500 is illustrated comprising method steps 1502-1532 that may be executed in some embodiments of the present invention. At step 1502, a controller receives into its system a design plan of at least a portion of a building. The design plan may include a two-dimensional (2D) layout, a three-dimensional (3D) model, or a hybrid combination of both 2D and 3D representations. In some embodiments, the design plan may be uploaded in standard file formats such as DWG, DXF, RVT, IFC, or any raster or vector image formats. The controller may be implemented locally on a user device or remotely on a cloud server, and may parse the received design plan for further processing. For example, a contractor operating a tablet device may upload the floorplan of a hospital wing to the controller for analysis and content association.

At step 1504, the controller identifies or infers design elements present within the received design plan. Identification may involve recognizing symbols, annotations, or tags explicitly marked on the plan, such as walls, doors, windows, HVAC units, plumbing fixtures, electrical panels, sinks, or machinery. Inference may occur when symbols are missing or unclear, wherein the controller analyzes geometric patterns, room layouts, and historical templates to predict what the design element is likely to represent. For example, a rectangular outline in a bathroom space adjacent to plumbing lines may be inferred as a bathtub if explicit labeling is absent. The controller may utilize AI engines such as convolutional neural networks (CNNs) trained on construction documents for more accurate identification and inference.

At step 1506, once design elements are identified or inferred, the controller searches one or more databases for instructional content corresponding to the recognized design elements. The database may include installation manuals, repair guides, product specifications, video tutorials, maintenance checklists, and safety protocols. The search operation may involve querying a local library embedded within the controller, a corporate content management system, or even cloud-based content repositories. For example, if the design element is an HVAC unit identified as "Model X123," the controller may retrieve an installation video and troubleshooting guide specifically for Model X123.

At step 1508, the controller generates and displays the processed design plan on an interactive user interface, where each identified design element having associated instructional content is marked with an instructional content indicator. The instructional content indicators may be graphical icons, color-coded dots, embedded media players, or linked menu items overlaid on the respective locations of the design plan. For example, clicking on a sink icon within the plan may immediately present the user with embedded links to maintenance videos, installation guides, and safety protocols for that specific sink model. The interactive user interface may be presented on various user devices including tablets, laptops, AR/VR headsets, or wall-mounted touch displays in a command center.

At step 1510, if the controller detects that certain design elements do not have pre-associated instructional content in the searched database, it initiates an internet search and/or AI-based content generation for such no-content design elements. The internet search may include mining manufacturer websites, open-source repositories, maintenance forums, and commercial databases. Simultaneously, the controller's AI engine may generate preliminary instructional content based on standard operating procedures, historical data, or templates available within the system. For example, if a specialized laboratory exhaust fan is detected without associated content, the AI engine may generate basic maintenance guidelines by extrapolating from similar devices' known operating procedures.

At step 1512, the instructional content retrieved or generated for the design elements is customized based on contextual parameters. These parameters may include, but are not limited to, the building type (e.g., residential, commercial, hospital, industrial), the user role (e.g., contractor, apprentice, inspector, engineer), the time of access (e.g., during emergency maintenance, routine inspection, initial installation), and language or location preferences (e.g., local regulatory compliance, region-specific best practices). For example, in a hospital setting, the instructional content associated with a fire alarm system may include emergency shutdown procedures, while for a residential home, the content may simply cover basic maintenance tips. Similarly, an apprentice may be presented with more detailed, step-by-step guides than an experienced technician.

At step 1514, the controller receives real-time user inputs or task assignments through the interactive user interface. The user may interact with the design plan by clicking on design elements to request additional information, flagging components for inspection, or assigning service tasks to field personnel. For example, a facility manager accessing the design plan through a tablet may assign an urgent HVAC filter replacement task to a technician by selecting the HVAC unit's icon on the interface and filling out a task assignment form. Alternatively, a service technician may request supplemental videos or alternate repair instructions while working on-site by submitting a real-time query through the user interface.

At step 1516, the controller monitors real-time status of components within the physical building using cameras or IoT sensors to detect faults or maintenance needs. This monitoring step may involve analyzing video feeds from fixed cameras, mobile robots, or technician-worn headsets, as well as reading sensor data from embedded pressure sensors, temperature sensors, vibration monitors, humidity detectors, and flow meters. For example, if a water leak is detected through a humidity spike and visual confirmation from a camera feed, the system may flag the affected pipeline in the digital design plan and prepare associated instructional content (e.g., gasket replacement guide, leak sealing video). This real-time monitoring enables proactive detection and immediate servicing of defects before they escalate into major failures.

At step 1518, the controller triggers appropriate instructional content based on detected faults to mitigate, repair, or service the identified faults. This step begins once a fault is confirmed through real-time monitoring of the physical building components, such as through a camera feed or IoT sensor network, as discussed in earlier steps. Upon detection, the system consults the preloaded or dynamically generated instructional database to select the most relevant content to address the detected issue. For example, if a pressure drop in a pipeline is detected and verified as a leak, the system automatically links a gasket replacement video or a pipe patching guide specific to the pipe material and diameter. In other embodiments, a cracked HVAC control panel screen may trigger visual guides for temporary screen replacement, along with detailed manuals for ordering and installing a permanent replacement.

At step 1520, the controller assigns maintenance or repair tasks to service personnel and preloads the relevant instructional content for the assigned tasks into their respective user devices. The assignment may be based on the technician's specialization, certifications, proximity to the fault location, or availability schedule. Upon assignment, the controller sends a work notification to the user device (e.g., a tablet, AR headset, smartphone) of the selected personnel. This notification includes task details, location coordinates within the building, priority levels, and preloaded instructional content such as videos, manuals, safety guides, and tool checklists. For example, if a technician is assigned to replace an HVAC filter, their user device may preload a step-by-step filter replacement tutorial along with a list of necessary safety precautions like switching off power before disassembly.

At step 1522, the system tracks the real-time work progress of the assigned service personnel using head-mounted cameras or similar wearable recording devices. During this tracking, the real-time video or image feed of the technician's work is transmitted back to the controller or cloud server, where an AI engine analyzes the work progress against pre-established standard operating procedures (SOPs). For example, if a technician is repairing an electrical panel, the AI engine checks whether they first disconnect the power supply as per the standard procedure before proceeding to open the panel. Deviations from SOPs, delays in task progress, or improper tool usage are flagged in real-time for further action, enabling precision maintenance supervision and better quality assurance.

At step 1524, the controller provides real-time instructional content modification or pushes new guidance based on the tracked real-time work of the service personnel. If the AI engine analyzing the live feed determines that the technician is deviating from prescribed SOPs, missing critical steps, or facing difficulty (e.g., lingering too long on a single subtask), the system dynamically modifies the instructional content. For example, if the technician is observed struggling with a specific bolt removal during HVAC servicing, the system may instantly push a specialized video or an illustrated troubleshooting guide showing alternative techniques to loosen seized bolts. This real-time responsiveness supports technicians by adapting to their evolving onsite needs without requiring manual escalation or delay.

At step 1526, the system enables remote expert interaction through selectable live chat, call, or live video sharing features, allowing the service personnel to connect with an offsite expert in real-time. If the technician feels additional help is needed, they can initiate a live session directly from their user device, wherein an expert views the live feed, converses through voice, or even draws annotations on the shared feed to guide the technician. Additionally, the service personnel may be offered an option to view another live repair session being carried out by another technician on a similar component, subject to permissions. For example, a junior technician facing issues reinstalling a condenser coil can view a live feed of a senior technician completing a similar installation elsewhere, gaining practical insights visually in real-time.

At step 1528, the system records and uploads a video of the service work performed on a component. As the technician carries out the repair, maintenance, or installation task, their head-mounted camera, smartphone, or tablet records the process in the background. Upon completion, the recording is uploaded either automatically or after technician confirmation to a centralized storage platform such as a cloud-based server or a corporate content management repository. Metadata including the service date, technician identity, task ID, location on design plan, and used tools may also be attached to the video file to support future traceability and knowledge management.

At step 1530, the recorded and uploaded service video is associated with the corresponding design element on the design plan. The association process may involve tagging the video to the precise digital twin element or mapped coordinate where the service occurred. For example, if a repair video pertains to a specific HVAC unit, the digital representation of that HVAC unit in the building's design plan receives an embedded link to the recorded video. A future technician accessing that HVAC unit's icon on the interactive plan can watch the recorded repair session to understand historical interventions, analyze past challenges, and prepare better for upcoming service tasks.

At step 1532, the controller associates the recorded service video to similar design elements found across one or more additional design plans managed through the centralized server. For example, if the recorded video demonstrates a specific type of filter replacement on an HVAC unit Model X123, the system automatically links the same video to all other instances of HVAC unit Model X123 across different floors, buildings, or campuses managed by the same platform. This collective association facilitates that best practices, specialized knowledge, and real-world repair techniques are uniformly disseminated across the organization, minimizing redundancy and boosting service quality for similar infrastructure elements.

In some embodiments of the present invention, an AI-powered collaborative platform is provided for spatial annotation process within architectural and construction projects. Initially, a controller receives a detailed two-dimensional or three-dimensional static representation of a building's design plan. An AI engine, integral to this system, delves into the representation, identifying various architectural elements and their spatial arrangements as depicted through a complex pattern of pixels. This initial analysis lays the groundwork for an interactive user interface that showcases these elements, making them ready for user interaction and annotation.

Users engage with this interface, selecting design elements to annotate, thereby infusing the digital blueprint with valuable insights and specifications. The AI engine plays a pivotal role, determining the precise spatial coordinates of each annotated element, effectively bridging the gap between digital annotation and physical reality. These annotations are dynamically linked to their corresponding elements, facilitating real-time updates across the collaborative environment for all participants.

Further sophistication is introduced as the platform accommodates the movement of both digital and physical versions of design elements. When an element's position is adjusted within the building's layout or the actual construction site, its associated annotations (including associated instructional content) are automatically realigned within the two-dimensional or three-dimensional static representation, maintaining an unwavering accuracy and relevance of the project documentation.

An innovative question-and-answer feature empowers users to inquire about various project aspects directly through the interface. Leveraging the latest data, including recent changes or updates, the AI engine responds with precise, automated answers, effectively serving as an intelligent assistant.

Through the integration of third-party platforms, the system extends its utility beyond mere annotation. It facilitates material procurement, compliance checks, and even labor hiring, streamlining project management tasks and facilitating adherence to relevant standards and regulations.

In some embodiments of the present invention, the method additionally comprises determining a scale of the components included in the design plan and/or generating a user interface including user interactive areas to change at least one of: a size and shape of at least one of the dynamic components, the dynamic components may include, by way of non-limiting example, one or more of: architectural features, polygons or arcuate shapes; regions, areas, spaces, travel paths, egress paths, dominance hierarchies, occupancy loads, doorways, stairs, or other portion of a design plan that may be modified.

In some embodiments, dynamic components may include a polygon and/or arcuate shape. A method of practice of the present invention may further include the steps of: receiving an instruction via the interactive user interface to modify a parameter of the polygon and modifying the parameter of the polygon based upon the instruction received via the interactive user interface. The parameter modified may include one or both of: an area of the polygon; and a shape of the polygon.

In another aspect a dynamic component may include a line segment and/or arcuate segment, and methods of practice may include one or more of: receiving an instruction via an interactive user interface to modify a parameter of the line segment, and the method further includes the step of modifying the parameter of the line segment based upon the instruction received via the interactive user interface. The parameter of the line segment may include a length of the line segment, and the method may additionally include modifying a length of a wall based upon the modifying the length of the line segment.

The parameter modified may additionally include a direction of the line segment and the method may additionally include modifying an area of a room based upon the modifying of the length and direction of the line segment. A boundary may be set based upon reference to a boundary allocation hierarchy.

In another aspect, a price may be associated with each of the quantities of items to be included in construction of the building. In addition, a type of labor associated with at least one of the items to be included in construction of the building may be designated based upon AI analysis of the first two-dimensional reference (i.e., first design plan) and the second two-dimensional reference (i.e., second design plan), respectively.

Methods of practice may additionally include the steps of: determining whether a design plan received into the controller includes a vector image, and if one of the first and the second design plans received into the controller includes a vector image, converting at least a portion of the vector image into a raster image. Implementations of the described techniques may include hardware, a method or process, or computer software on a computer-accessible medium.

A dynamic component may include a line segment and/or vector, and the method may further include the steps of: receiving an instruction via the interactive user interface to modify a parameter of the line segment and/or vector and modifying the parameter of the line segment and/or vector based upon the instruction received via the interactive user interface. The modified parameter may include a magnitude of the line segment and/or vector and/or a direction of the vector.

The method may additionally include the step of training the AI engine based upon a human identifying portions of a design plan to indicate that it includes a particular type of item; or to identify portions of the design plan that include a boundary. The AI engine via may also be trained by reference to a boundary allocation hierarchy.

The methods may additionally include the steps of: determining whether the design plans received into the controller includes a vector image, and if the design plan received into the controller does include a vector image converting at least a portion of the vector image into a raster image; and/or whether a design plan includes a vector image format. Implementations of the described techniques and method steps may include hardware (such as a controller and/or computer server), a method or process, or computer software on a computer-accessible medium.

Still further, in some embodiments, the controller may assess how assignment of different classes of space to one or more designated areas may alter conformance of a design with a specified code. Furthermore, in some embodiments, particular attributes of a building may be analyzed based upon laws or regulations in effect within a geopolitical boundary encompassing the building. In some embodiments, multiple disparate user interfaces may be used to communicate calculated parameters associated with determined attributes.

There may be alternative methods of receiving data from various sources that can be used to generate a design or to supplement a design created in the manners as have been described previously. For example, the system may receive an architectural file with intelligent features of various kinds, which will be discussed in further detail following. The present system may operate in concert with a BIM or CAD design system, for example, as an add-in to these design systems and then the present system may have access to design elements, location data and the like directly.

In other examples, the present system may access BIM or CAD design system data by loading data files from said systems. In still further examples, the present system may operate to capture data from display screens that are displaying designs from the said BIM or CAD design systems. As an additional example, the present compliance assessment system exhibits its versatility by harmoniously integrating with prominent design frameworks like BIM or CAD. This integration facilitates a proactive approach to evaluate the compliance of building designs in the nascent or initial stages of the creative process, considering an array of potential best practices. This early-stage assessment not only facilitates that the design in progress aligns with regulatory standards but also serves as a strategic time-saving measure, optimizing the efficiency of the overall design workflow. The synergy between compliance analysis and design systems not only enhances the precision of the evaluation at early stages but also contributes to a more streamlined and resource-efficient architectural and engineering endeavour.

In a non-limiting example, the present system may receive a file in one of the REVIT native formats such as files of types RVT, RFA, RTE and RFT. Embodiments may also include receiving non-Revit compatible file formats, such as, one or more of: BMP, PNG, JPG, JPEG, and TIF.

Glossary

"Artificial Intelligence" as used herein means machine-based decision making and machine learning including, but not limited to, supervised and unsupervised recognition of patterns, classification, and numerical regression. Supervised learning of patterns includes a human indicating that a pattern (such as a pattern of dots formed via the rasterization of a two-dimensional image) is representative of a line, polygon, shape, angle or other geometric form, or an architectural aspect, unsupervised learning can include a machine finding a pattern submitted for analysis. One or both may use mathematical optimization, formal logic, artificial neural networks, and methods based on one or more of: statistics, probability, linear regression, linear algebra, and/or matrix multiplication.

"AI Engine" as used herein an AI Engine (sometimes referred to as an AI model) refers to methods and apparatus for applying artificial intelligence and/or machine learning to a task performed by a controller. In some embodiments, a controller may be operative via executable software to function as an AI engine capable of recognizing aspects and/or tally aspects of a design plan that are relevant to generating an estimate for performing projects included in construction of a building or other activities related to construction of a building.

"Computer Aided Design," sometimes referred to as "CAD," as used herein shall mean the use of automation for the creation, modification, analysis, or optimization of a design plan or design plan file.

"Building Information Modeling" sometimes referred to as "BIM," as used herein.

"Vector File" as used herein a vector file is a computer graphic that uses mathematical formulas to render its image. In some embodiments, a sharpness of a vector file will be agnostic to size within a range of sizes viewable on smart devices and personal computer display screens.

Typically, a vector image includes segments with two points. The two points create a path. Paths can be straight or curved. Paths may be connected at connection points. Connected paths form more complex shapes. More points may be used to form longer paths or closed shapes. Each path, curve, or shape has its own formula, so they can be sized up or down and the formulas will maintain the crispness and sharp qualities of each path.

A vector file may include connected paths that may be viewed as graphics. The paths that make up the graphics may include geometric shapes or portions of geometric shapes, such as: circles, ellipsis, Bezier curves, squares, rectangles, polygons, and lines. More sophisticated designs may be created by joining and intersecting shapes and/or paths. Each shape may be treated as an individual object within the larger image. Vector graphics are scalable, such that they may be increased or decreased without significantly distorting the image.

The terms "design plan," "building plan," "building design," "floor plan," "two-dimensional reference," "two-dimensional or three-dimensional static representation," or simply "design" are used interchangeably, often referring to the same or similar concepts in the context of architectural or construction documentation.

The present invention provides for systems of one or more computers that can be configured to perform particular operations or actions by virtue of having software, firmware, hardware, or a combination of them installed on the system that in operation causes or cause the system to perform the actions. One or more computer programs can be configured to perform artificial intelligence operations or actions by virtue of including instructions that, when executed by data processing apparatus, cause the apparatus to perform the actions.

CONCLUSION

A number of embodiments of the present disclosure have been described. While this specification contains many specific implementation details, they should not be construed as limitations on the scope of any disclosures or of what may be claimed, but rather as descriptions of features specific to particular embodiments of the present disclosure. While embodiments of the present disclosure are described herein by way of example using several illustrative drawings, those skilled in the art will recognize the present disclosure is not limited to the embodiments or drawings described. It should be understood the drawings, and the detailed description thereto, are not intended to limit the present disclosure to the form disclosed, but to the contrary, the present disclosure is to cover all modifications, equivalents and alternatives falling within the spirit and scope of embodiments of the present disclosure as defined by the appended claims.

The headings used herein are for organizational purposes only and are not meant to be used to limit the scope of the description or the claims. As used throughout this application, the word "may" be used in a permissive sense (i.e., meaning having the potential to), rather than the mandatory sense (i.e., meaning must). Similarly, the words "include," "including," and "includes" mean including but not limited to. To facilitate understanding, like reference numerals have been used, where possible, to designate like elements common to the figures.

The phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted the terms "comprising," "including," and "having" can be used interchangeably.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while method steps may be depicted in the drawings in a particular order, this should not be understood as requiring that such operations be performed in the particular order shown or in a sequential order, or that all illustrated operations be performed, to achieve desirable results.

Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous. Nevertheless, it will be understood that various modifications may be made without departing from the spirit and scope of the claimed disclosure.

What is claimed is:

1. An apparatus for dynamically associating, customizing, and delivering instructional content for design elements within a design plan of a building, the apparatus comprising:
   a. a controller operating an artificial intelligence (AI) engine configured to receive a design plan of at least a portion of the building, the controller being further configured to analyze the design plan to identify one or more design elements depicted therein and to determine, for each identified design element, a corresponding spatial designation within the design plan;

b. a database operatively coupled to the controller, the database storing instructional content indexed to a plurality of design elements, wherein the database is configured to be searched by the controller to find the identified one or more design elements within the database to retrieve associated instructional content;
   c. an interactive user interface operatively coupled to the controller, the interactive user interface configured to display the design plan with:
      i. a first instructional content indicator spatially associated with one or more design elements for which instructional content is present in the database; and
      ii. a second instructional content indicator, visually distinct from the first instructional content indicator, spatially associated with one or more design elements for which instructional content is absent from the database, wherein, the controller is further configured to initiate, using the AI engine, generation of instructional content corresponding to the one or more design elements for which instructional content is absent from the database; and
   d. a communication module configured to allow a user to select a design element and access instructional content associated with the selected design element by interacting with the first instructional content indicator, the second instructional content indicator, or the identified one or more design elements on the interactive user interface.

2. The apparatus of claim 1, wherein the database comprises one or both of a local storage on a user device and a remote storage on a cloud server.

3. The apparatus of claim 1, wherein the controller is further configured to initiate an internet search and AI-based content generation based on the internet search to generate instructional content for design elements for which no instructional content is found in the database.

4. The apparatus of claim 1, wherein the controller is further configured to customize instructional content based on one or more contextual parameters comprising building type, user role, time of access, and language or location preferences for the user.

5. The apparatus of claim 1, further comprising a second user device operatively coupled to the controller, the second user device being configured to receive preloaded instructional content for a service task assigned to service personnel.

6. The apparatus of claim 5, wherein the second user device comprises an augmented reality headset configured to overlay the preloaded instructional content directly onto a visual representation of a physical component corresponding to a design element.

7. The apparatus of claim 5, further comprising a head-mounted camera or a wearable device operatively coupled to the controller, the head-mounted camera or the wearable device being configured to capture data representative of real-time service work of the service personnel.

8. The apparatus of claim 7, wherein the controller is further configured to determine, based on the captured data representative of the real-time service work, whether the real-time service work conforms to predefined service steps, and whether the service personnel is encountering an issue.

9. The apparatus of claim 8, wherein the controller is further configured to modify or push updated instructional content in real time based on the determination of whether the predefined service steps are being followed and whether the service personnel is encountering the issue.

10. The apparatus of claim 9, wherein the interactive user interface is further configured to allow remote expert interaction via at least one of live chat, call, or live video sharing to assist the service personnel during the real-time service work.

11. The apparatus of claim 10, wherein the controller is further configured to record and upload video of the real-time service work associated with a design element of the design plan, wherein the video of the real-time service work is uploaded to a centralized cloud server.

12. The apparatus of claim 11, wherein the controller is further configured to associate the recorded video with one or more design elements found in one or more other design plans maintained through the centralized cloud server.

13. The apparatus of claim 1, further comprising one or more cameras or Internet of Things (IoT) sensors operatively coupled to the controller, the one or more cameras or IoT sensors configured to monitor real-time component status within the building to detect faults associated with one or more building components.

14. The apparatus of claim 13, wherein the controller is further configured to trigger instructional content corresponding to the detected faults to mitigate, repair, or service the detected faults.

15. The apparatus of claim 1, wherein the instructional content comprises one or more of: installation manuals, repair guides, troubleshooting procedures, tutorial videos, safety checklists, regulatory compliance documents, parts diagrams, or warranty information.

16. The apparatus of claim 1, wherein the first instructional content indicator and the second instructional content indicator comprise one or more of: selectable icons, hyperlinks, graphical markers, or embedded media windows displayed adjacent to the corresponding design elements on the interactive user interface.

17. The apparatus of claim 7, wherein the head-mounted camera worn by the service personnel is configured to capture video or image data, and the controller is configured to analyze the captured video or image data using the AI engine.

18. The apparatus of claim 1, wherein the interactive user interface is configured to operate on one or more devices selected from: a tablet, smartphone, augmented reality (AR) headset, virtual reality (VR) headset, and laptop.

19. The apparatus of claim 5, additionally comprising the step of receiving voice commands from the service personnel using a microphone integrated with the second user device.

20. The apparatus of claim 1, wherein the controller is further configured to associate structural or functional metadata with design elements identified in the design plan, wherein the metadata is used to generate instructional content.

21. A method for dynamically associating and delivering instructional content for design elements within a design plan of a building, the method comprising the steps of:

a. receiving, into a controller operating an artificial intelligence (AI) engine, a design plan of at least a portion of a building, the design plan comprising graphical depictions of physical building components;

b. identifying, by the controller, one or more design elements in the design plan by comparing the graphical depictions with stored design element templates in a database;

c. searching, by the controller, an instructional content database for instructional content corresponding to the identified one or more design elements, wherein the instructional content includes at least one of installation procedures, repair guides, maintenance workflows, and safety guidelines for the identified one or more design elements;

d. generating, by the controller, an interactive user interface on a first user device configured to display the design plan with visual instructional content indicators overlaid on at least some of the identified one or more design elements, wherein some of the visual instructional content indicators representing presence of the instructional content, and some of the visual instructional content indicators representing absence of the instructional content in the instructional content database;

e. initiating, by the AI engine, generation of the instructional content corresponding to the visual instructional content indicators representing the absence of the instructional content in the instructional content database;

f. receiving a user prompt to access the instructional content associated with an instructional content indicator selected from the instructional content indicators; and g. providing, in response to the user prompt, access to the corresponding instructional content associated with the selected instructional content indicator.

22. The method of claim 21, wherein the instructional content associated with the selected instructional content indicator is stored as a hyperlink embedded within the instructional content indicator, the hyperlink providing access to one or more of a video tutorial, a repair manual, and a maintenance checklist.

23. The method of claim 22, wherein the selected instructional content indicator changes appearance based on availability of the instructional content, comprising a first appearance when corresponding instructional content is available and a second appearance when corresponding instructional content is unavailable.

24. The method of claim 21, wherein receiving the user prompt to access instructional content comprises receiving a user selection of an instructional content indicator through at least one of: a tap, a click, a hover, a gaze-based selection, and a voice command.

25. The method of claim 21, wherein receiving the user prompt comprises detecting a user selection of a corresponding design element on the design plan, wherein the instructional content indicator associated with the selected design element is triggered.

26. The method of claim 21, wherein receiving the user prompt comprises assignment of a service task corresponding to a design element, wherein the instructional content corresponding to the assigned service task is automatically preloaded.

27. The method of claim 21, wherein receiving the user prompt comprises detecting a physical proximity of the first user device to a physical counterpart of a design element associated with the selected instructional content indicator.

28. The method of claim 27, wherein the first user device comprises at least one of: a tablet, a smartphone, a head-mounted device (HMD), an augmented reality headset, a virtual reality headset, and a wearable computing device.

29. The method of claim 28, wherein the head-mounted device is configured to display the instructional content of the design element as an augmented reality overlay superimposed upon a real-time view of the physical counterpart of the design element.

30. The method of claim 21, wherein providing access to the corresponding instructional content comprises streaming the instructional content directly to the first user device from a remote cloud server.

\* \* \* \* \*